United States Patent
Pan et al.

(10) Patent No.: US 11,532,725 B2
(45) Date of Patent: Dec. 20, 2022

(54) METHOD FOR FORMING SIDEWALL SPACERS AND SEMICONDUCTOR DEVICES FABRICATED THEREOF

(71) Applicant: TAIWAN SEMICONDUCTOR MANUFACTURING COMPANY, LTD., Hsinchu (TW)

(72) Inventors: Kuan-Ting Pan, Taipei (TW); Kuo-Cheng Chiang, Zhubei (TW); Shi Ning Ju, Hsinchu (TW); Yi-Ruei Jhan, Keelung (TW); Kuan-Lun Cheng, Hsin-Chu (TW); Chih-Hao Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 104 days.

(21) Appl. No.: 17/198,777

(22) Filed: Mar. 11, 2021

(65) Prior Publication Data

US 2022/0293769 A1 Sep. 15, 2022

(51) Int. Cl.
*H01L 29/66* (2006.01)
*H01L 29/423* (2006.01)
*H01L 29/06* (2006.01)
*H01L 29/786* (2006.01)

(52) U.S. Cl.
CPC .... *H01L 29/66553* (2013.01); *H01L 29/0665* (2013.01); *H01L 29/42392* (2013.01); *H01L 29/6653* (2013.01); *H01L 29/66545* (2013.01); *H01L 29/78696* (2013.01)

(58) Field of Classification Search
CPC ..... H01L 21/823431; H01L 21/823468; H01L 21/823487; H01L 21/823821; H01L 21/823864; H01L 21/823885; H01L 29/0665; H01L 29/0847; H01L 29/6653; H01L 29/66545; H01L 29/66553; H01L 29/6656; H01L 29/66666; H01L 29/66795; H01L 29/7827; H01L 29/785; H01L 29/7851; H01L 29/7855; H01L 29/78642; H01L 29/78645; H01L 29/78696; B82Y 10/00; B82Y 40/00
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,362,355 B1 * | 6/2016 | Cheng | H01L 29/4991 |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |

* cited by examiner

*Primary Examiner* — Cheung Lee
(74) *Attorney, Agent, or Firm* — NZ Carr Law Office

(57) ABSTRACT

Embodiments of the present disclosure provide a method of forming sidewall spacers by filling a trench between a hybrid fin and a semiconductor fin structure. The sidewall spacer includes two fin sidewall spacer portions connected by a gate sidewall spacer portion. The fin sidewall spacer portion has a substantially uniform profile to provide uniform protection for vertically stacked channel layers and eliminate any gaps and leaks between inner spacers and sidewall spacers.

20 Claims, 61 Drawing Sheets

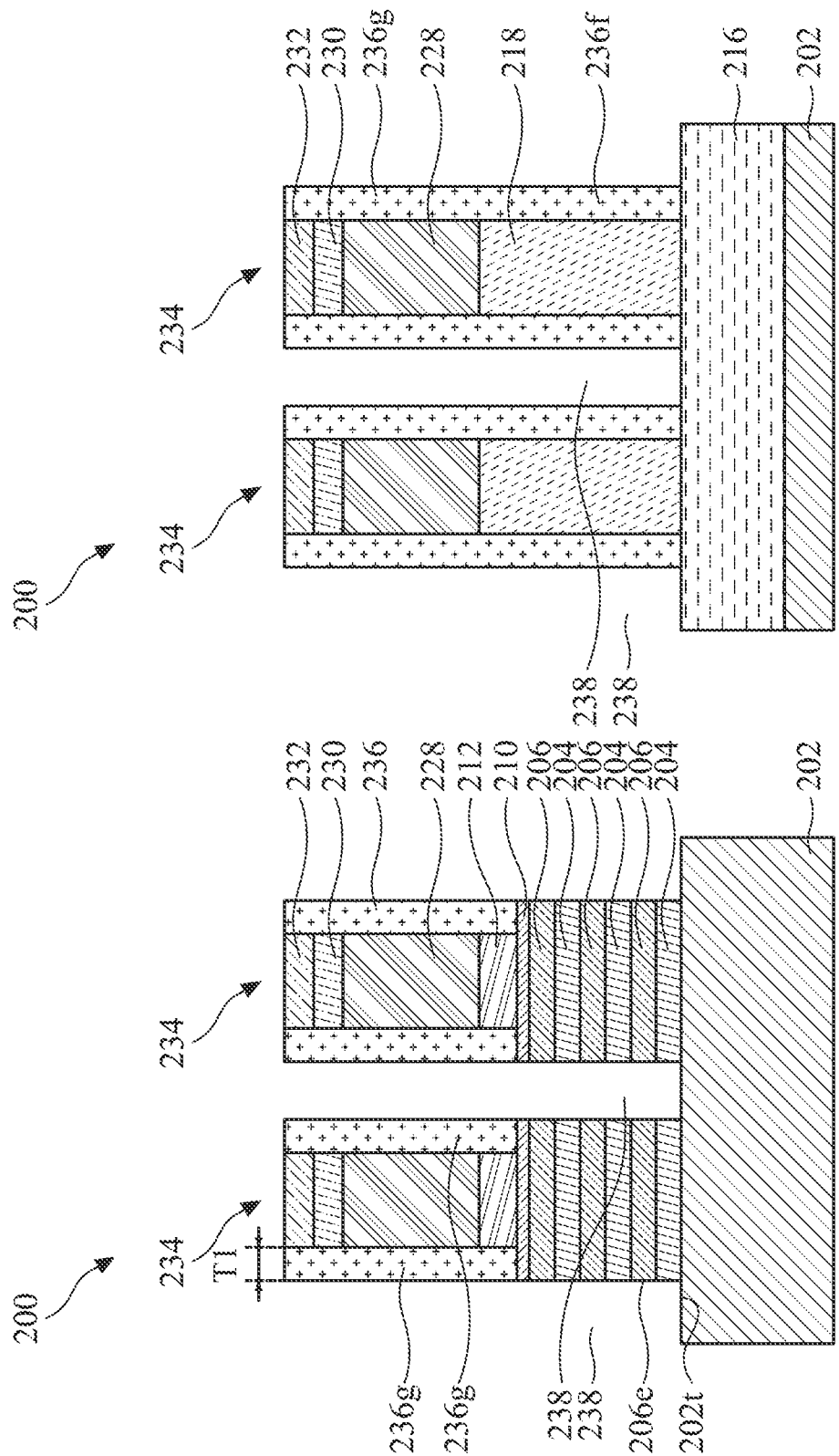

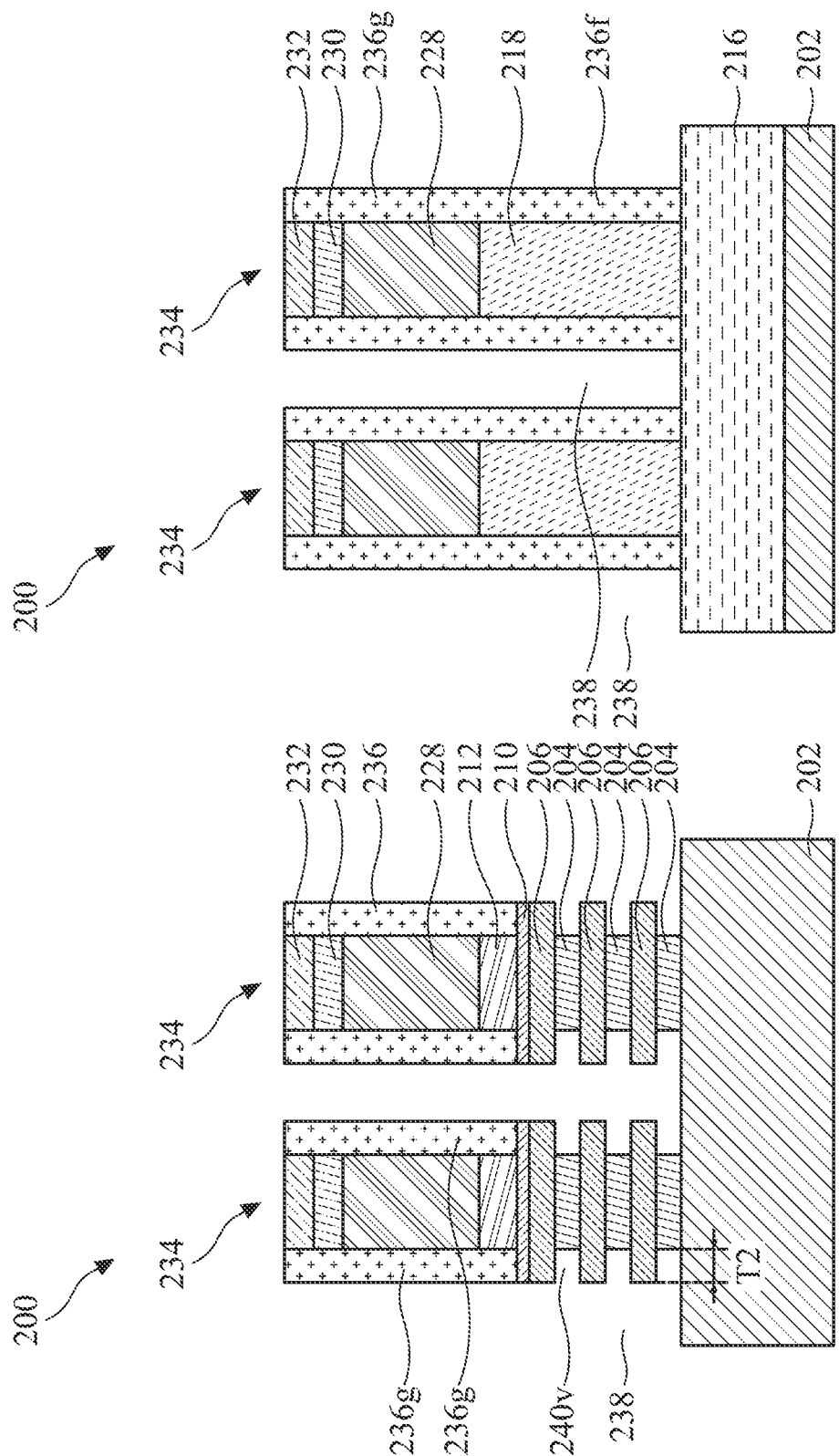

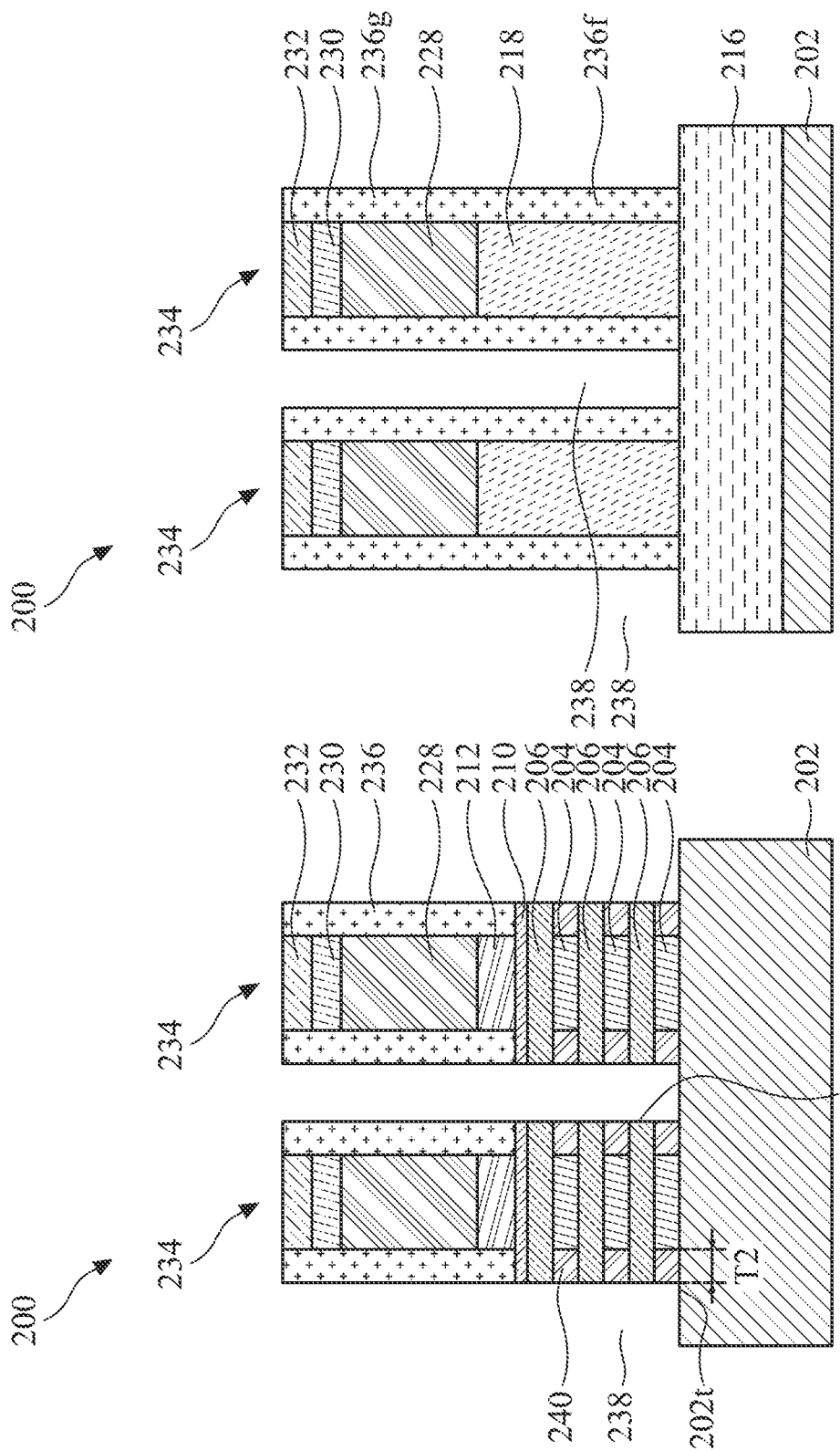

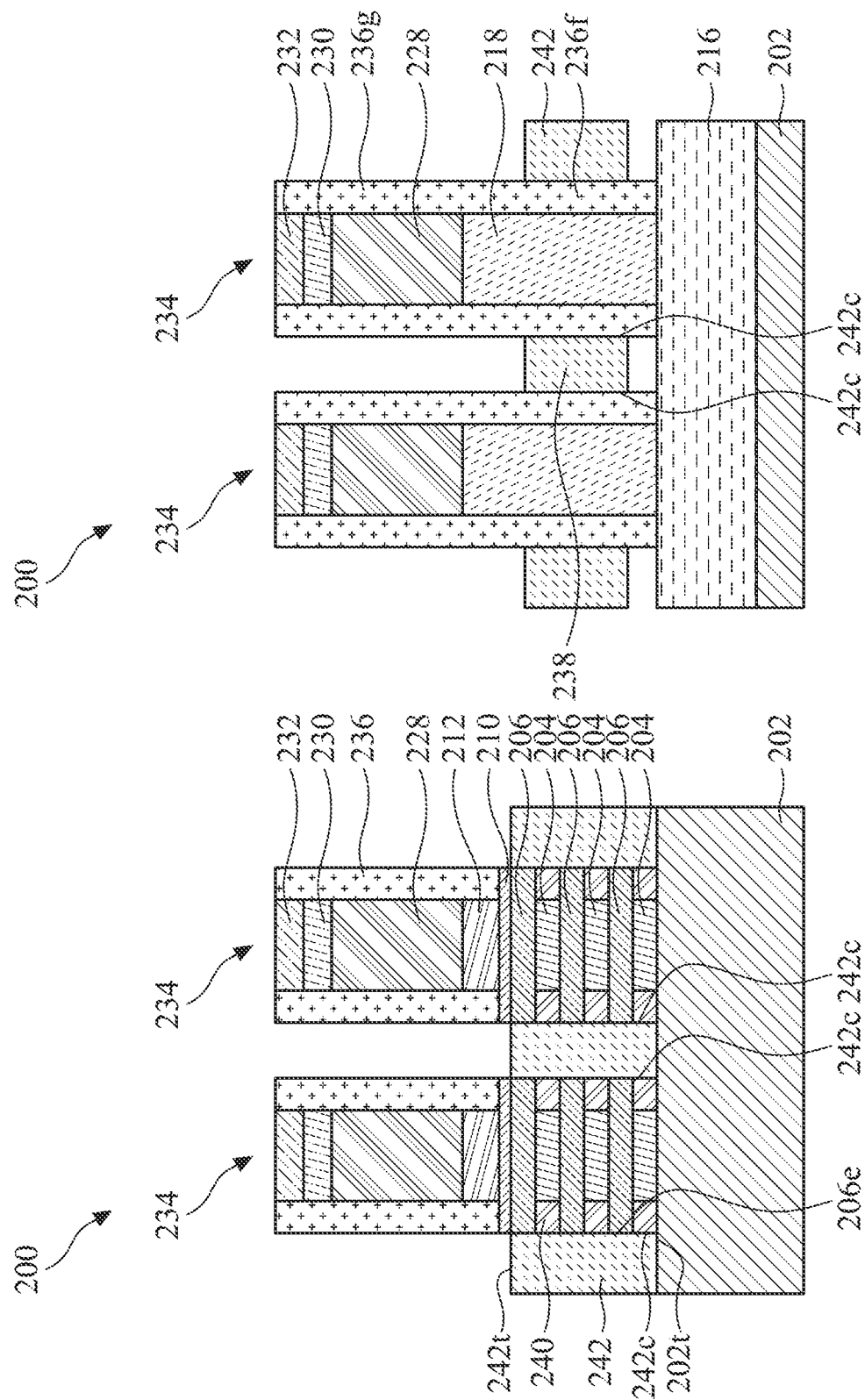

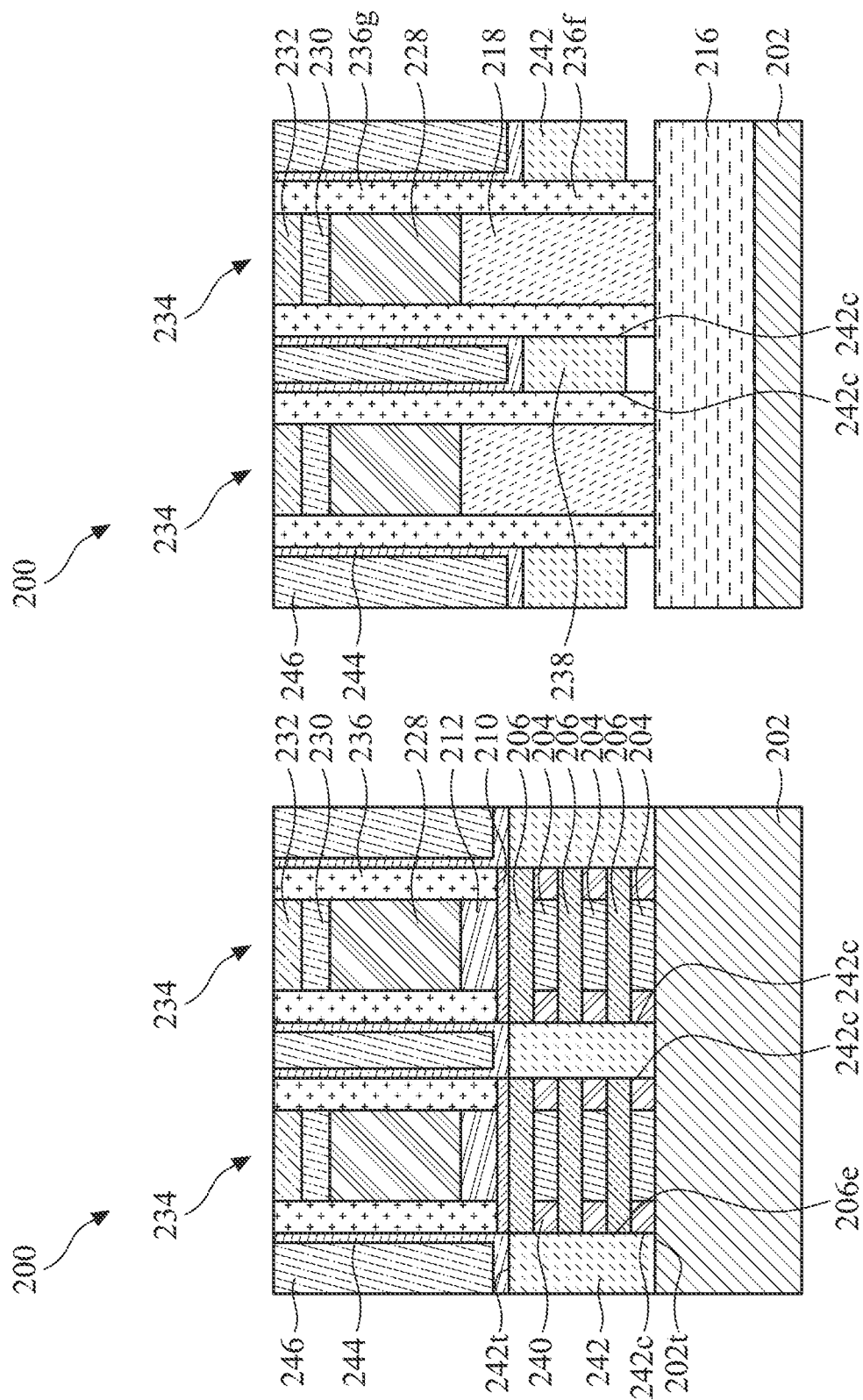

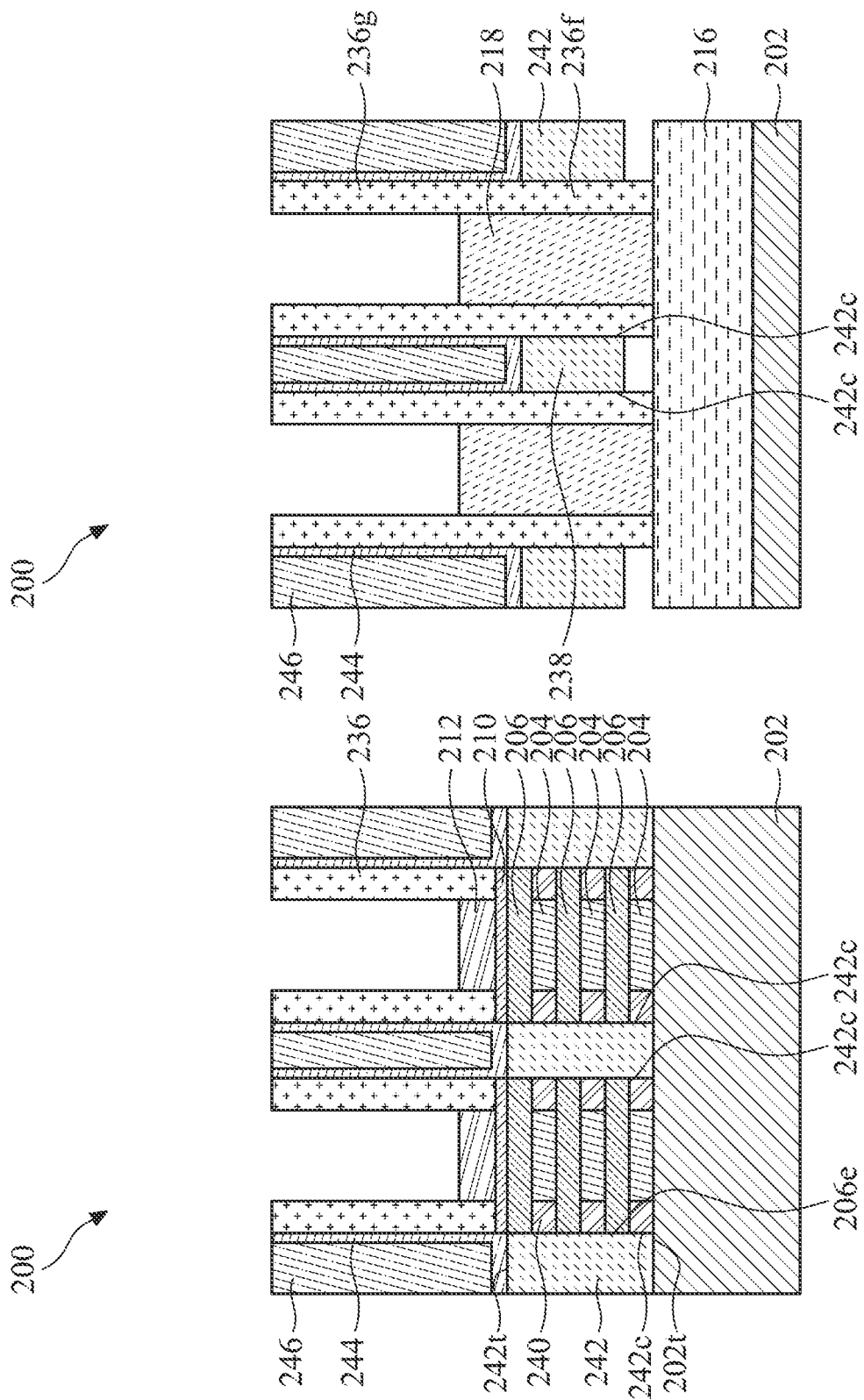

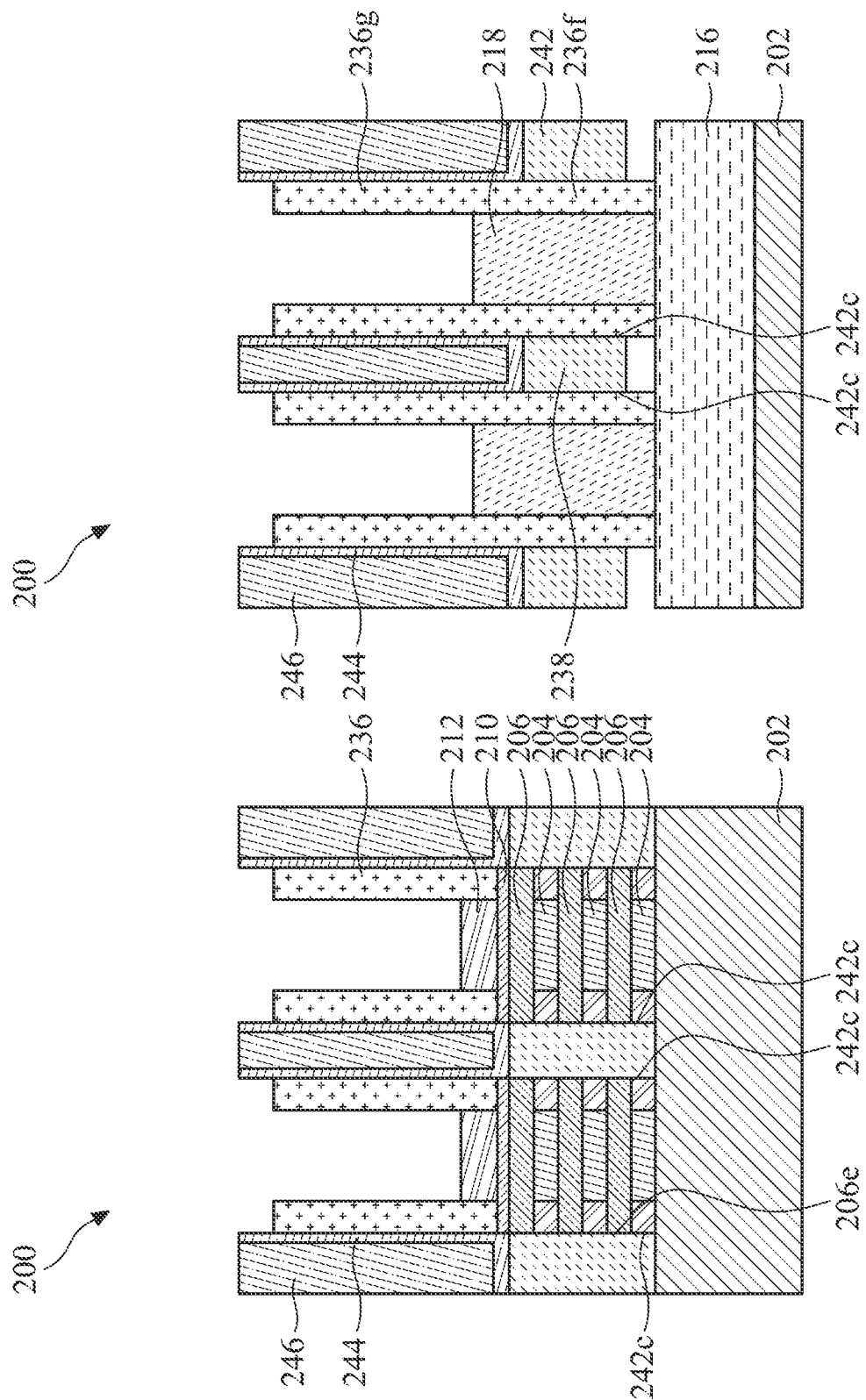

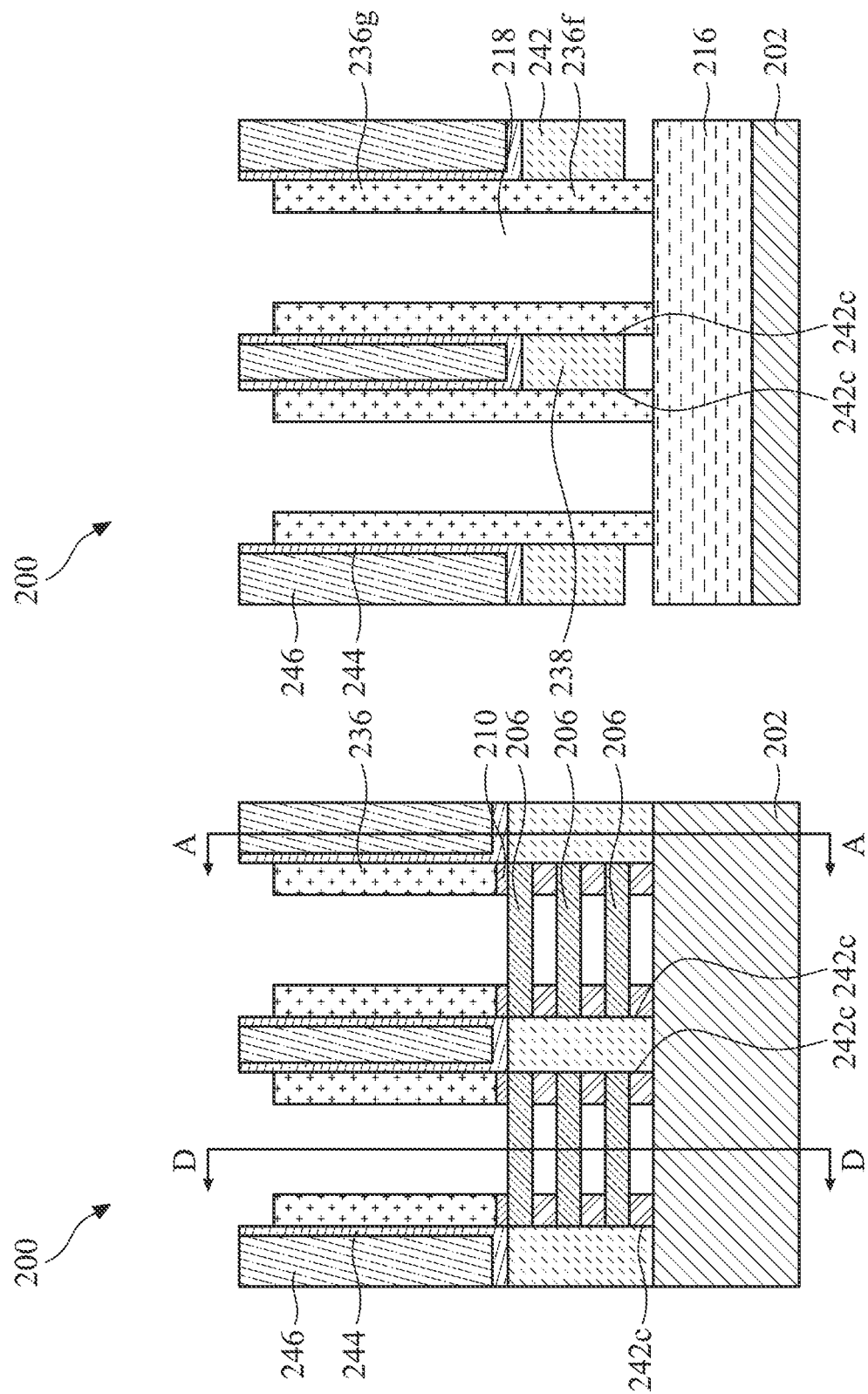

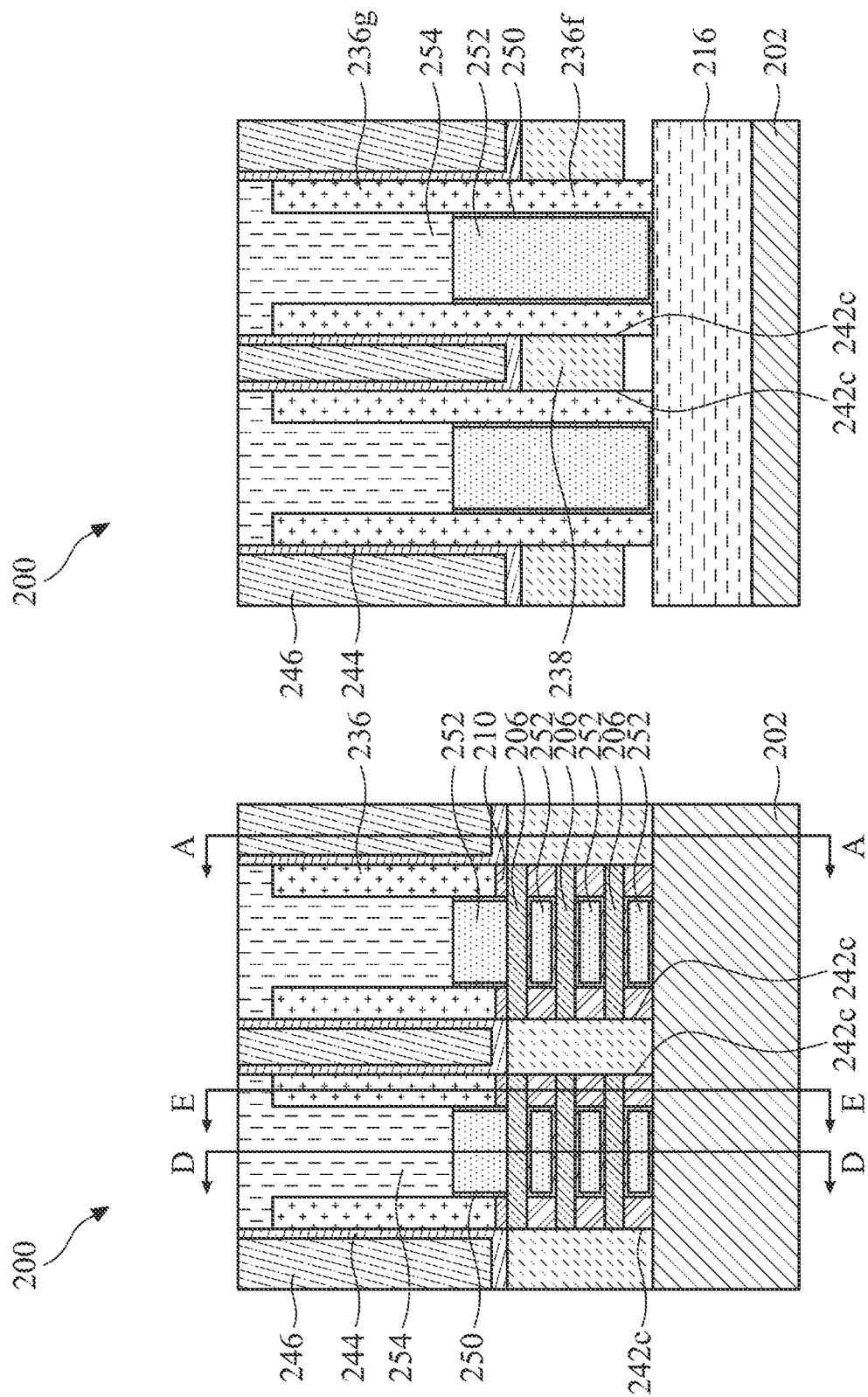

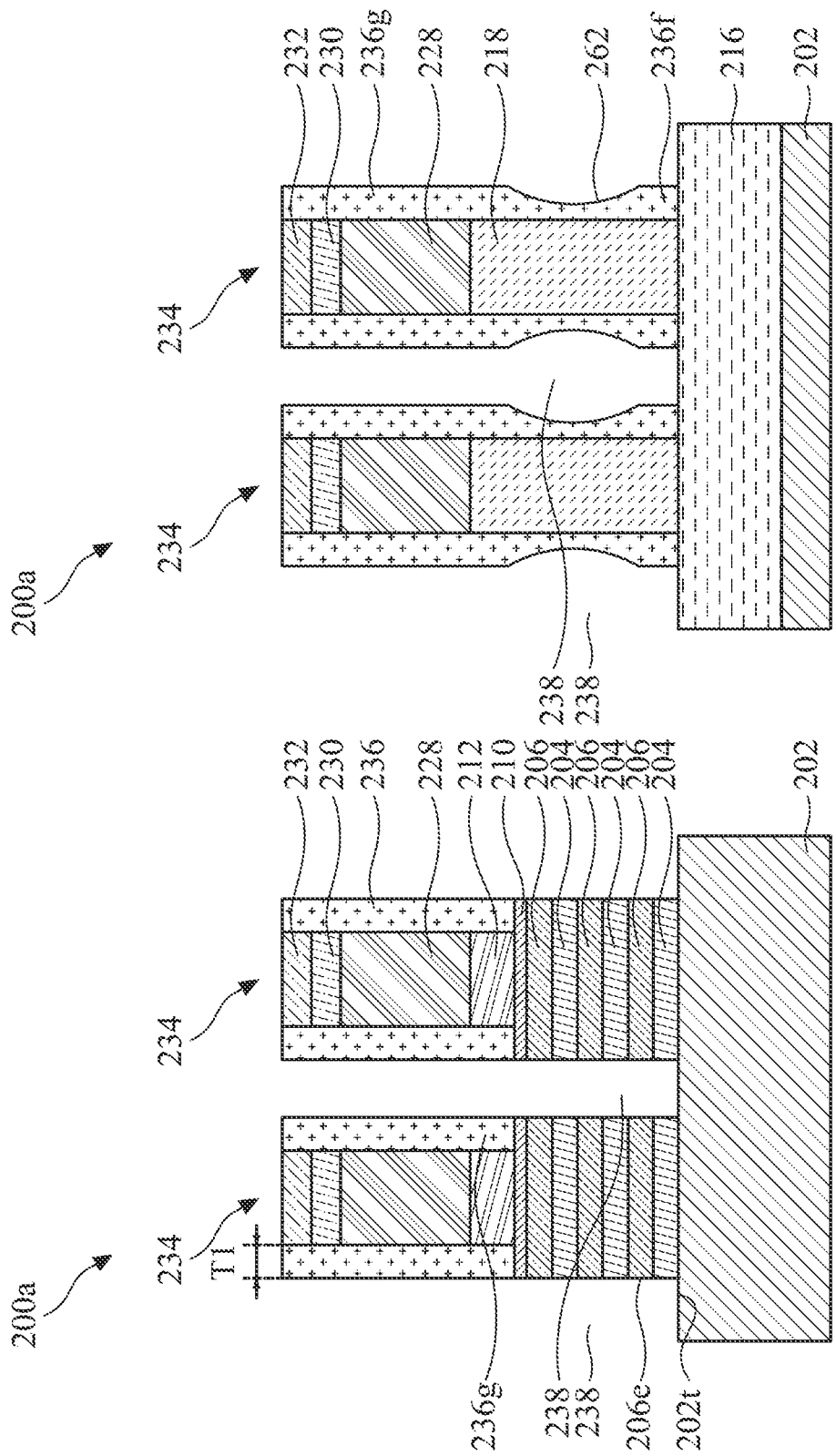

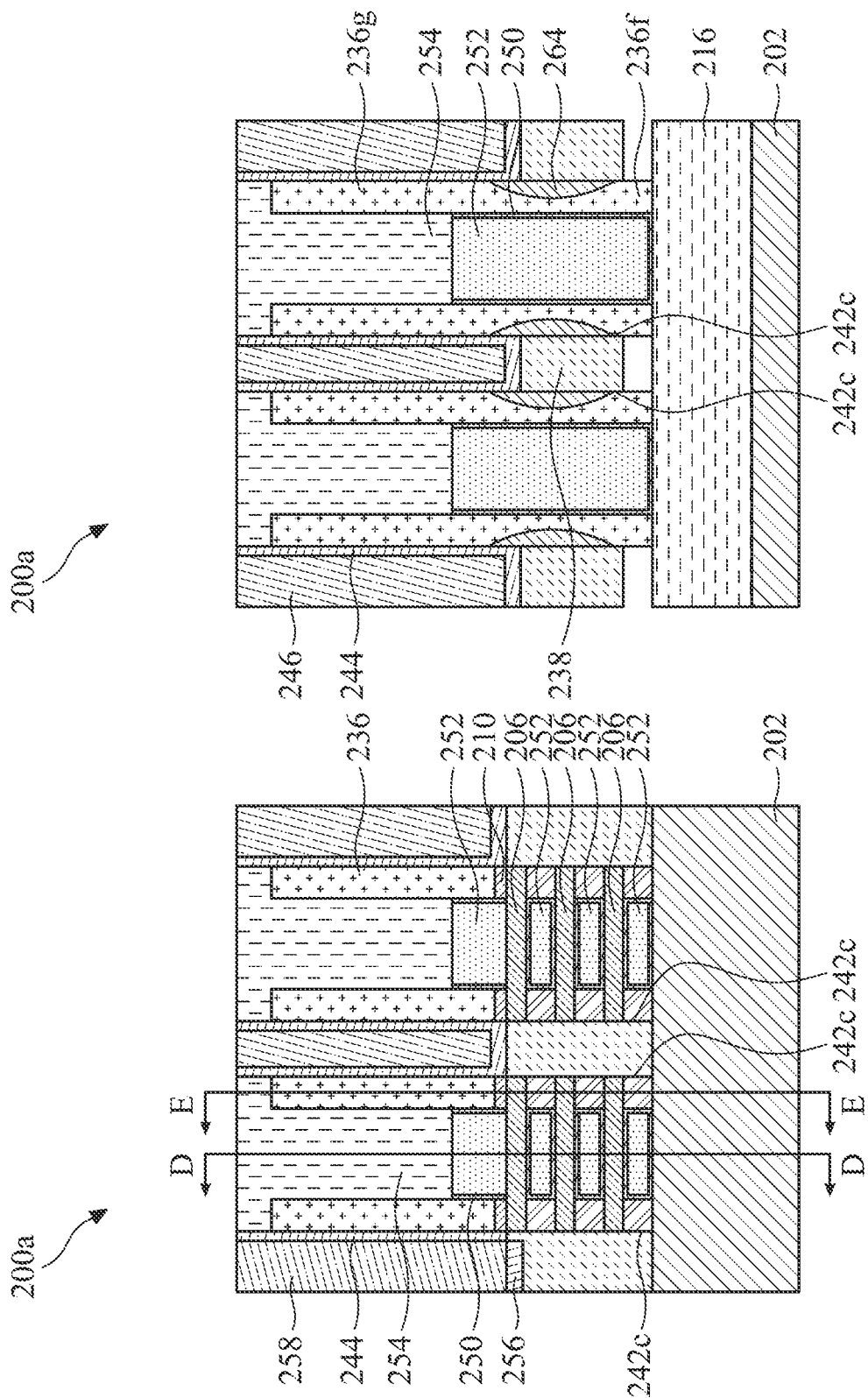

METHOD FOR FORMING SIDEWALL SPACERS AND SEMICONDUCTOR DEVICES FABRICATED THEREOF

BACKGROUND

The semiconductor industry has experienced continuous rapid growth due to constant improvements in the integration density of various electronic components. For the most part, this improvement in integration density has come from repeated reductions in minimum feature size, allowing more components to be integrated into a given chip area. In multiple channel transistors, inner spacers are formed between source/drain features and metal gate structures around ends around end of channel regions. Traditionally, inner spacers are formed by recessing semiconductor materials, such as cladding layer and a portions spacing channels, and depositing a dielectric material in place of the recessed semiconductor materials. However, as minimum feature size reduces, it becomes challenging to form inner spacers around all channels and without gaps.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-7, 8A-8C, 9A-9C, 10A-10C, 11A-11E, 12A-12E, 13A-130, 14A-14C, 15A-15D, 16A-16E, 17A-17D, 18A-18E, and 19A-19F schematically illustrate various stages of manufacturing a semiconductor device according to embodiments of the present disclosure.

FIGS. 20A-200, 21A-210, 22A-22E, 23A-23E, and 24A-24E schematically illustrate various stage of manufacturing a semiconductor device according to another embodiment of the present disclosure.

DETAILED DESCRIPTION

Figure 1:
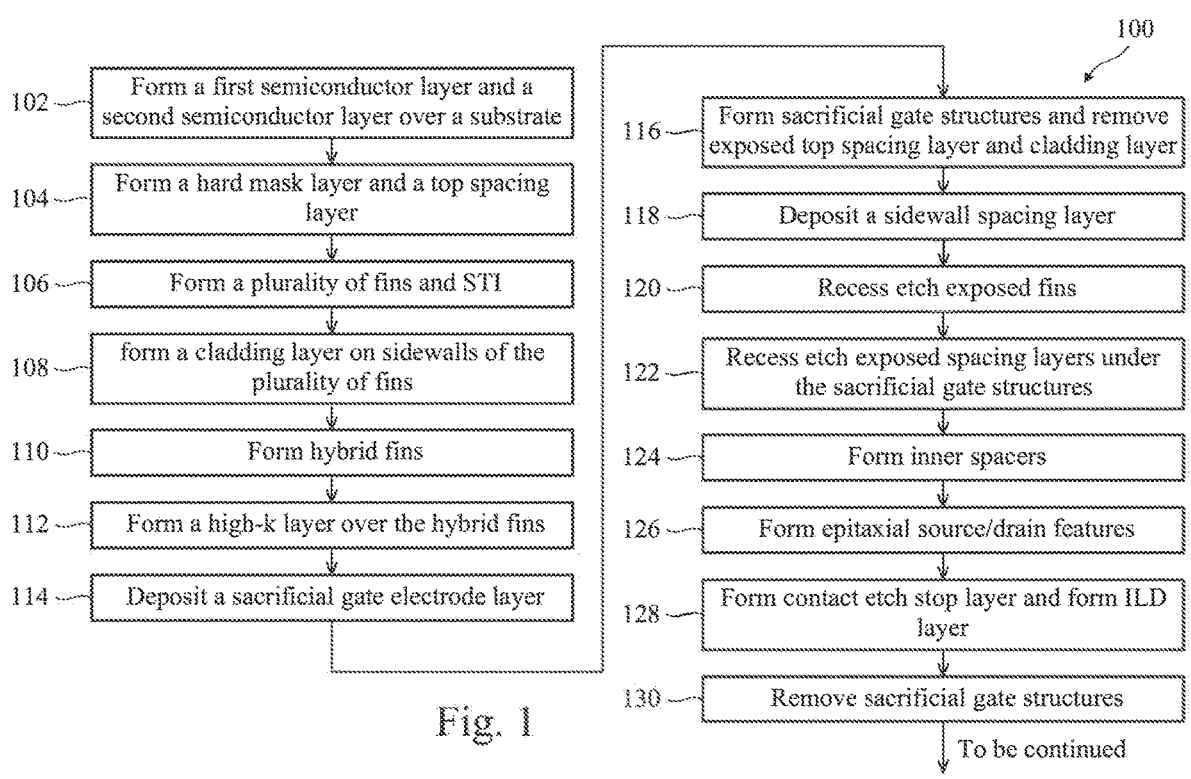
FIG. 1 is a flow chart of a method for manufacturing of a semiconductor device according to embodiments of the present disclosure.
Figure 1:
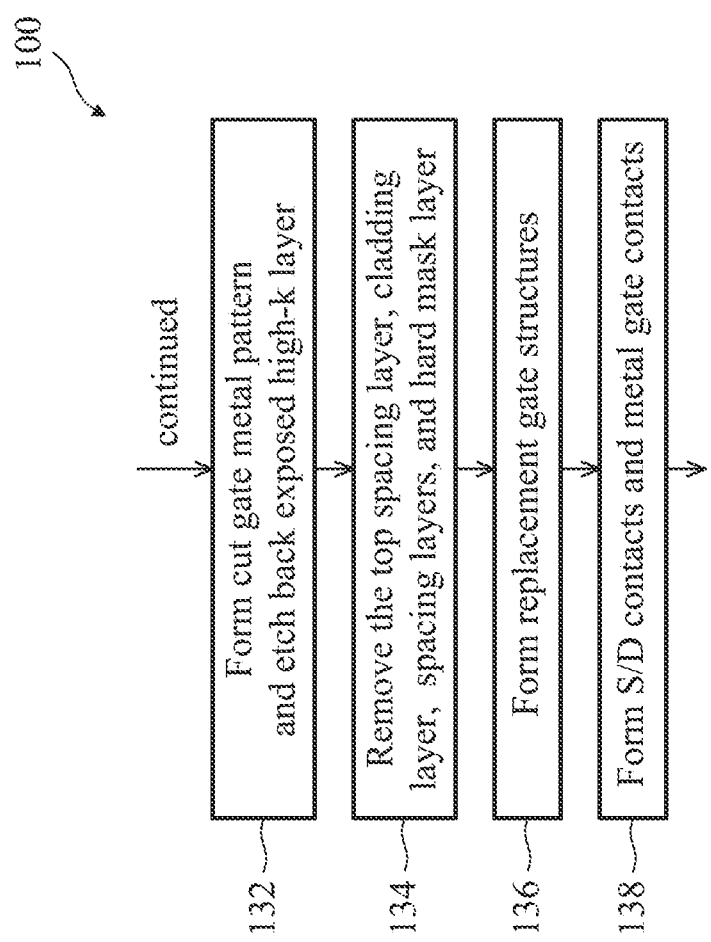

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 64 degrees or at other orientations) and the spatially relative descriptors used herein may likewise be interpreted accordingly.

The foregoing broadly outlines some aspects of embodiments described in this disclosure. While some embodiments described herein are described in the context of nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. In the present disclosure, a source/drain refers to a source and/or a drain. A source and a drain are interchangeably used.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure provide methods for forming inner spacers for multi-channel transistors. Particularly, the present disclosure provides a method of forming a sidewall spacer by filling a trench between a hybrid fin and a semiconductor fin structure. The sidewall spacer includes two fin sidewall spacer portions connected by a gate sidewall spacer portion. The fin sidewall spacer portion has a substantially uniform profile to provide uniform protection for vertically stacked channel layers.

FIG. 1 is a flow chart of a method 100 for manufacturing of a semiconductor device according to embodiments of the present disclosure. FIGS. 2-7, 8A-80, 9A-90, 10A-10C, 11A-11E, 12A-12E, 13A-13C, 14A-14C, 15A-15D, 16A-16E, 17A-17D, 18A-18E, and 19A-19F schematically illustrate various stages of manufacturing an exemplary semiconductor device 200 according to embodiments of the present disclosure. Particularly, the semiconductor device 200 may be manufactured according to the method 100 of FIG. 1. FIGS. 2-7 are schematic perspective views of various stages of the semiconductor device 200 during fabrication.

Figure 2:
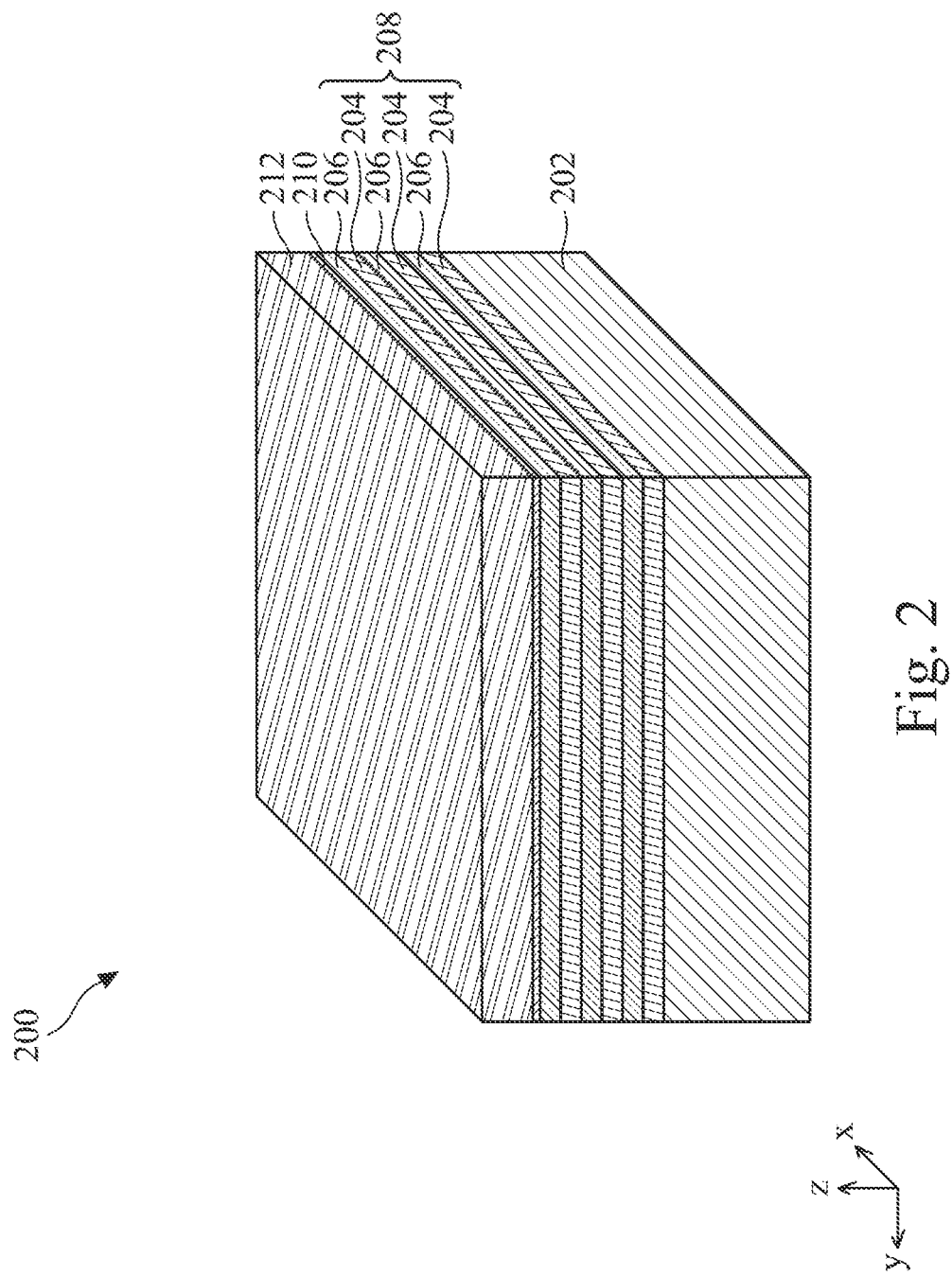

At operation 102 of the method 100, a plurality of channel layers and a plurality of spacing layers for multi-channel transistors, such as nanosheet transistors. FIG. 2 is schematic perspective view of the semiconductor device 200. As shown in FIG. 2, a substrate 202 is provided to form the semiconductor device 200 thereon. The substrate 202 may include a single crystalline semiconductor material such as, but not limited to Si, Ge, SiGe, GaAs, InSb, GaP, GaSb, InAlAs, InGaAs, GaSbP, GaAsSb, and InP. The substrate 202 may include various doping configurations depending on circuit design. For example, the substrate 202 may one or more p-doped regions and one or more n-doped regions.

In operation 102, a semiconductor stack 208 including alternating spacing layers 204 and semiconductor channel layers 206 is formed the substrate 202. The spacing layers 204 and semiconductor channel layers 206 have different compositions. In some embodiments, the spacing layer 204 and the semiconductor channel layer 206 have different oxidation rates and/or different etch selectivity. In later fabrication stages, portions of the semiconductor channel layers 206 form nanosheet channels in a multi-gate device. Three spacing layers 204 and three semiconductor channel layers 206 are alternately arranged as illustrated in FIG. 2 as an example. More or less spacing layers 204 and channel layers 206 may be included depending on the desired number of channels in the semiconductor device to be formed. In some embodiments, the number of spacing layers 204 and the channel layers 206 is between 1 and 10.

When n-type devices are to be formed over the substrate 202, the spacing layer 204 may include silicon germanium (SiGe) and the semiconductor channel layer 206 may include silicon. The spacing layer 204 may be a SiGe layer including more than 25% Ge in molar ratio. For example, the spacing layer 204 may be a SiGe layer including Ge in a molar ration in a range between 25% and 50%. In some embodiments, the semiconductor channel layer 206 may be a Ge layer. The semiconductor channel layer 206 may include n-type dopants, such as phosphorus (P), arsenic (As), etc.

When P-type devices are to be formed over the substrate 202, the spacing layer 204 may include silicon germanium (SiGe), and the semiconductor channel layer 206 may include p-type dopants, such as boron etc. The spacing layer 204 may be a SiGe layer including more than 25% Ge in molar ratio. For example, the spacing layer 204 may be a SiGe layer including Ge in a molar ration in a range between 25% and 50%. The semiconductor channel layer 206 may include silicon, Ge, a compound semiconductor such as SiC, GeAs, GaP, InP, InAs, and/or InSb, an alloy semiconductor such as SiGe, GaAsP, AlInAs, AlGaAs, InGaAs, GaInP, and/or GaInAsP, or combinations thereof. In some embodiments, the semiconductor channel layer 206 may be a Ge layer.

The spacing layers 204 and the semiconductor channel layers 206 may be formed by a molecular beam epitaxy (MBE) process, a metalorganic chemical vapor deposition (MOCVD) process, and/or other suitable epitaxial growth processes.

In operation 104, a hard mask layer 210 and a top spacing layer 212 are formed over the semiconductor stack 208, as shown in FIG. 2. The hard mask layer 210 is deposited over the topmost semiconductor channel layer 206. The hard mask layer 210 may be any suitable material allowing selective removal of the top spacing layer 212, a cladding layer to be formed, and/or the spacing layer 204 during formation of sidewall spacers, inner spacers, and replacement gate. In some embodiments, the hard mask layer 210 includes silicon oxide, silicon nitride, silicon oxynitride, or a combination thereof. The hard mask layer 210 has a thickness in a range between about 2 nm and 6 nm. A thickness less than 2 nm may be not enough to function as an etch stop. A thickness more than 6 nm may increase the device dimension without additional performance benefit.

The top spacing layer 212 is formed over the hard mask layer 210. The top spacing layer 212 may be form from material that may be selectively removed from the semiconductor channel layers 206 during subsequent processing for sidewall spacer formation, inner spacer formation, and for replacement gate formation. In some embodiments, the top spacing layer 212 is formed from the same material as the spacing layers 204. For example, the top spacing layer 212 may include silicon germanium (SiGe), such as a SiGe layer including Ge in a molar ration in a range between 25% and 50%. In some embodiments, the top spacing layer 212 may be formed from the same materials as a sacrificial gate electrode layer, such as silicon, or polycrystalline silicon.

The combined thickness of the hard mask layer 210 and the top spacing layer 212 is in a range to allow formation of gate dielectric and gate electrode layer on the topmost channel layers 206 with the gate electrode layer has an adequate landing range for gate contact features. In some embodiments, the thickness of the top spacing layer 212 is in a range between about 15 nm to 30 nm. A thickness less than 15 nm may be not enough to perform a gate dielectric layer and gate electrode of desirable quality. A thickness more than 30 nm may increase the device dimension without additional performance benefit.

Figure 3:
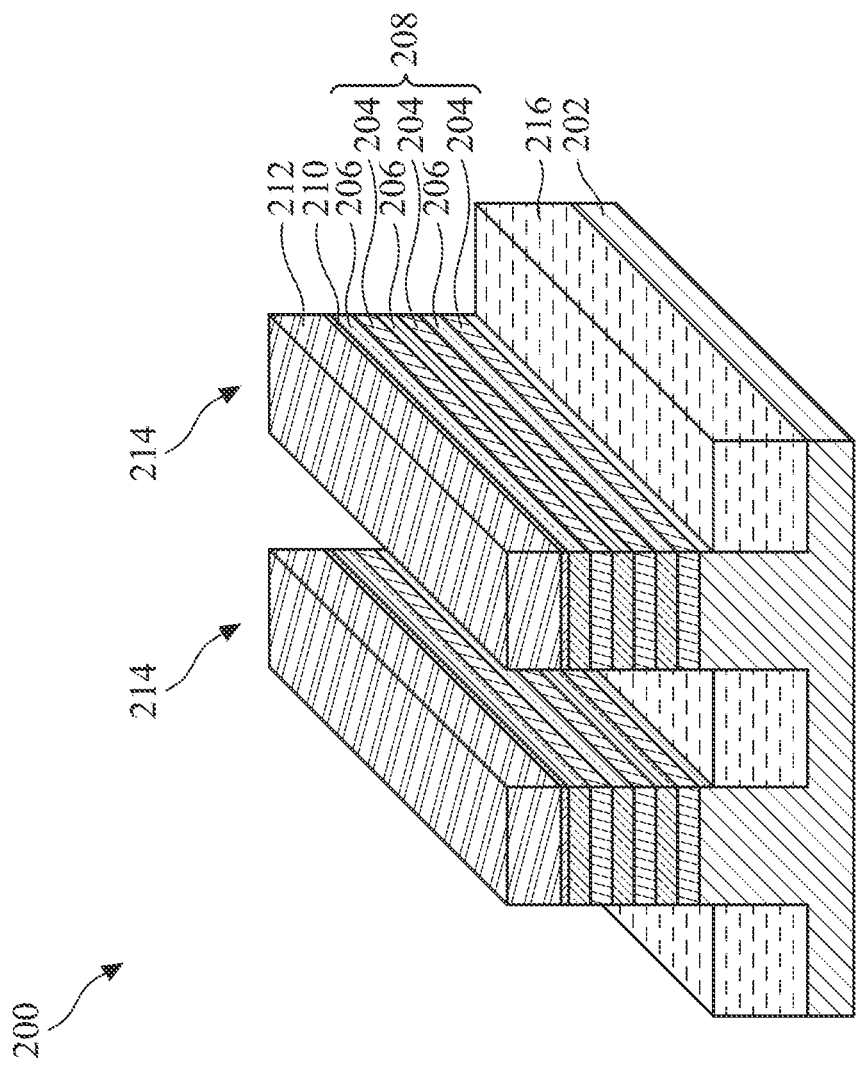

In operation 106, fin structures 214 are formed and an isolation layer 216 is formed in the trenches between the fin structures 214, as shown in FIG. 3. The fin structures 214 are from the semiconductor stack 208, the hard mask layer 210, and the top spacing layer 212. The fin structures 214 may be formed by patterning and etching the top spacing layer 212, the hard mask layer 210, and the semiconductor stack 20 by one or more etching processes. In FIG. 3, the fin structures 214 are formed along the X direction.

The isolation layer 216 is formed in the trenches between the fin structures 214 by a suitable deposition followed by an etch back process. In some embodiments, a semiconductor liner (not shown) may be formed over exposed portions of the fin structures 214 and the mask layers (not shown) over the fin structures 214 prior to deposition and etching back of the of the isolation layer 216. The isolation layer 216 may be formed by a high-density plasma chemical vapor deposition (HDP-CVD), a flowable CVD (FCVD), or other suitable deposition process. In some embodiments, the isolation layer 216 may include silicon oxide, silicon nitride, silicon oxynitride, fluorine-doped silicate glass (FSG), a low-k dielectric, combinations thereof. In some embodiments, the isolation layer 216 is formed to cover the fin structures 214 by a suitable deposition process to fill the trenches between the fin structures 214, a planarization process may be performed to expose the top spacing layer 212 and then recess etched using a suitable anisotropic etching process to expose the semiconductor stack 208 of the fin structures 214, as shown in FIG. 3.

Figure 4:
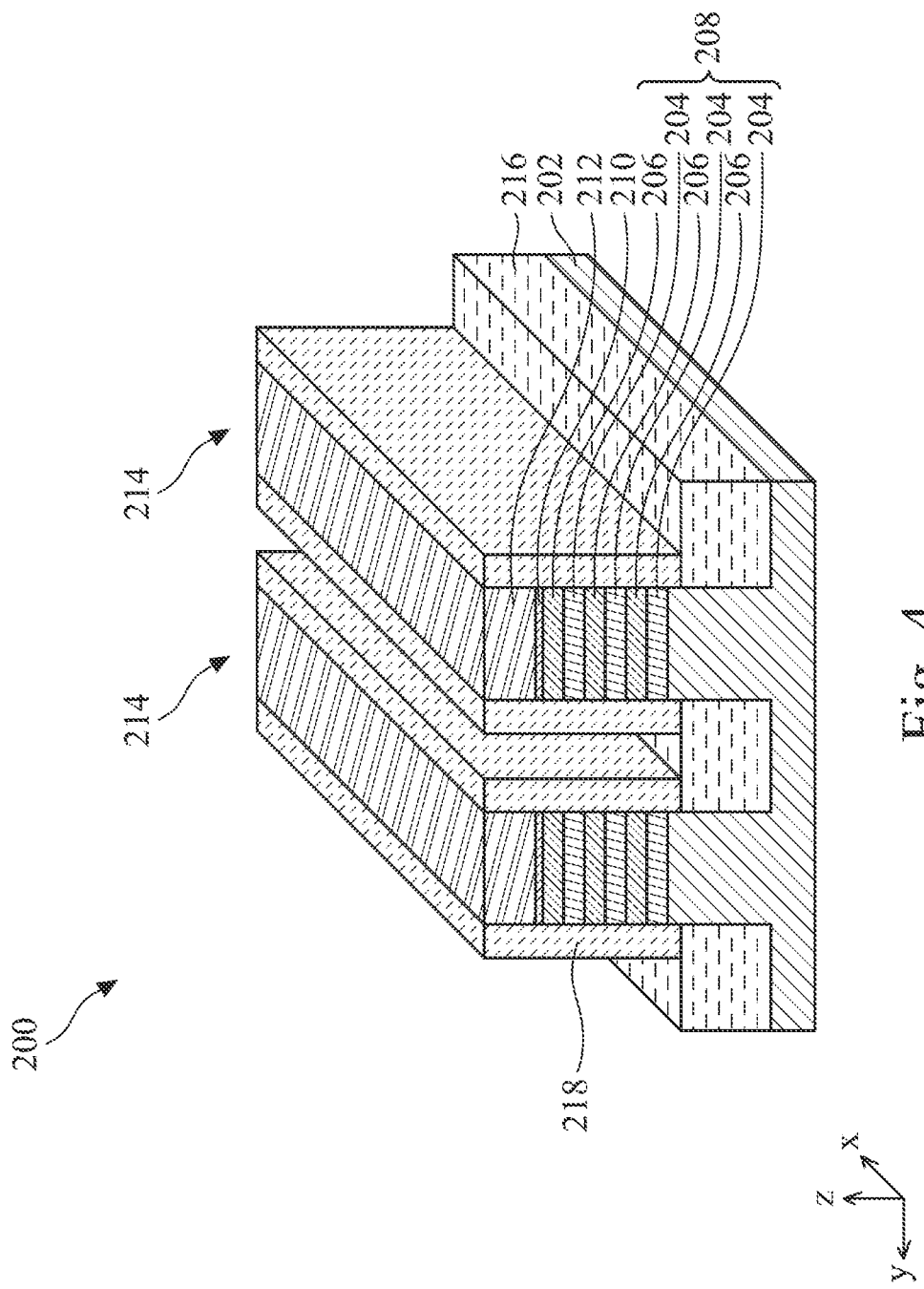

In operation 108, a cladding layer 218 is formed on sidewalls of the fin structures 214, as shown in FIG. 4. The cladding layer 218 may be formed by an epitaxial growth from exposed semiconductor materials of the fin structures 214, followed by a directional etching to expose a top surface of the top spacing layer 212. In some embodiments, the cladding layer 218 includes a semiconductor material, for example SiGe. In some embodiments, the cladding layer 218 may have a composition similar to the composition of the spacing layer 204 and and the top spacing layer 212, thus may be selectively removed from the semiconductor channel layer 206.

Figure 5:
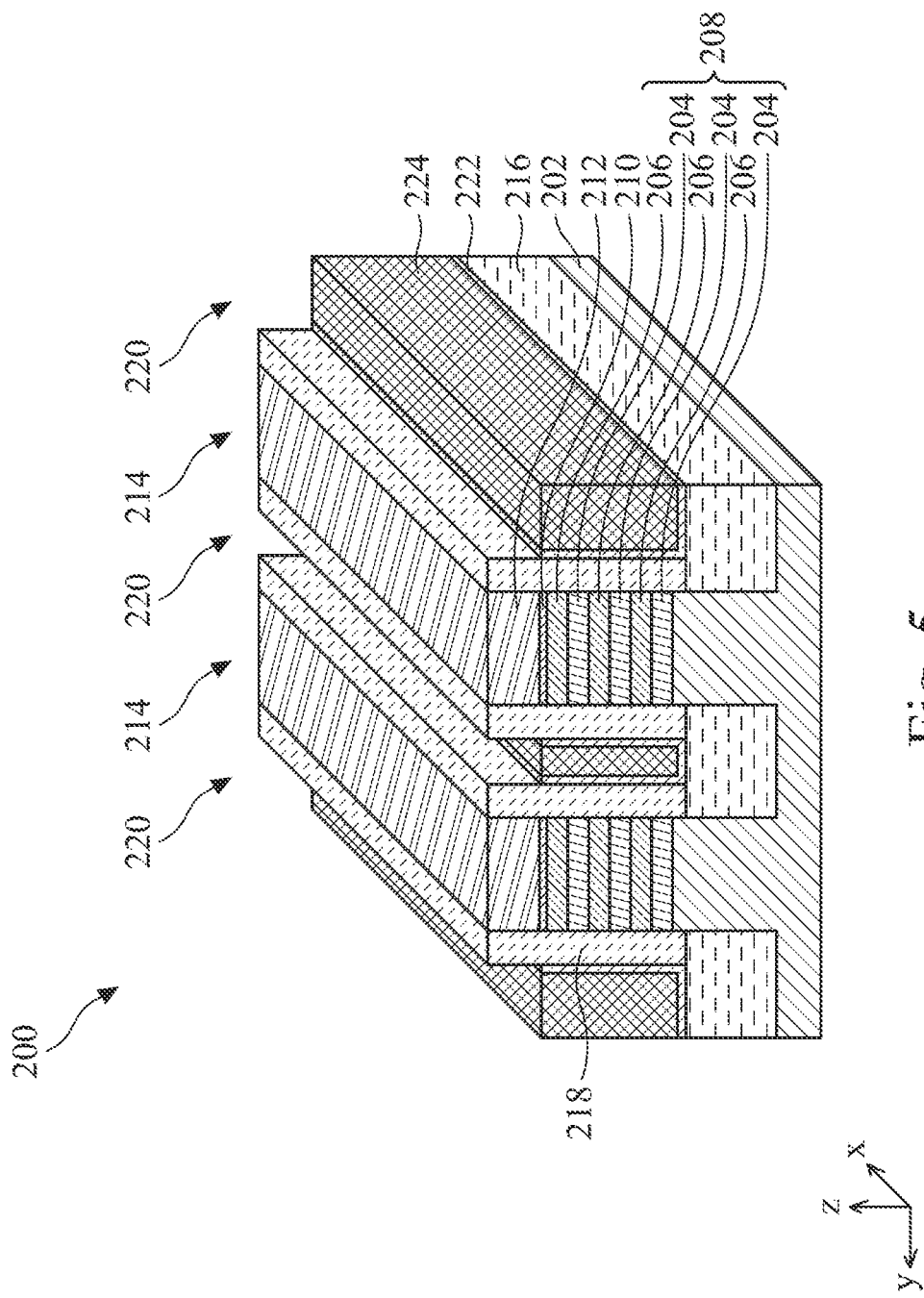

In operation 110, hybrid fins 220 are formed in the trenches between the neighboring fin structures 214 after formation of the cladding layer 218, as shown in FIG. 5. The hybrid fins 220, also referred to as dummy fins or dielectric fins, include a high-k dielectric material layer, a low-k dielectric material layer, or a bi-layer dielectric material including high-k upper part and a low-k lower part. In some embodiments, the hybrid fins 220 include a high-k metal oxide, such as $HfO_2$, $ZrO_2$, HfAlOx, HfSiOx, $Al_2O_3$, and the like, a low-k material such as SiONC, SiCN, SiOC, or other dielectric material. In the example of FIG. 5, the hybrid fin 220 is a bi-layer structure including a dielectric liner layer 222 and a dielectric filling layer 224. In some embodiments, the dielectric liner layer 222 may include a dielectric material, such as SiONC, SiCN, SiOC, or other dielectric material, that provide etch resistance during replacement gate processes. The dielectric filling layer 224 may a dielectric material with a k value less than about 7, such as $SiO_2$, SiN, SiONC, SiCN, SiOC, or a combination thereof. In some embodiments, the dielectric filling layer 224 incudes silicon oxide.

After formation of the dielectric filling layer 224, a planarization process is performed to expose the cladding layer 218. The hybrid fins 220 are then recess etched by any suitable process, such as dry etch, wet etch, or a combination thereof. The etch process may be a selective etch process that does not remove the semiconductor material of the cladding layer 218. The recess process may be controlled so that the dielectric liner layer 222 and the dielectric filling layer 224 are substantially at the same level as a top surface of the topmost channel layer 206.

Figure 6:
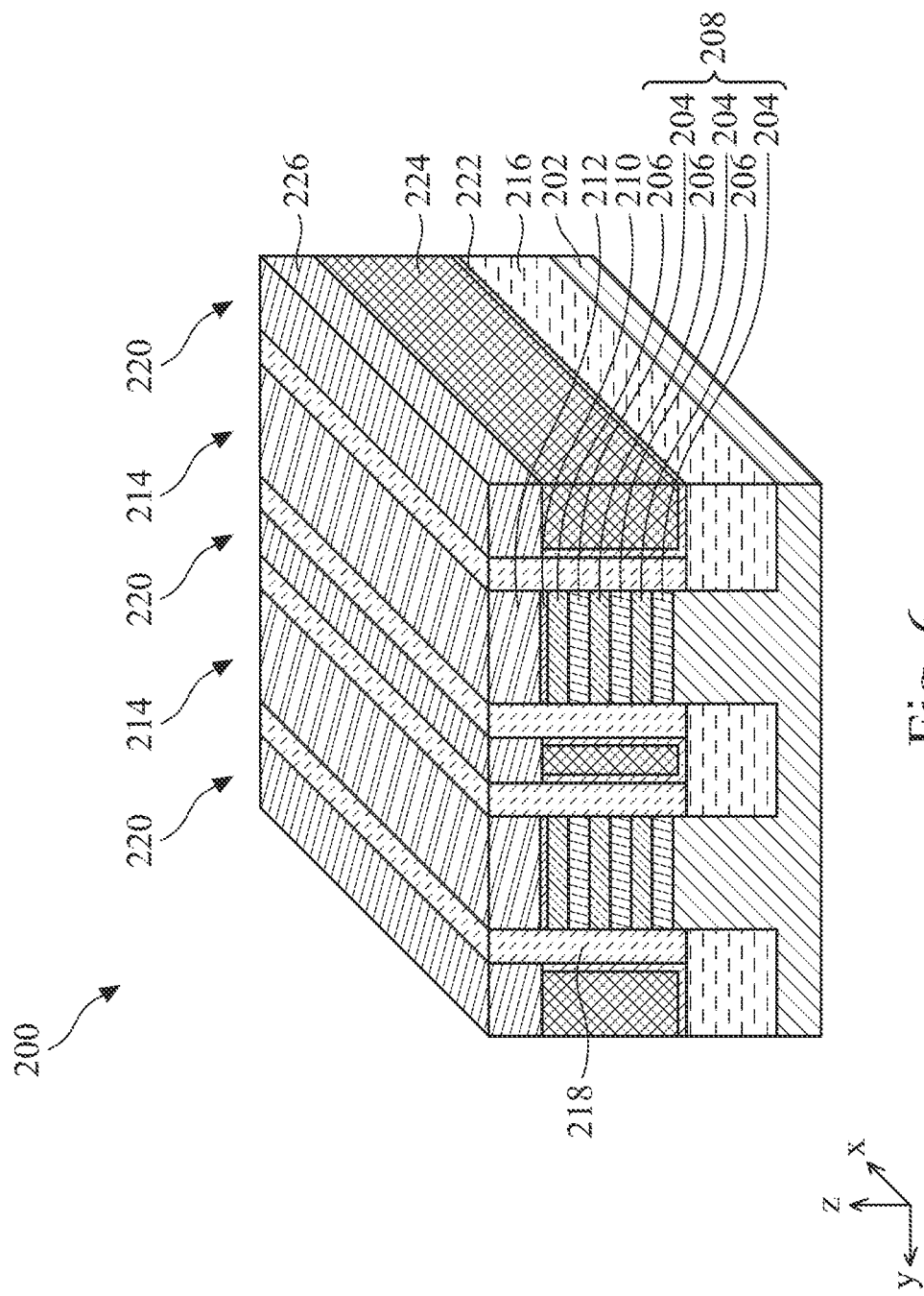

In operation 112, high-k dielectric features 226 are formed over the hybrid fins 220, as shown in FIG. 6. The high-k dielectric features 226 are formed in the recesses over the hybrid fins 220. The high-k dielectric features 226 are configured to function as an isolation between sections of a gate electrode layer to be formed in the semiconductor device 200.

Figure 7:
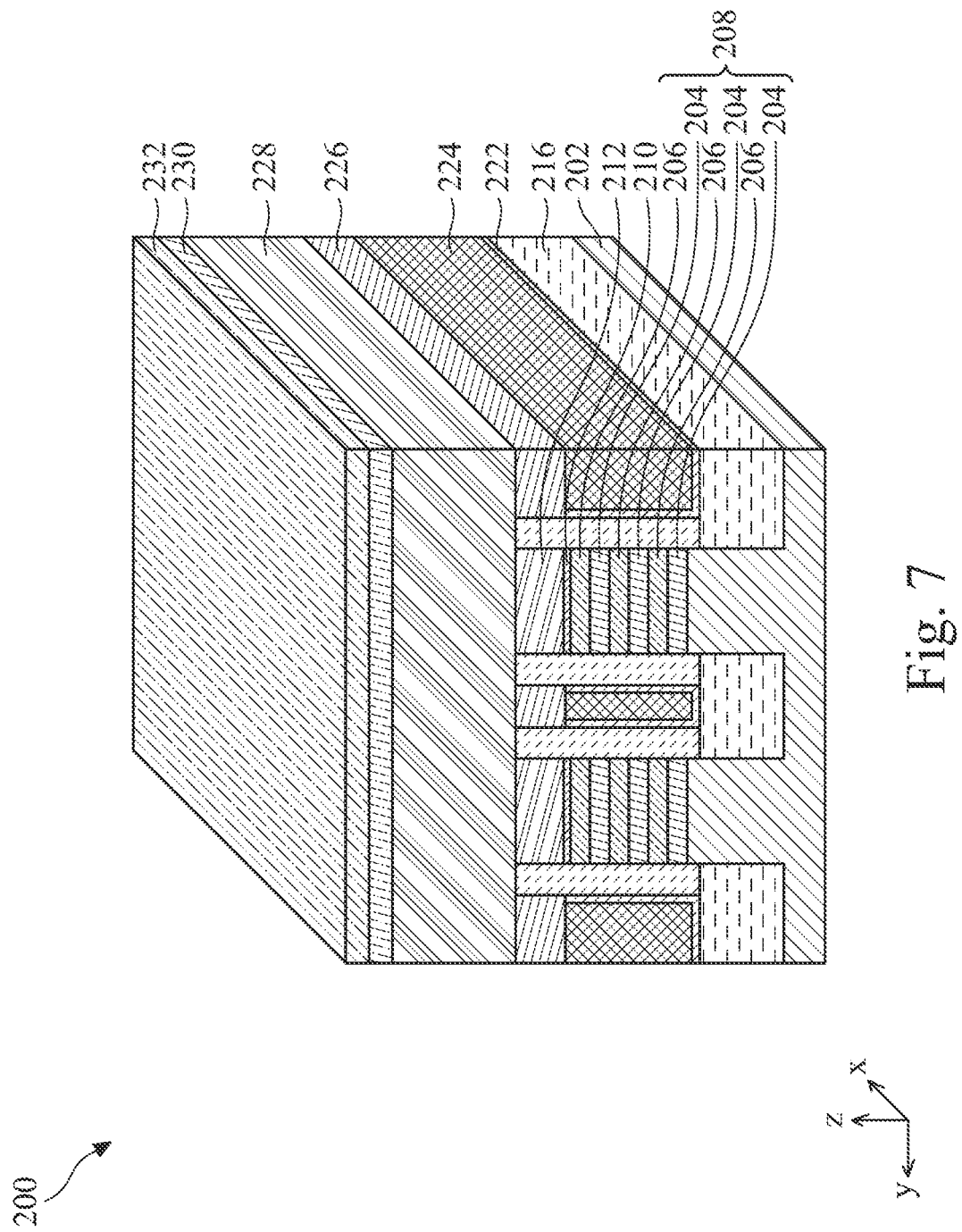

In some embodiments, the high-k dielectric features 226 are formed by a blanket deposition followed by a planarization process. The high-k dielectric features 226 may include a material having a k value greater than 7, such as $HfO_2$, $ZrO_2$, HfAlOx, HfSiOx, or $Al_2O_3$. Any suitable deposition process, such as a CVD, PECVD, FCVD, or ALD process, may be used to deposit the high-k dielectric material. As shown in FIG. 7, after operation 112, top surfaces of the high-k dielectric features 226, the cladding layers 218 and the top spacing layer 212 are substantially co-planar.

In operation 114, a sacrificial gate electrode layer 228, a pad layer 230 and a mask layer 232 are sequentially formed over the top spacing layer 212, the cladding layer 218, and the high-k dielectric features 226, as shown in FIG. 7. The sacrificial gate electrode layer 228, pad layer 230 and mask layer 232 may be formed by sequential blanket deposition.

In some embodiments, the sacrificial gate electrode layer 228 includes sacrificial gate electrode layer 228 silicon such as polycrystalline silicon or amorphous silicon. The thickness of the sacrificial gate electrode layer is in a range between about 40 nm and about 200 nm. In some embodiments, the sacrificial gate electrode layer 228 is subjected to a planarization operation. The sacrificial gate electrode layer 228 may be deposited using CVD, including LPCVD and PECVD, PVD, ALD, or other suitable process.

The pad layer 230 and the mask layer 232 are formed over the sacrificial gate electrode layer 228. The pad layer 230 may include silicon nitride. The mask layer 232 may include silicon oxide.

Figure 8A:
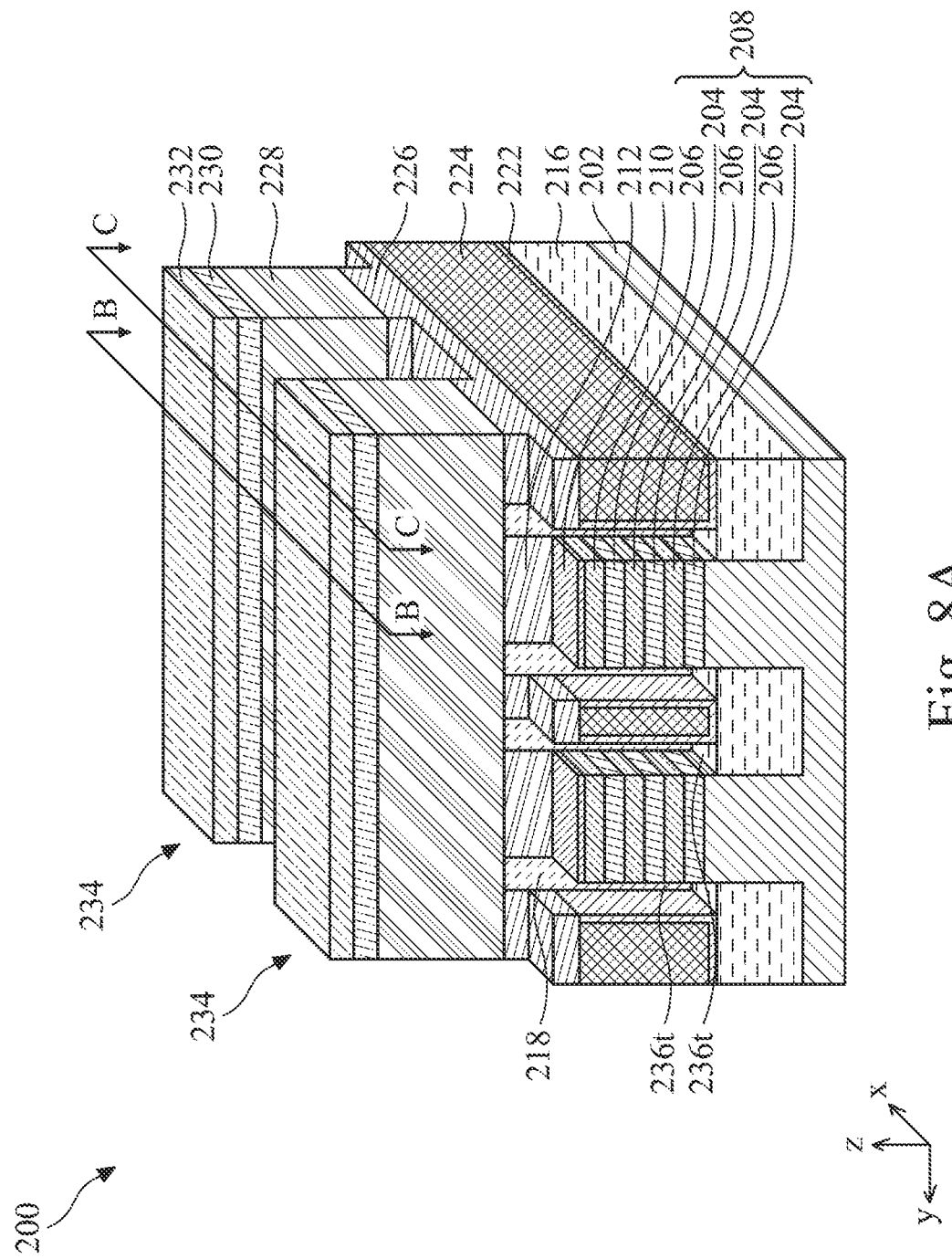
Figure 8C:
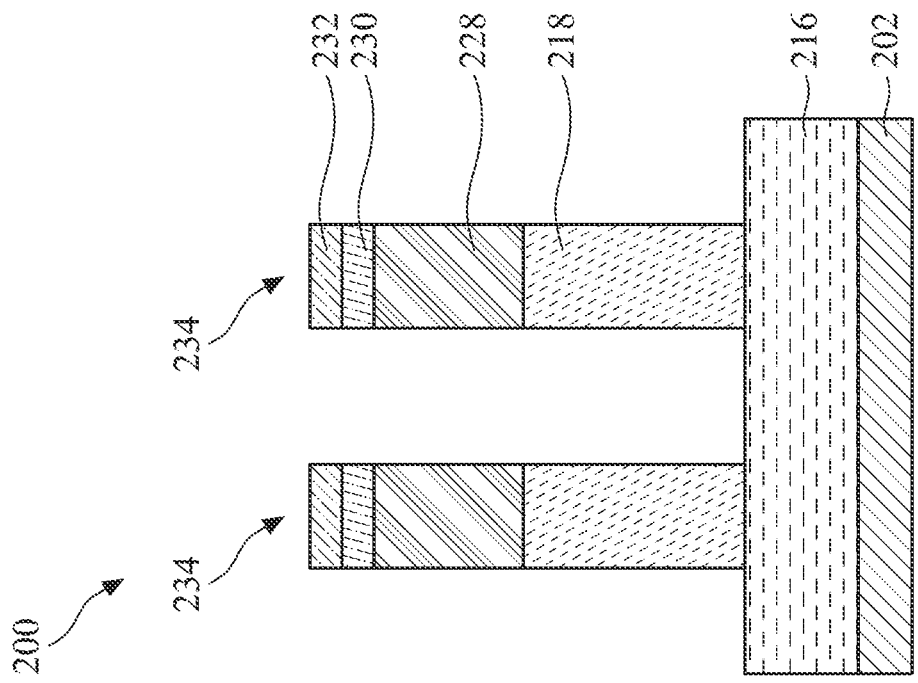
Figure 8B:
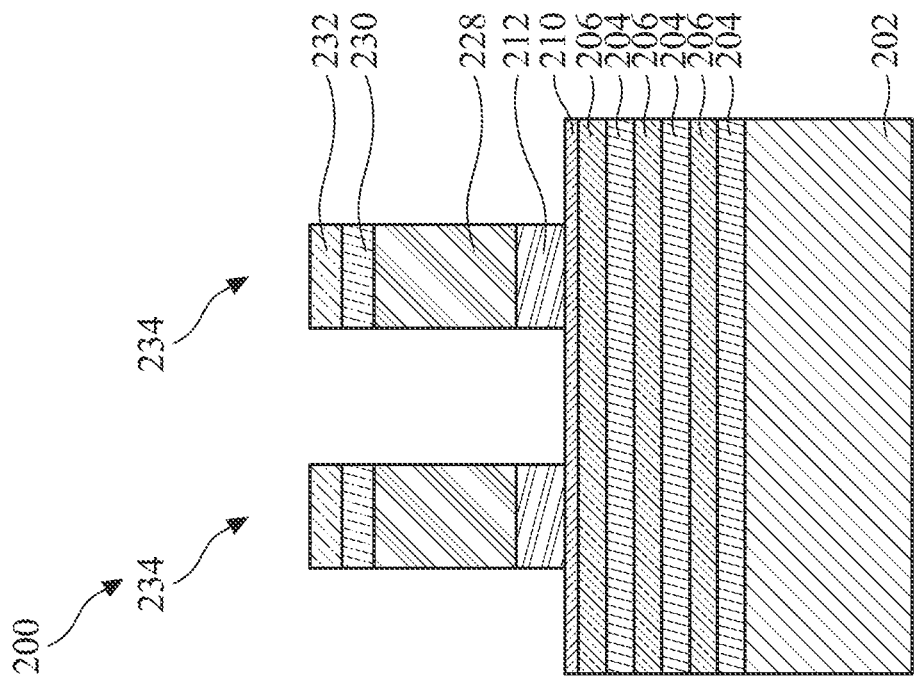

In operation 116, sacrificial gate structures 234 are formed, as shown in FIGS. 8A-8C. FIG. 8A is a schematic perspective view of the semiconductor device 200. FIG. 8B is a schematic sectional view of the semiconductor device 200 along the line B-B on FIG. 8A. FIG. 8C is a schematic sectional view of the semiconductor device 200 along the line C-C on FIG. 8A.

In operation 116, a patterning operation is performed on the mask layer 232, the pad layer 230, the sacrificial gate electrode layer 228 and the sacrificial gate dielectric layer 218 to form the sacrificial gate structures 234. The sacrificial gate structures 234 by patterning the mask layer 232 and the pad layer 230 and etching the sacrificial electrode layer 228, the top spacing layer 212, and the cladding layers 218 using the mask layer 232 and the pad layer 230 as etching mask. The sacrificial gate structures 234 are formed over portions of the fin structures 214 which are to be channel regions.

According to embodiments of the present disclosure, portions of the cladding layers 218 and the top spacing layer 212 that are not covered by the patterned mask layer 232 are removed during operation 116. The exposed top spacing layer 212 is removed to expose the hard mask layer 210 on each fin structure 214. The hard mask layer 210 functions as an etch stop layer and protecting the semiconductor stack 208 underneath. The exposed cladding layers 218 are removed to expose the isolation layer 216. The exposed sacrificial gate electrode layer 228, the top spacing layer 212 and the cladding layer 218 may be removed using the same or different etch processes depending on the materials in the sacrificial gate electrode layer 228, the top spacing layer 212 and the cladding layer 218. In some embodiments, the high-k dielectric features 226 maybe recessed along the z-direction during the formation of the sacrificial gate structures 234.

Because the hard mask layer 210 on the top of the semiconductor stack 208 protects the semiconductor stack 208 below during removal of the cladding layer 218, the cladding layer 218 may be substantially removed along the z-direction from the sidewall of the fin structures 214, forming trenches 236t with substantially uniform and continuous dimension along the z-direction.

As shown in FIG. 8B, the sacrificial gate structures 234 may include the mask layer 232, the pad layer 230, the sacrificial gate electrode layer 228 and the top spacing layer 212 over the fin structures 214. As shown in FIG. 8C, the sacrificial gate structures 234 may include the mask layer 232, the pad layer 230, the sacrificial gate electrode layer 228 and the cladding layer the fin structures 214.

Figure 9A:
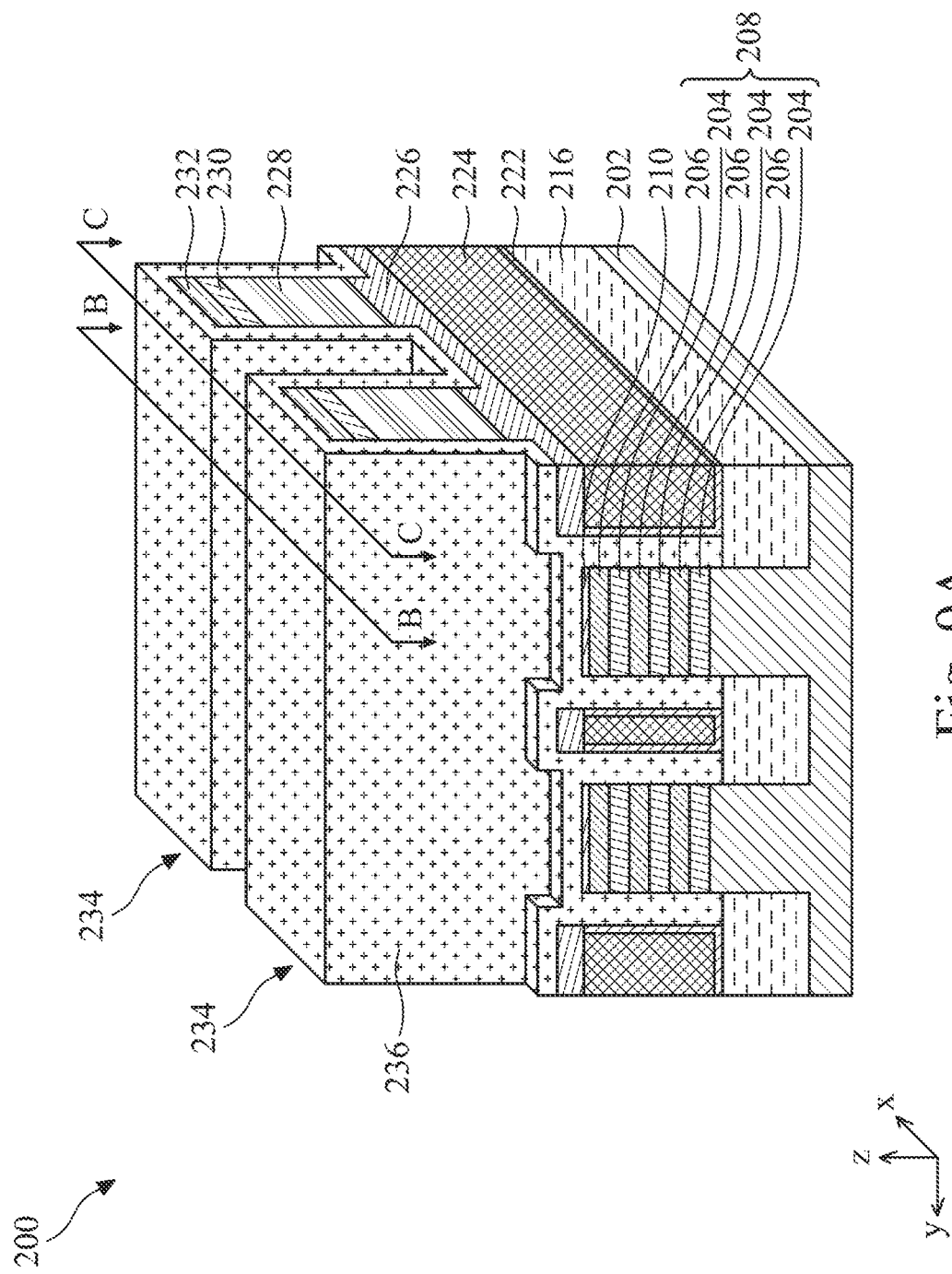
Figure 9C:
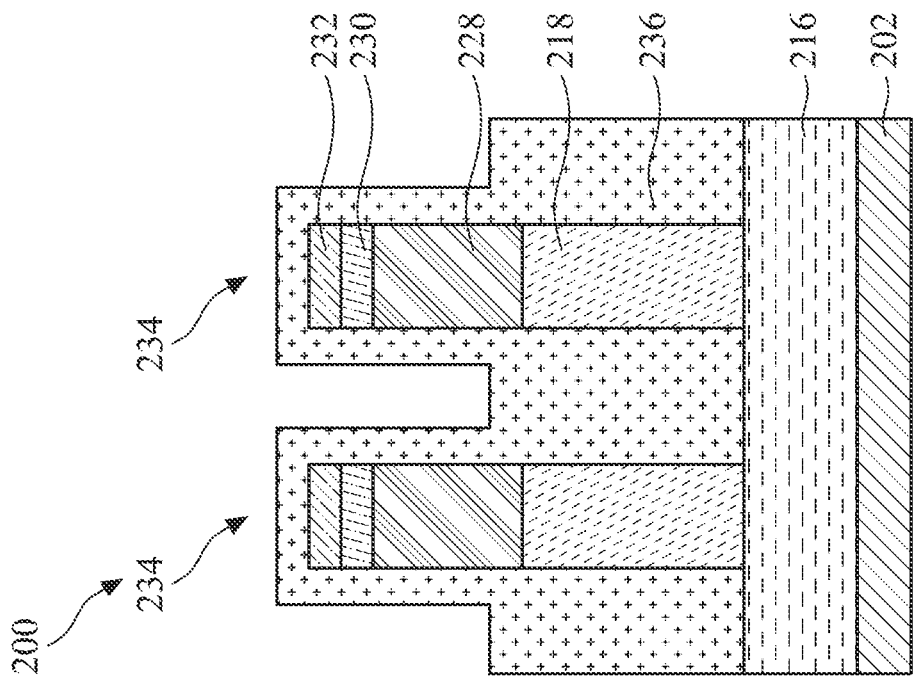
Figure 9B:
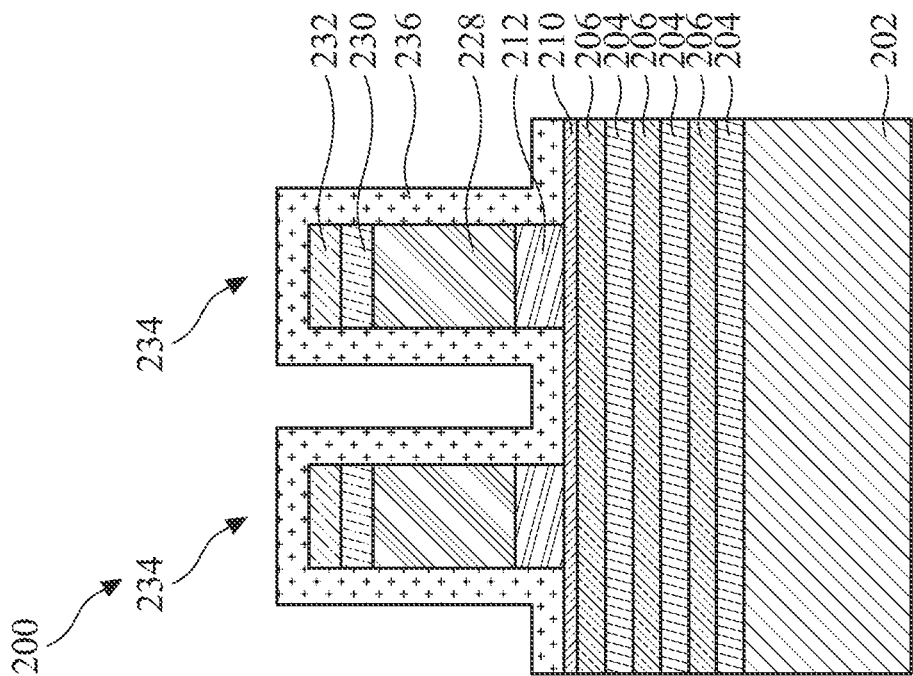

In operation 118, a sidewall spacer layer 236 is deposited over the exposed surfaces of the semiconductor devices 200, as shown in FIGS. 9A-9C. FIG. 9A is a schematic perspective view of the semiconductor device 200. FIG. 9B is a schematic sectional view of the semiconductor device 200 along the line B-B on FIG. 9A. FIG. 9C is a schematic sectional view of the semiconductor device 200 along the line C-C on FIG. 9A.

The sidewall spacer layer 236 may be formed by any suitable deposition to cover all exposed surfaces on the semiconductor device 200. As shown in FIGS. 9A-9C, the sidewall spacer layer 236 is deposited over top surfaces and sidewalls of the sacrificial gate structures 234, top surfaces and sidewalls of the fin structures 214, side walls of the hybrid fins 220, top surfaces and sidewalls of the high-k dielectric features 226, and exposed surfaces of the isolation layer 216. In some embodiments, the sidewall spacer layer 236 fills the trenches between the hybrid fins 220 and the fin structures 214. In other embodiments, air gaps (not shown)

may be formed in the sidewall spacer layer 236, particularly, in the areas in the trenches between the hybrid fins 220 and the fin structures 214.

In some embodiments, the sidewall spacer layer 236 is formed by a blanket deposition of one or more layers of insulating material. The sidewall spacer layer 236 may be formed by ALD or CVD, or any other suitable method. In some embodiments, the insulating material of the sidewall spacer layer 236 is a silicon nitride-based material, such as SiN, SiON, SiOCN or SiCN and combinations thereof.

In some embodiments, the sidewall spacer layer 236 is subjected to anisotropic etching to remove the sidewall spacer layer 236 from horizontal surfaces, such as the top surface of the hard mask layer 210 and the top surface of the mask layer 232. The sidewall spacer layer 236 on the horizontal surfaces may be removed after the deposition in operation 118. In other embodiments, the sidewall spacer layer 236 on the horizontal surfaces may be removed during fin structure etch back in operation 120 discussed below.

Figure 10A:
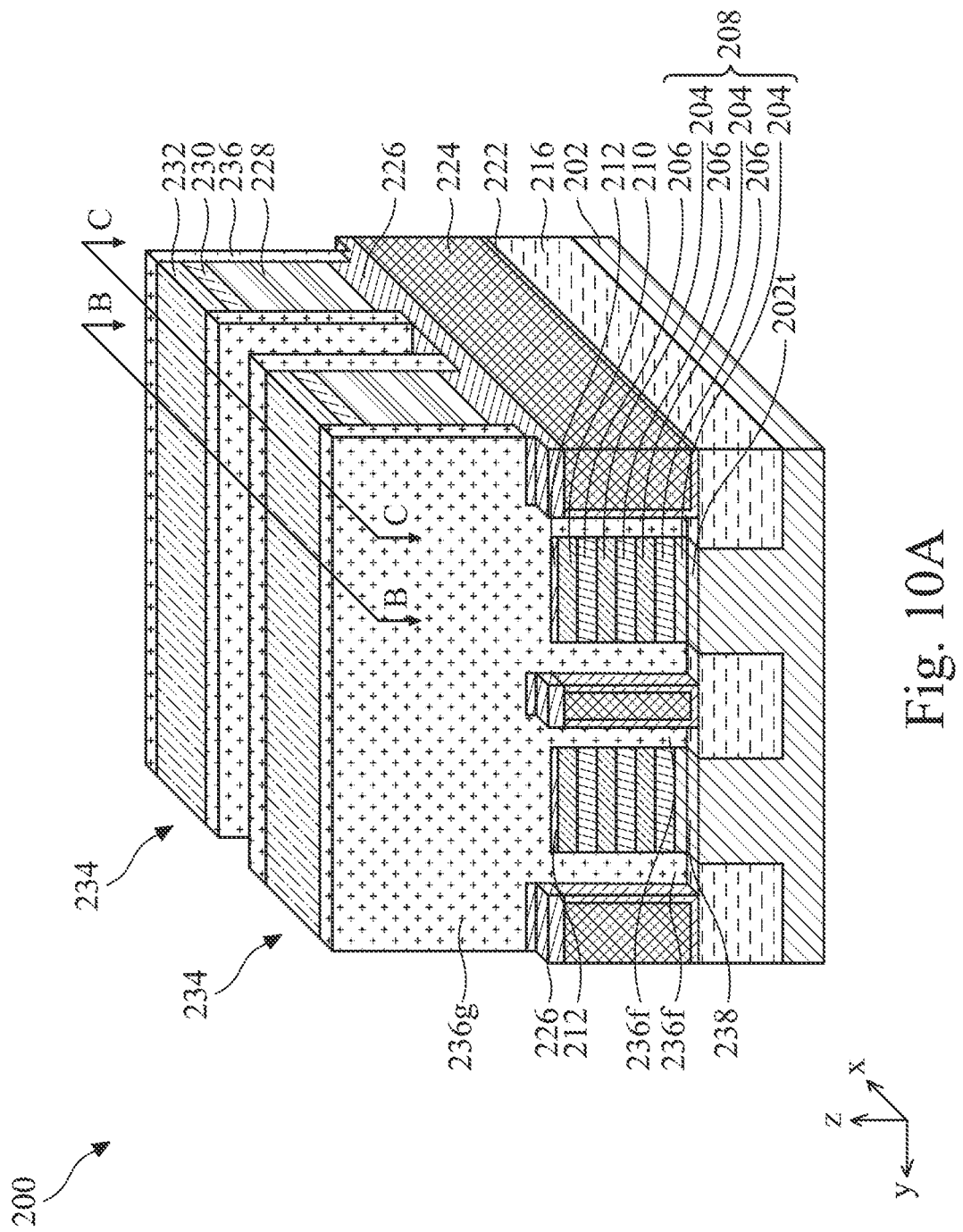

In operation 120, the fin structures 214 in source/drain region, or regions not covered by the sacrificial gate structures 234, are etched back, as shown in FIGS. 10A-10C. FIG. 10A is a schematic perspective view of the semiconductor device 200. FIG. 10B is a schematic sectional view of the semiconductor device 200 along the line B-B on FIG. 10A. FIG. 10C is a schematic sectional view of the semiconductor device 200 along the line C-C on FIG. 10A.

The fin structures 214 not covered by the sacrificial gate structures 234 are etched to expose the substrate 202 underneath the fin structures 214. In some embodiments, suitable dry etching and/or wet etching may be used to remove the semiconductor layers 206, the spacing layers 204, together or separately.

According to embodiments of the present disclosure, the sidewall spacer layer 236 formed between the removed fin structures 214 and the neighboring hybrid fin 220 is also removed. In some embodiments, the portions of the sidewall spacer layer 236 may be removed during recess etch of the fin structures 214. In other embodiments, the portions of the sidewall spacer layer 236 may be removed using a different process. In some embodiments, the high-k dielectric features 226 maybe recessed along the z-direction during the recess etch of the fin structures 214.

As shown in FIGS. 10A-10C, source/drain recesses 238 are formed between the neighboring hybrid fins 220 on both sides of each sacrificial gate structure 234. Each source/drain recess 238 by defined by the dielectric liner layers 222 of neighboring hybrid fins 220 and the high-k dielectric features 226 above the hybrid fins 220 along the y-axis, and by the sidewall spacer layer 236 on neighboring sacrificial gate structures 234 along the x-axis. A top surface 202t of the substrate 202 and end surfaces 206e of the semiconductor channel layers 206 are exposed to the source/drain recesses 238.

After operation 120, the remain portions of the sidewall spacer layer 236 are generally a planar structure formed on the sidewalls of the sacrificial gate structures 234 and extending down to the isolation layer 216 in the source/drain recess 238. Particularly, the sidewall spacer layer 236 may include a gate sidewall spacer portion 236g extending to fin sidewall spacer portions 236f. The gate sidewall spacer portion 236g is in contact with the mask layer 232, the pad layer 230, the sacrificial gate electrode 228, the top spacing layer 212 under the sacrificial gate electrode 228. The gate sidewall spacer portion 236g contacts the hard mask layer 210 above the fin structures 214 and the high-k dielectric features 226 above the hybrid fins 220. The fin sidewall spacer portions 236f are in contact with the cladding layers 218 formed in the regions between the hybrid fins 220 and the fin structures 214. The gate sidewall spacer portion 236g is connected and extending to the fin sidewall spacer portions 236f on both sides of the fin structure 214.

Because the fin sidewall spacer portions 236f are from a conformal deposition into a continuous space as part of the trench 236t (shown in FIG. 8A) vacated by the cladding layer, each fin sidewall spacer portion 236f has substantially the same dimension along the z-axis, thus, providing even coverage to on the sidewalls of all of the semiconductor channel layers 206.

Because the gate sidewall spacer portion 236g and the fin sidewall spacer portions 236f are formed during the same deposition process, the gate sidewall spacer portion 236g and the fin sidewall spacer portions 236f have substantially the same thickness along the x-axis and there is no gap therebetween, thus, provide improved isolation and avoids leakages.

In some embodiments, the gate sidewall spacer portion 236g and the fin sidewall spacer portion 236f have a substantially the same thickness. In some embodiments, the gate sidewall spacer portion 236g and the fin sidewall spacer portion 236f have a thickness T1 along the x-axis in a range from about 2 nm to about 20 nm. In other embodiments, the thickness T1 is in a range from about 5 nm to about 15 nm. A thickness less than 2 nm may be provide enough isolation function. A thickness greater than 20 nm may increase dimension of the device without additional benefits.

Figure 11A:
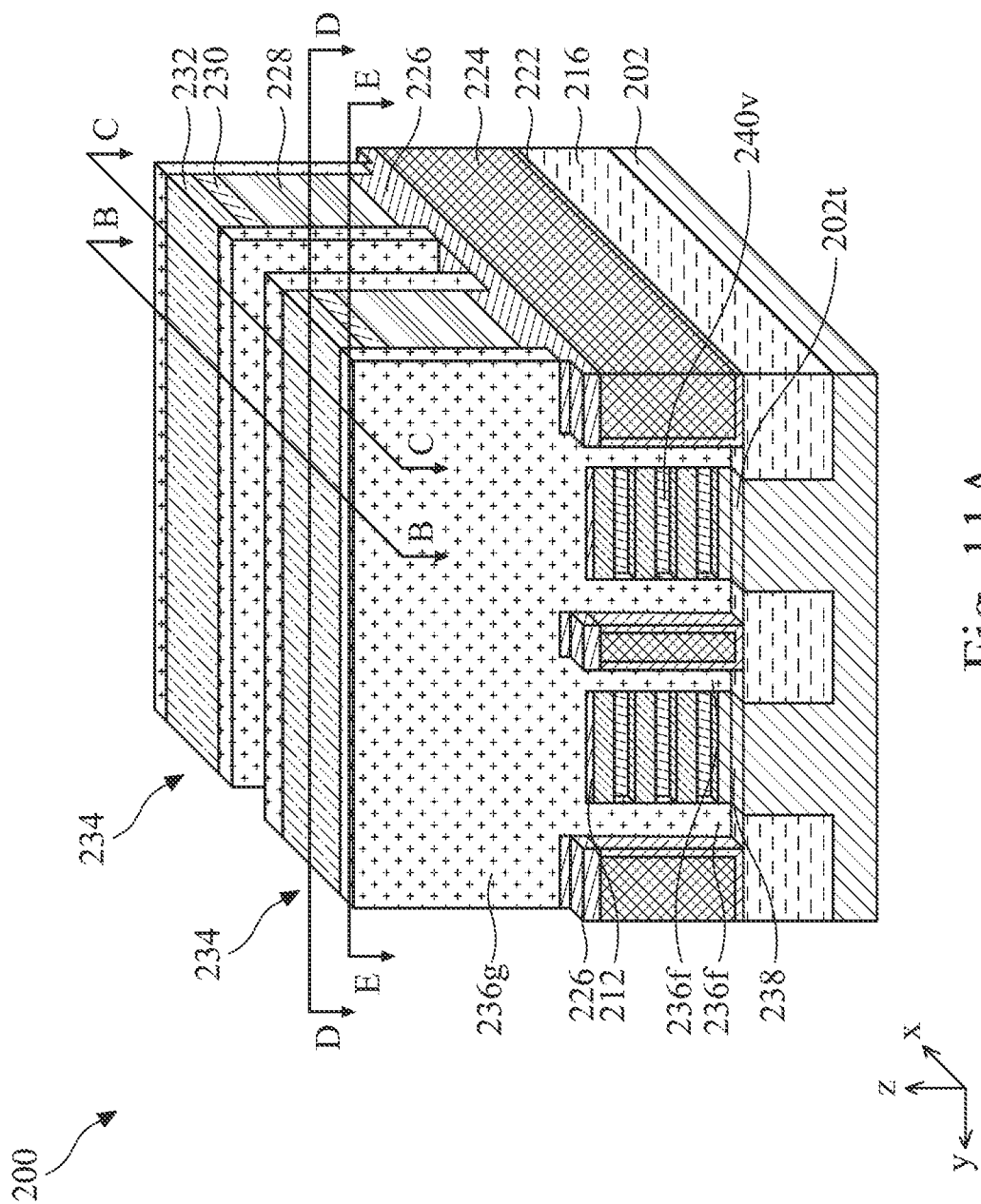
Figure 11D:
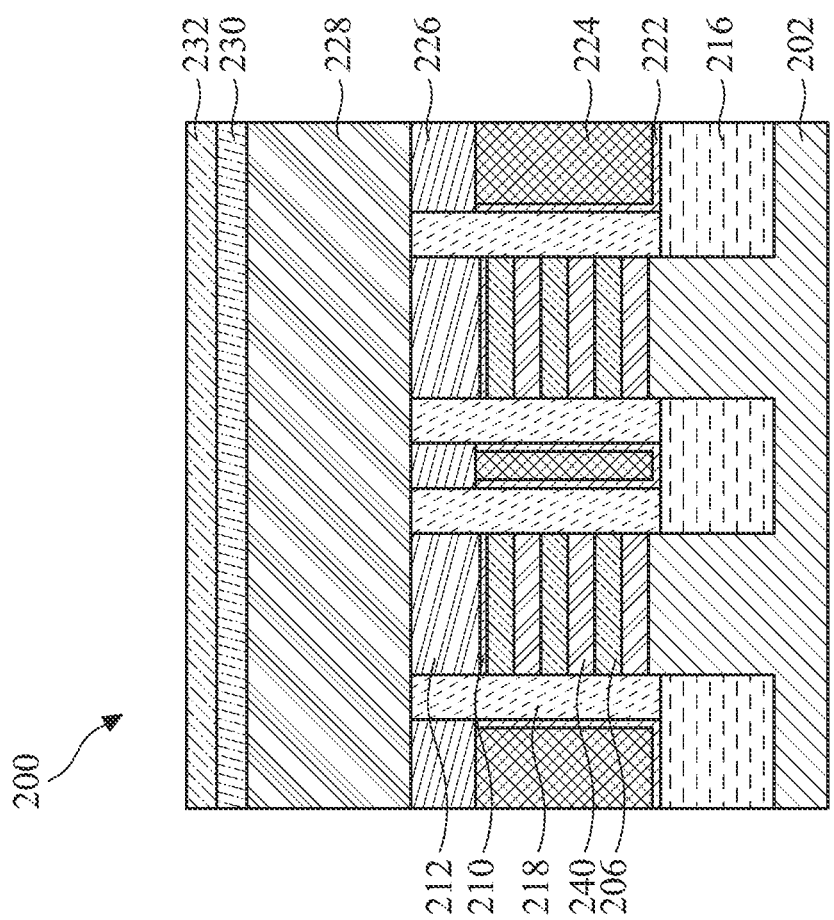
Figure 11E:
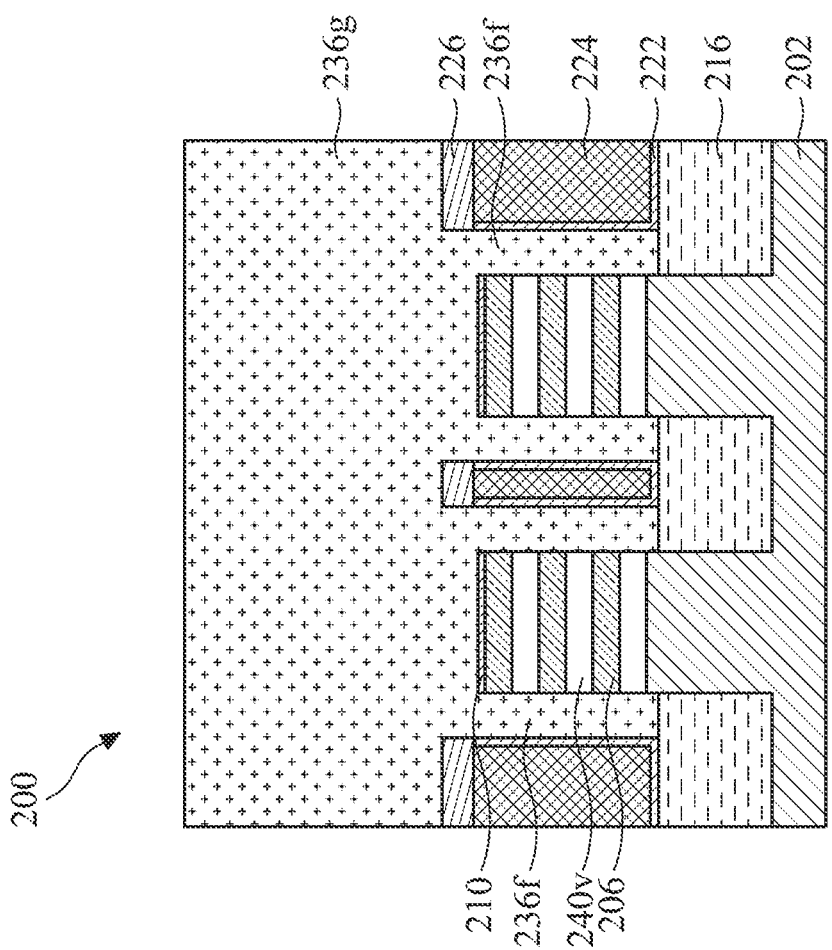

In operation 122, the fin structures 214 under the gate sidewall spacer portions 236g are recessed etched for forming inner spacers, as shown in FIGS. 11A-11E. FIG. 11A is a schematic perspective view of the semiconductor device 200. FIG. 11B is a schematic sectional view of the semiconductor device 200 along the line B-B on FIG. 11A. FIG. 11C is a schematic sectional view of the semiconductor device 200 along the line C-C on FIG. 11A. FIG. 11D is a schematic sectional view of the semiconductor device 200 along the line D-D on FIG. 11A. FIG. 11E is a schematic sectional view of the semiconductor device 200 along the line E-E on FIG. 11A.

In operation 122, the spacing layers 204 under the gate sidewall spacer portions 236g are selectively etched along the horizontal direction, or x-direction, to form inner spacer cavities 240v between the semiconductor channel layers 206. In some embodiments, the spacing layer 204 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

FIG. 11E schematically illustrates the fin sidewall spacer portions 236f, the gate sidewall portion 236g, and the inner spacer cavities 240v around the semiconductor channel layers 206. Because the spacing layers 204 are substantially of the same geometry, the inner spacer cavities 240v may be formed in a substantially unform manner.

In some embodiments, the inner spacer cavities 240v may have a length T2 substantially similar to the thickness of the gate sidewall spacer portions 236g and the fin sidewall spacer portions 236f. In some embodiments, the length T2 along the x-axis in a range from about 2 nm to about 20 nm. In other embodiments, the length T2 is in a range from about 5 nm to about 15 nm. A length T2 less than 2 nm may be provide enough space for an inner spacer with sufficient isolation function. A length T2 greater than 20 nm may increase dimension of the device without additional benefits.

Figure 12A:
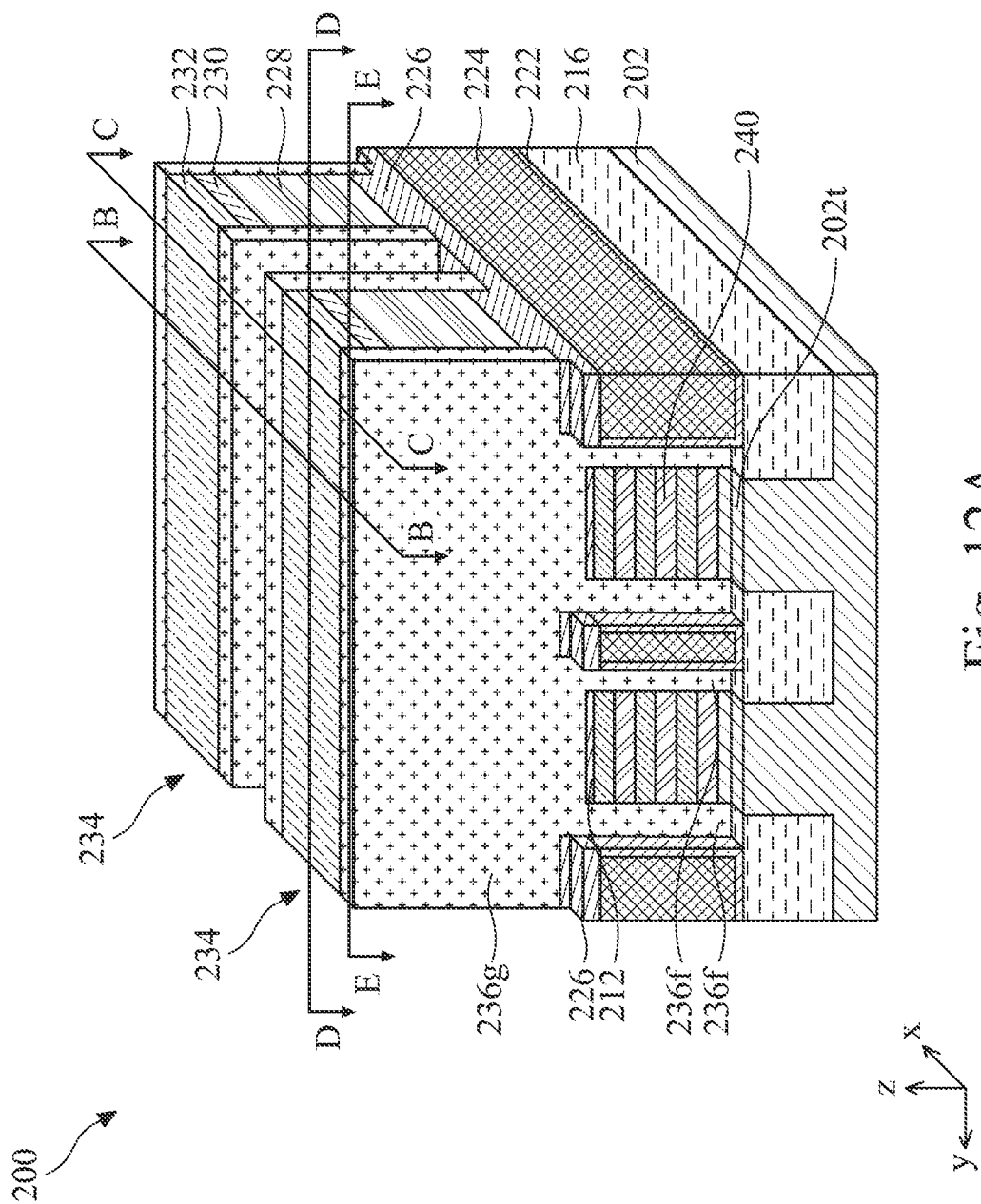
Figure 12D:
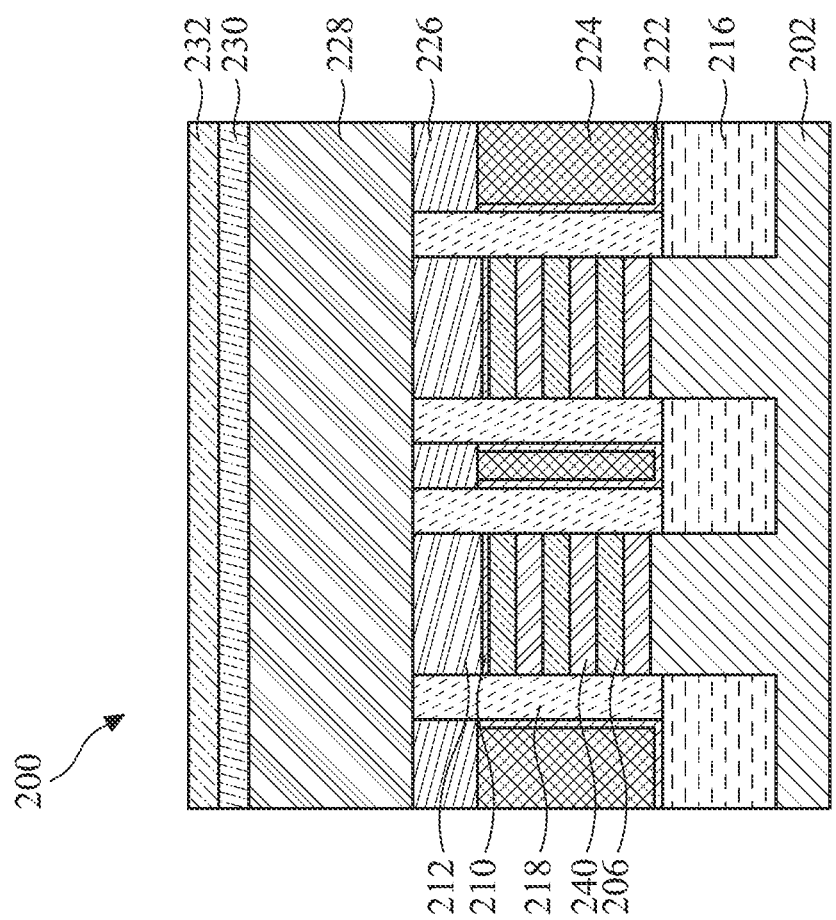
Figure 12E:
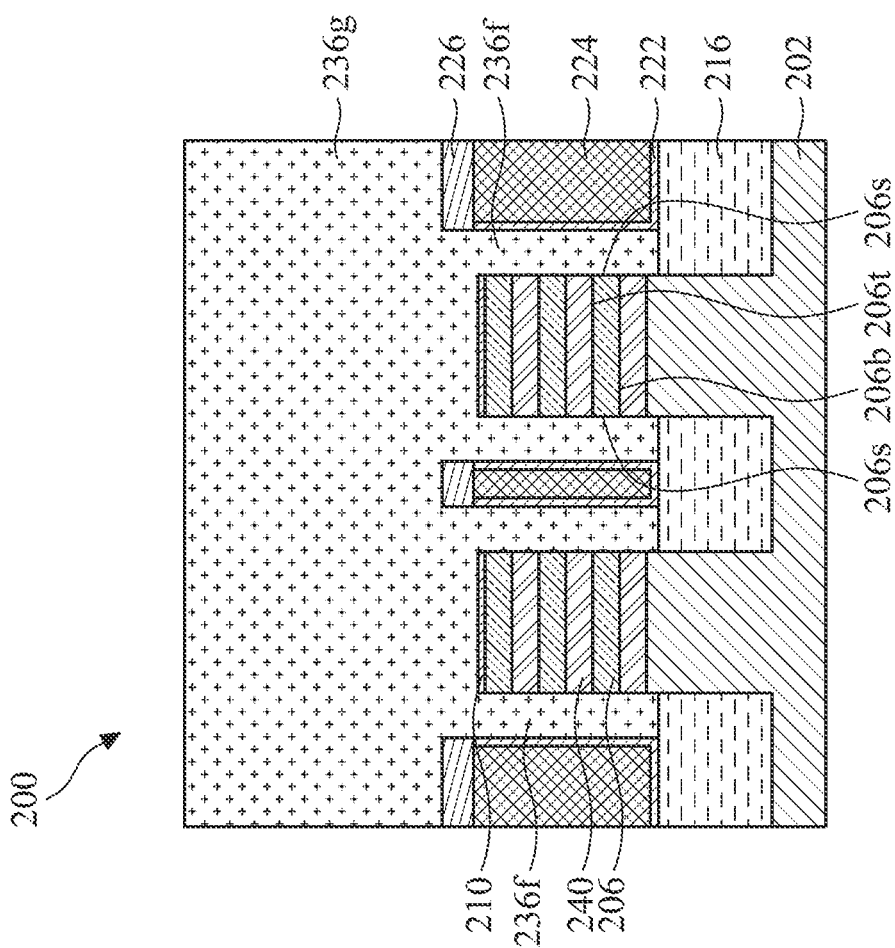

In operation 124, inner spacers 240 are formed in the inner spacer cavities 240v, as shown in FIGS. 12A-12E. FIG. 12A is a schematic perspective view of the semiconductor device 200. FIG. 12B is a schematic sectional view of the semiconductor device 200 along the line B-B on FIG. 12A. FIG. 12C is a schematic sectional view of the semiconductor device 200 along the line C-C on FIG. 12A. FIG. 12D is a schematic sectional view of the semiconductor device 200 along the line D-D on FIG. 12A. FIG. 12E is a schematic sectional view of the semiconductor device 200 along the line E-E on FIG. 12A.

The inner spacers 240 are formed in the inner spacer cavities 240v by conformally deposit and then partially remove an insulating layer. The insulating layer can be formed by ALD or any other suitable method. The subsequent etch process removes most of the insulating layer except inside the cavities, resulting in the inner spacers 240.

FIG. 12E schematically illustrates the fin sidewall spacer portions 236f, the gate sidewall portion 236g, and the inner spacers 240 around the semiconductor channel layers 206. Each semiconductor channel layer 206 has a top surface 206t, a bottom surface 206b opposing the top surface 206t, and two sidewalls 206s connecting the top surface 206t and the bottom surface 206b. The bottom surface 206b and top surfaces 206t are parallel to the x-y plane. As shown in FIG. 12E, the sidewalls 206s of each semiconductor channel layer 206 are in contact with the fin sidewall spacer portion 236f, and the top surface 206t and bottom surface 206b are in contact with the inner spacers 240. Thus, end portions of each semiconductor channel layer 206 are surrounded by the inner spacers 240 and the fin sidewall spacer portions 236f.

As discussed above, the length T2 of the inner spacer cavities 240t along the x-direction may be substantially the same as the thickness T1 of the fin sidewall spacer portions 236f. Therefore, the length of the inner spacers 240 along the x-direction may be substantially the same as the thickness T1 of the fin sidewall spacer portions 236f. Accordingly, the end portions of each semiconductor channel layer 206 may be surrounded by the inner spacers 240 and the fin sidewall spacer portions 236f of substantially uniform thickness, thus, with improved isolation.

The inner spacers 240 may be formed by conformally deposit an insulating material followed by an etch back process to remove the insulating material outside the inner spacer cavities 240v. The insulation material may be formed by ALD or CVD, or any other suitable deposition. In some embodiments, the insulating material of the inner spacers 240 is a silicon nitride-based material, such as SiN, SiON, SiOCN or SiCN and combinations thereof. In some embodiments, the inner spacers 240 and the sidewall spacer layer 236 may be formed from the same material. In other embodiments, the inner spacers 240 and the sidewall spacer layer 236 may be formed from the different materials.

Figure 13A:
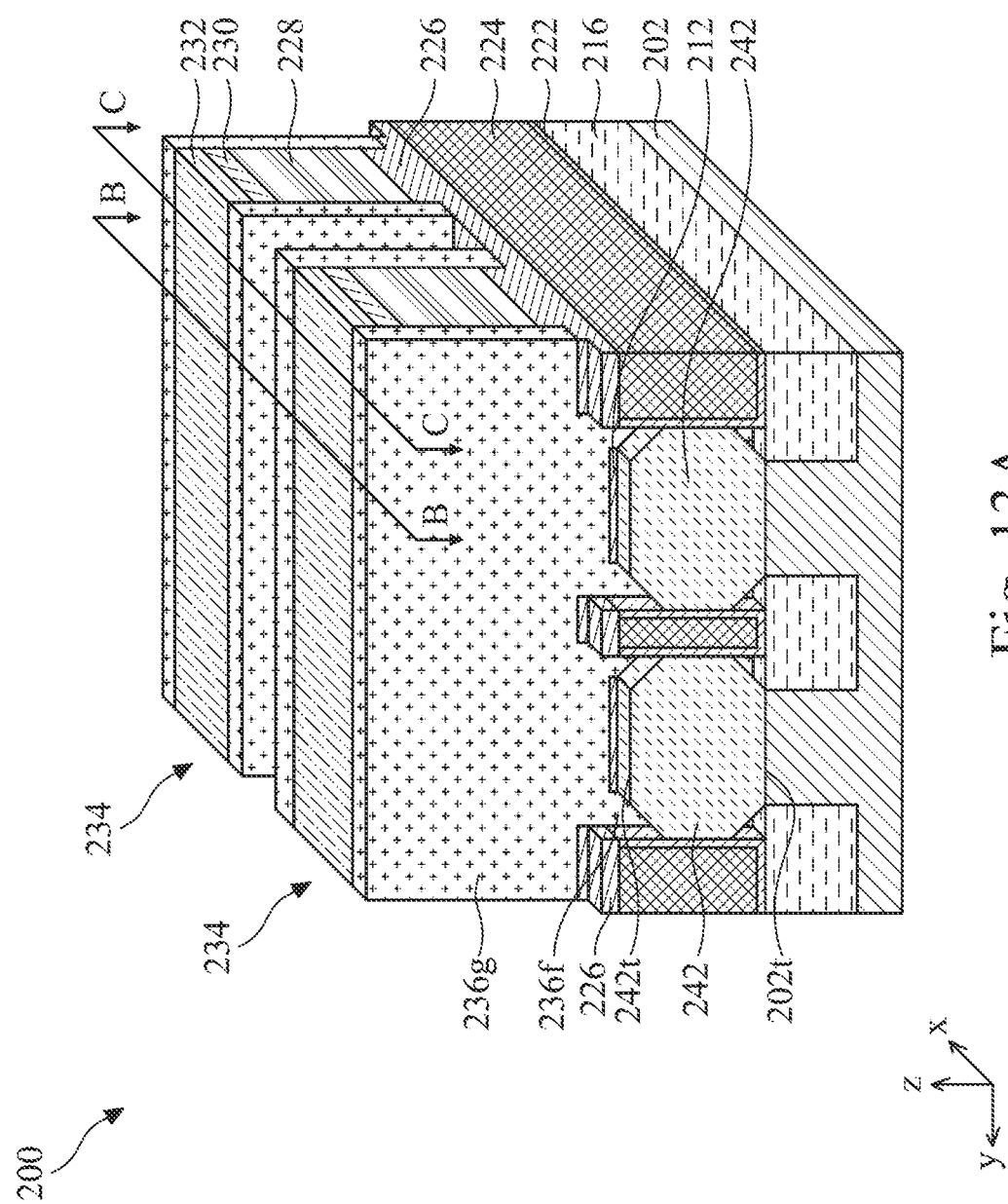

At operation 126, epitaxial source/drain features 242 are formed, as shown in FIGS. 13A-13O. FIG. 13A is a schematic perspective view of the semiconductor device 200. FIG. 13B is a schematic sectional view of the semiconductor device 200 along the line B-B on FIG. 13A. FIG. 13C is a schematic sectional view of the semiconductor device 200 along the line C-C on FIG. 13A.

The source/drain features 242 may include source/drain features for N-type devices and/or P-type devices. When the semiconductor device 200 includes N-type devices and/or P-type devices, masks are used and patterning processes are performed to sequentially form the source/drain features 242 for the N-type devices and/or P-type devices.

For n-type devices, the epitaxial source/drain features 242 may include one or more layers of Si, SiP, SiC and SiCP. The epitaxial source/drain features 242 also include N-type dopants, such as phosphorus (P), arsenic (As), etc. In some embodiments, the epitaxial source/drain features 242 may be a Si layer includes phosphorus (P) dopants.

For p-type devices, the epitaxial source/drain features 242 may include one or more layers of Si, SiGe, Ge with p-type dopants, such as boron (B). In some embodiments, the epitaxial source/drain features 242 may be SiGeB material, wherein boron is a dopant.

The epitaxial source/drain features 242 may be formed by any suitable method, such as by CVD, CVD epitaxy, molecular beam epitaxy (MBE), or any suitable deposition technique. The epitaxial source/drain features 242 may include one or more layers of epitaxial materials grown from the exposed top surface 202t of the substrate 202 and the end surfaces 206e of the semiconductor channel layers 206. In FIG. 13A, the cross section of the epitaxial source/drain features 242 in the y-z plane are in an octagonal shape. However, the epitaxial source/drain features 242 may be other shapes according to the design.

As shown in FIGS. 13B and 13C, the epitaxial source/drain features 242 has channel surfaces 242c in contact with the semiconductor channel layers 206 at the end surface 206e. The channel surface 242c also contacts the inner spacers 240 and the fin sidewall spacer portions 236f. In the example of FIGS. 13A-13C, a top surface 242t of the epitaxial source/drain features 242 is at a level adjacent the hard mask layer 210. In some embodiments, the top surface 242t of the epitaxial source/drain features 242 may extend beyond the hard mask layer 210 and the channel surface 242c is in contact with the gate sidewall spacer portion 236g.

Figure 14A:
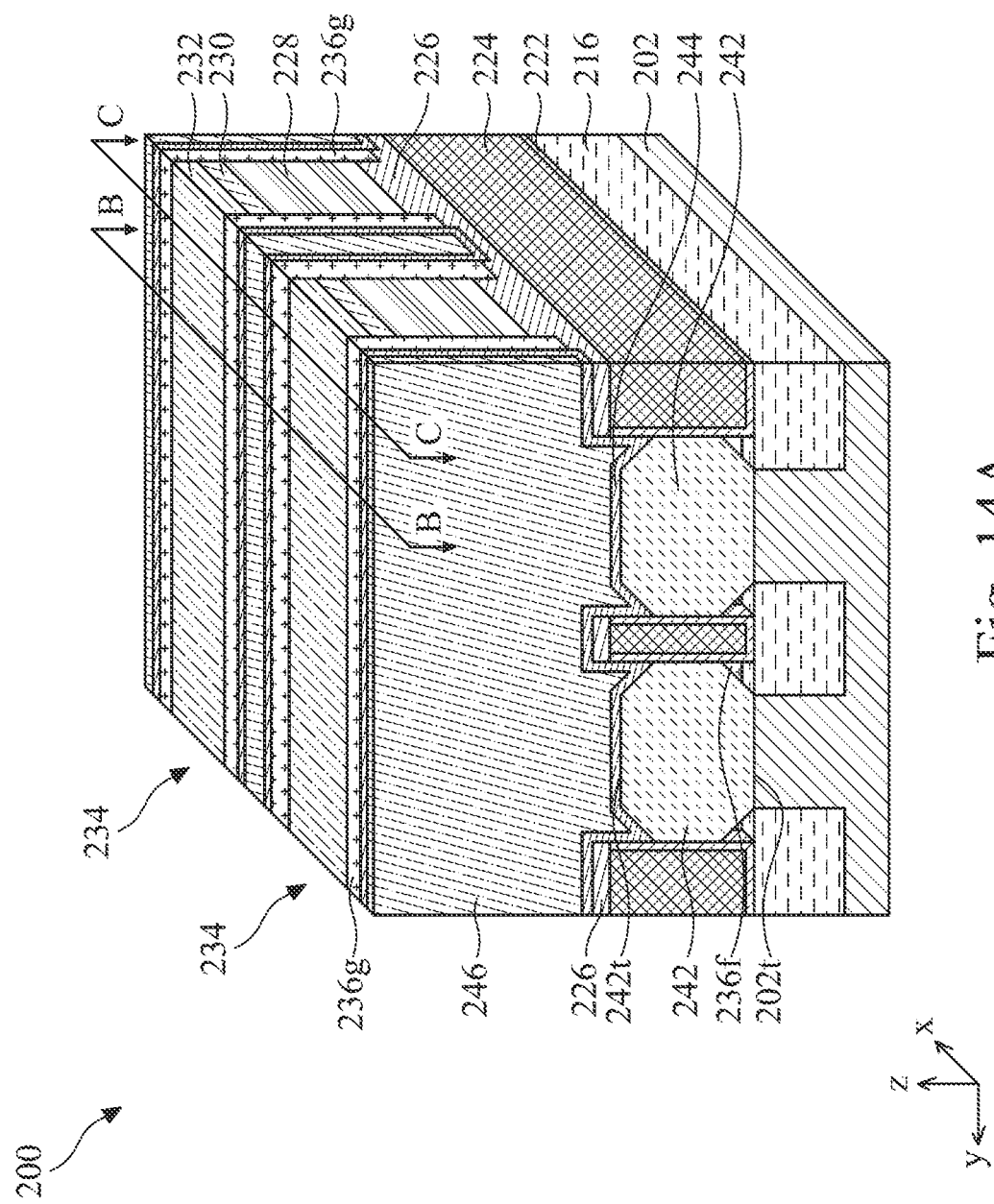

At operation 128, a contact etch stop layer (CESL) 244 and an interlayer dielectric (ILD) layer 246 are formed over the semiconductor device 200, as shown in FIGS. 14A-140. FIG. 14A is a schematic perspective view of the semiconductor device 200. FIG. 14B is a schematic sectional view of the semiconductor device 200 along the line B-B on FIG. 14A. FIG. 14C is a schematic sectional view of the semiconductor device 200 along the line C-C on FIG. 14A.

The CESL 244 is conformally formed over exposed surfaces of the semiconductor device 200. The CESL 244 is formed on the epitaxial source/drain features 242, the gate sidewall spacers portions 236g, the fin sidewall spacer portions 236f, and the hard mask layer 210 if exposed. and the isolation layer 216. The CESL 244 may include SiN, SiON, SiCN or any other suitable material, and may be formed by CVD, PVD, or ALD.

The interlayer dielectric (ILD) layer is formed over the CESL 244. The materials for the ILD layer 246 include compounds comprising Si, O, C, and/or H, such as silicon oxide, SiCOH and SiOC. Organic materials, such as polymers, may be used for the ILD layer 246. In some embodiments, the ILD layer 246 may be formed by flowable CVD (FCV). The ILD layer 246 protects the epitaxial source/drain features 242 during the removal of the sacrificial gate structures 234.

Figure 15A:
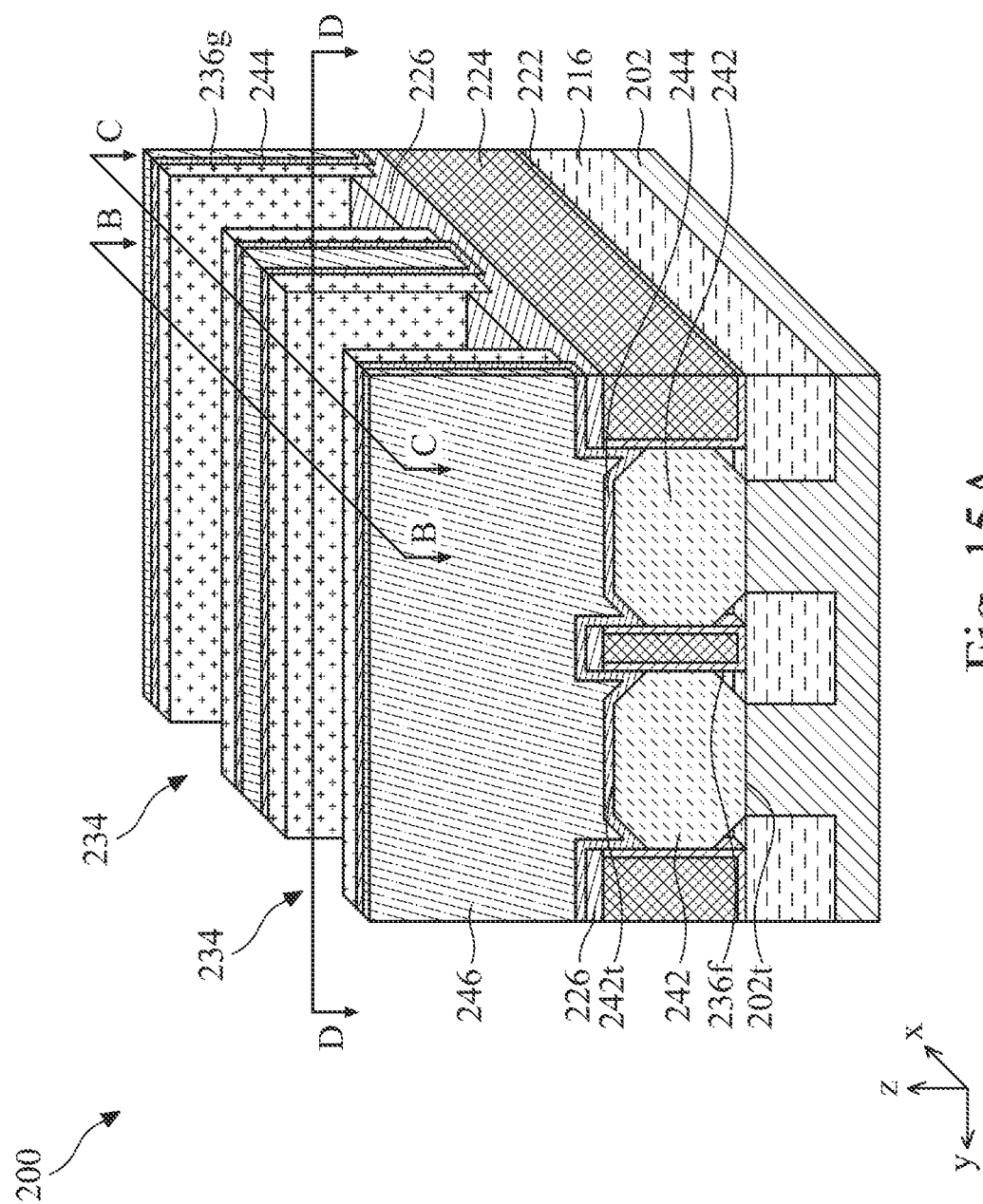
Figure 15D:
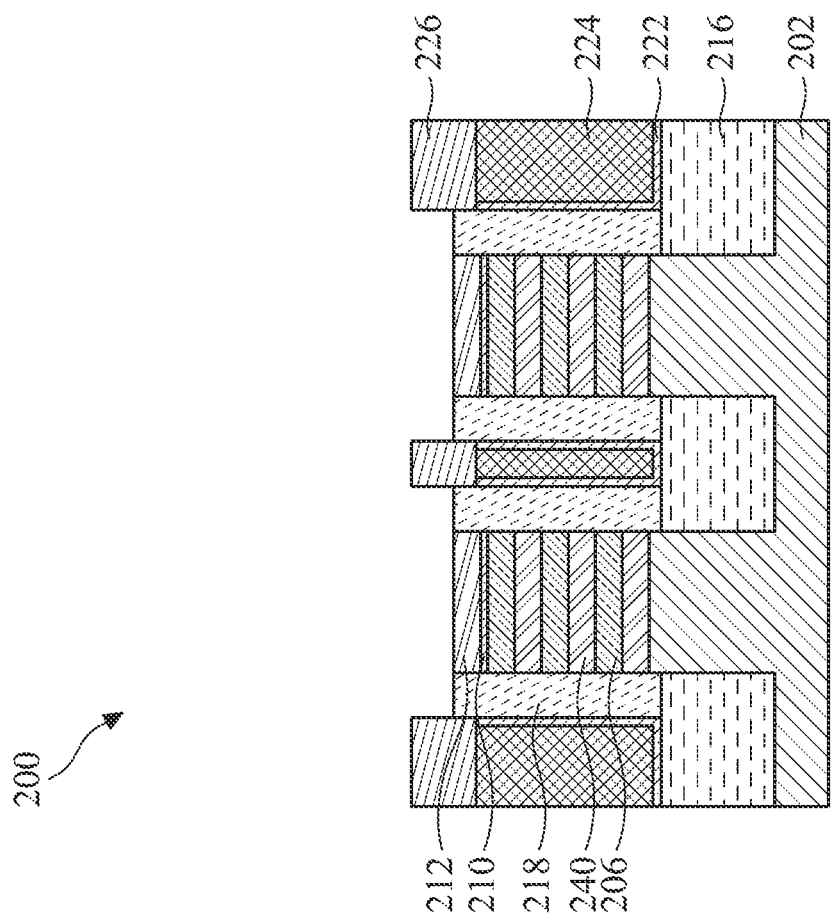

At operation 130, the sacrificial gate electrode layer 234 is at least partially removed, as shown in FIGS. 15A-15D. FIG. 15A is a schematic perspective view of the semiconductor device 200. FIG. 15B is a schematic sectional view of the semiconductor device 200 along the line B-B on FIG. 15A. FIG. 15C is a schematic sectional view of the semiconductor device 200 along the line C-C on FIG. 15A. FIG. 15D is a schematic sectional view of the semiconductor device 200 along the line D-D on FIG. 15A.

The sacrificial gate electrode layer 234 is recessed to a level below the top surface of the high-k dielectric features 226. In some embodiments, the sacrificial gate electrode layer 234 is completed removed along with portions of the top spacing layer 212 and the cladding layer 218, as shown in FIGS. 15A-15D. The sacrificial gate electrode layer 234 and portions of the top spacing layer 212 and the cladding layer 218 may be removed by any suitable process, such as dry etch, wet etch, or a combination thereof. In some embodiments, a wet etchant such as a tetramethylammonium hydroxide (TMAH) solution is used. The ILD layer 246 and the CESL layer 244 are not etched.

Figure 16A:
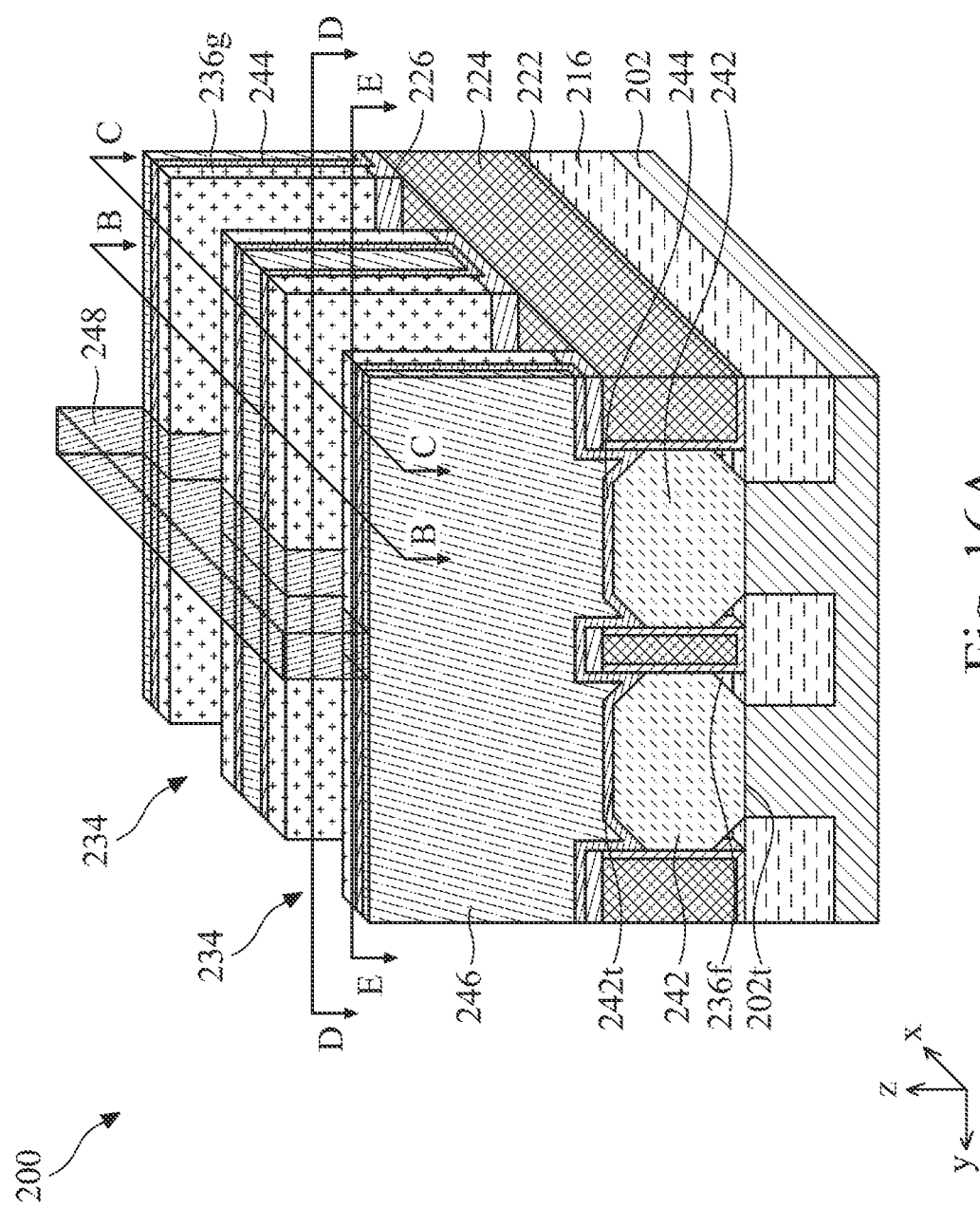
Figure 16D:
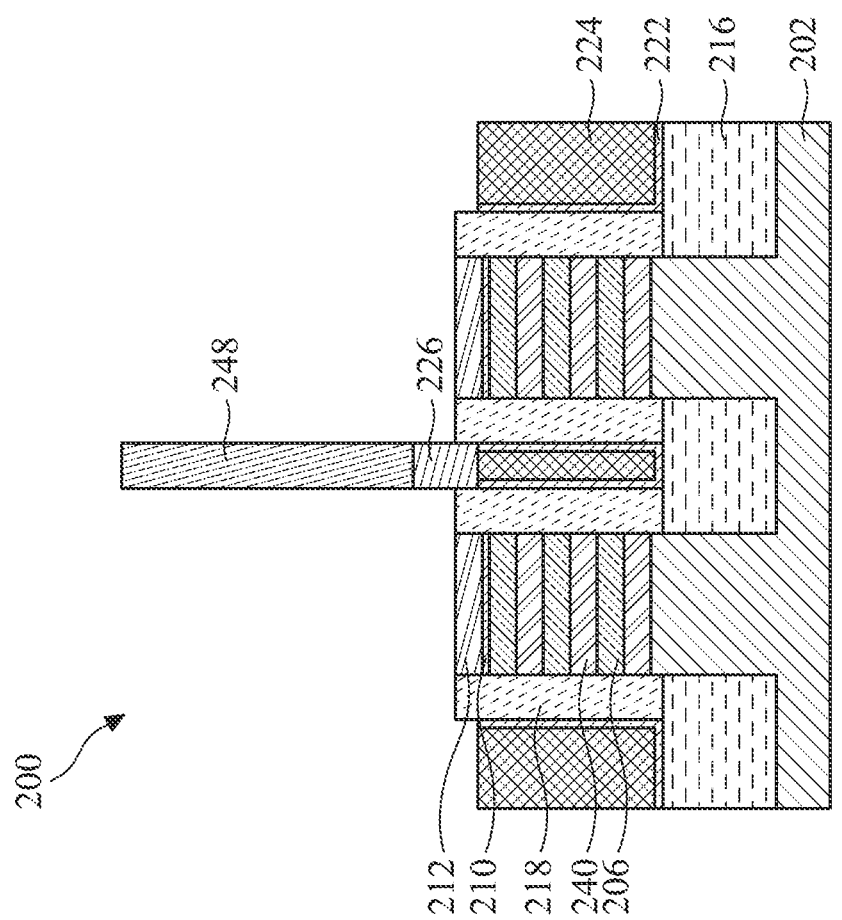
Figure 16E:
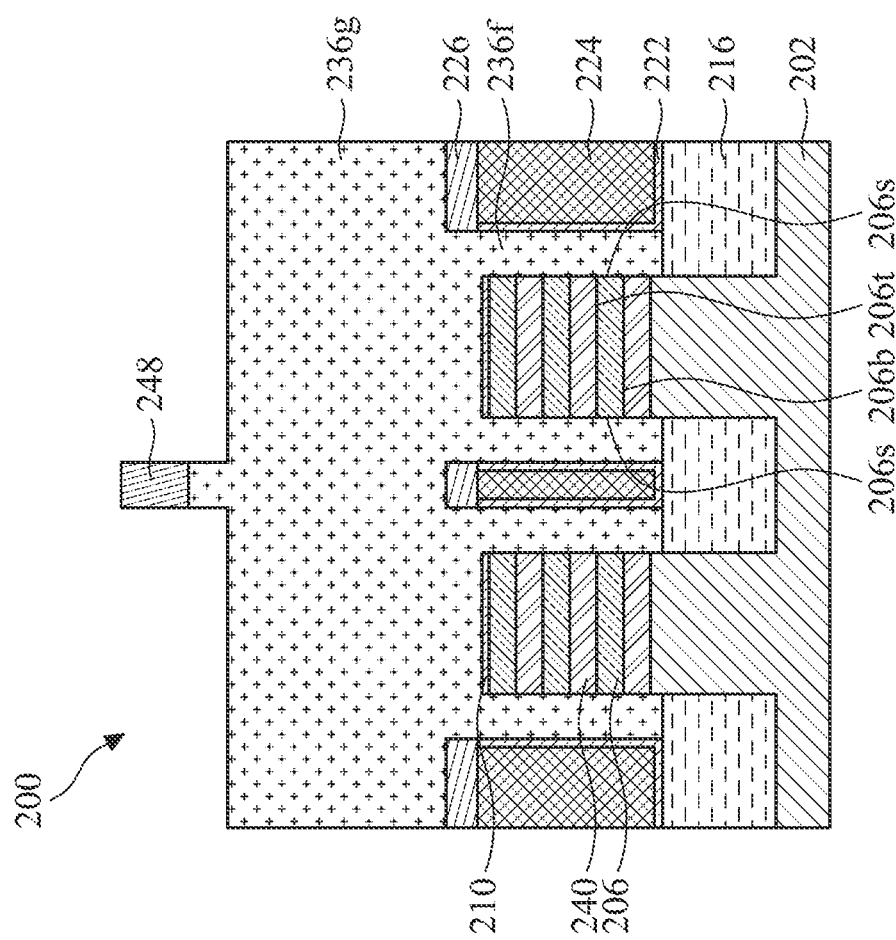

At operation 132, a patterning process is performed, and the high-k dielectric features 226 are selectively removed, as shown in FIGS. 16A-16E. FIG. 16A is a schematic perspective view of the semiconductor device 200. FIG. 16B is a schematic sectional view of the semiconductor device 200 along the line B-B on FIG. 16A. FIG. 16C is a schematic sectional view of the semiconductor device 200 along the line C-C on FIG. 16A. FIG. 16D is a schematic sectional view of the semiconductor device 200 along the line D-D on FIG. 16A. FIG. 16E is a schematic sectional view of the semiconductor device 200 along the line E-E on FIG. 16E.

As discussed above, the high-k dielectric features 226 are intended as dielectric isolations between sections of conductive materials in gate structures. At operation 132, a patterned photoresist layer 248 is formed over the high-k dielectric features 226 to be kept in the semiconductor devices 200. The high-k dielectric features 226 not covered by the patterned photoresist layer 248 is subsequently removed. The removal process may be any suitable processes, such as dry etch, wet etch, or a combination thereof. After operation 132, the dielectric liner layer 222 and the dielectric filling material 224 under the removed high-k dielectric features 226 are exposed. In some embodiments, the gate sidewall spacer portion 236g may be also removed. The patterned photoresist layer 248 is then removed for subsequent processing.

Figure 17A:
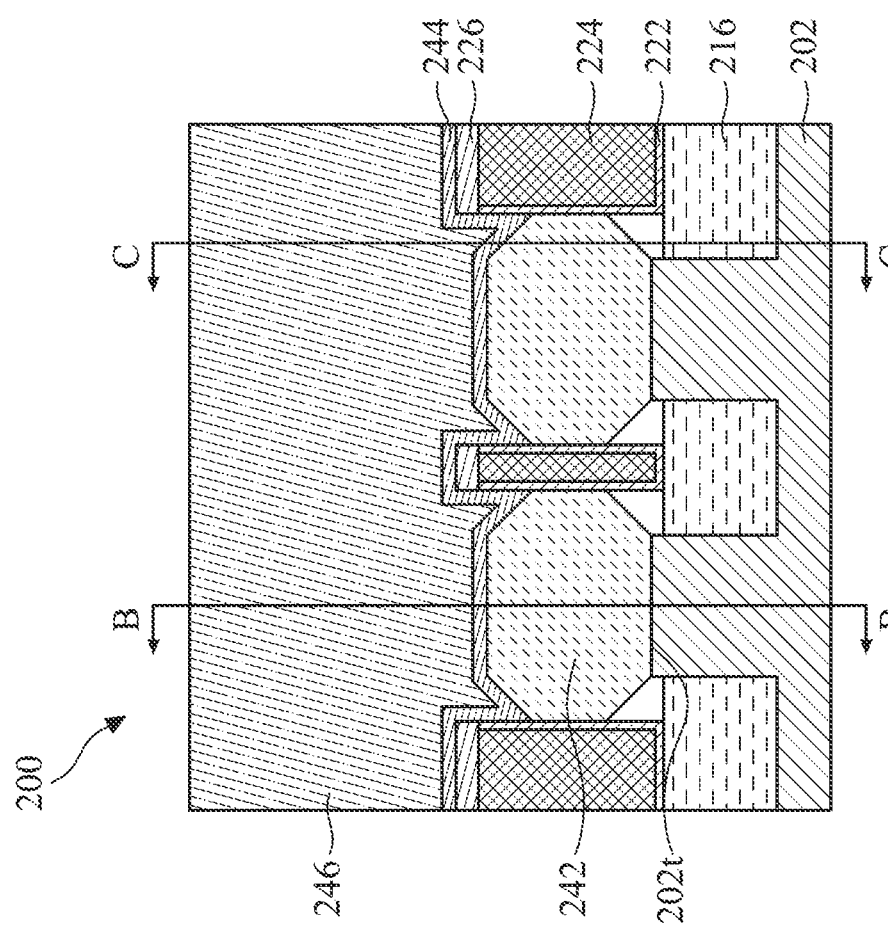
Figure 17D:
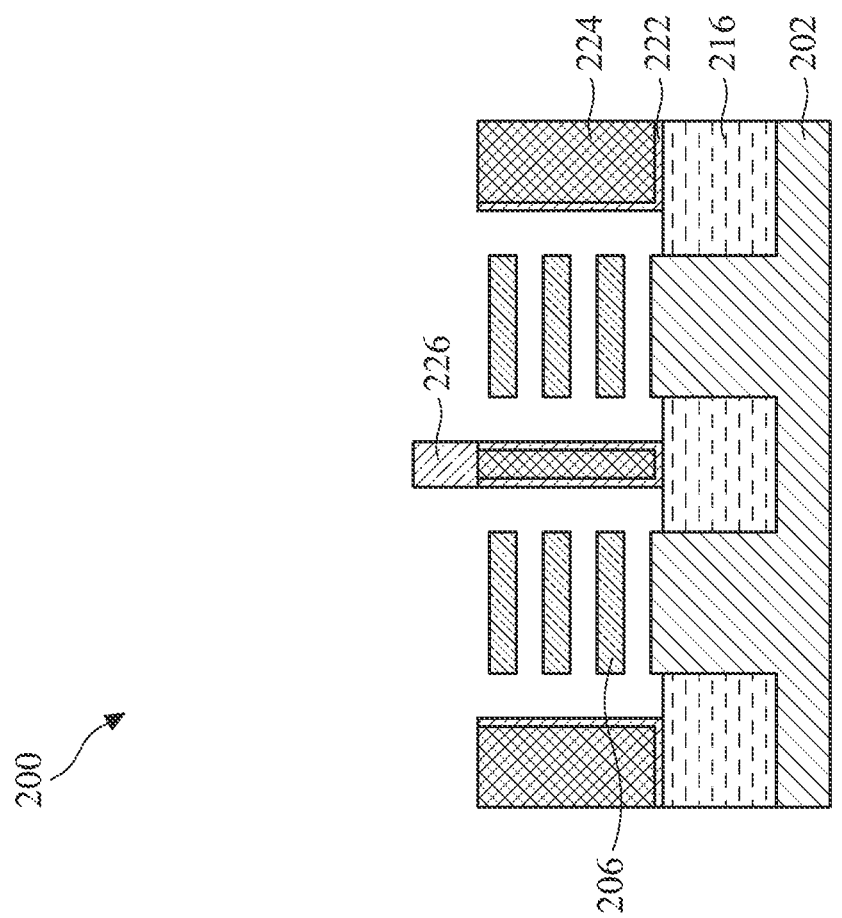

In operation 134, the top spacing layer 212, cladding layers 218, spacing layers 204, and hard mask layer 210 are removed to expose the semiconductor channel layers 206, as shown in FIGS. 17A-17D. FIG. 17A is a schematic sectional view of the semiconductor device 200 along the A-A line in FIG. 17B. FIG. 17B is a schematic sectional view of the semiconductor device 200 along the line B-B on FIG. 17A. FIG. 17C is a schematic sectional view of the semiconductor device 200 along the line C-C on FIG. 17A. FIG. 17D is a schematic sectional view of the semiconductor device 200 along the line D-D on FIG. 17B.

The top spacing layer 212, cladding layers 218, spacing layers 204, and the hard mask layer 210 may be removed by one or more suitable etching process. After removable of the top spacing layer 212, cladding layers 218, spacing layers 204, and the hard mask layer 210, the semiconductor channel layers 206 are exposed to gate cavities vacated by the cladding layers 218, spacing layers 204.

Figure 18A:
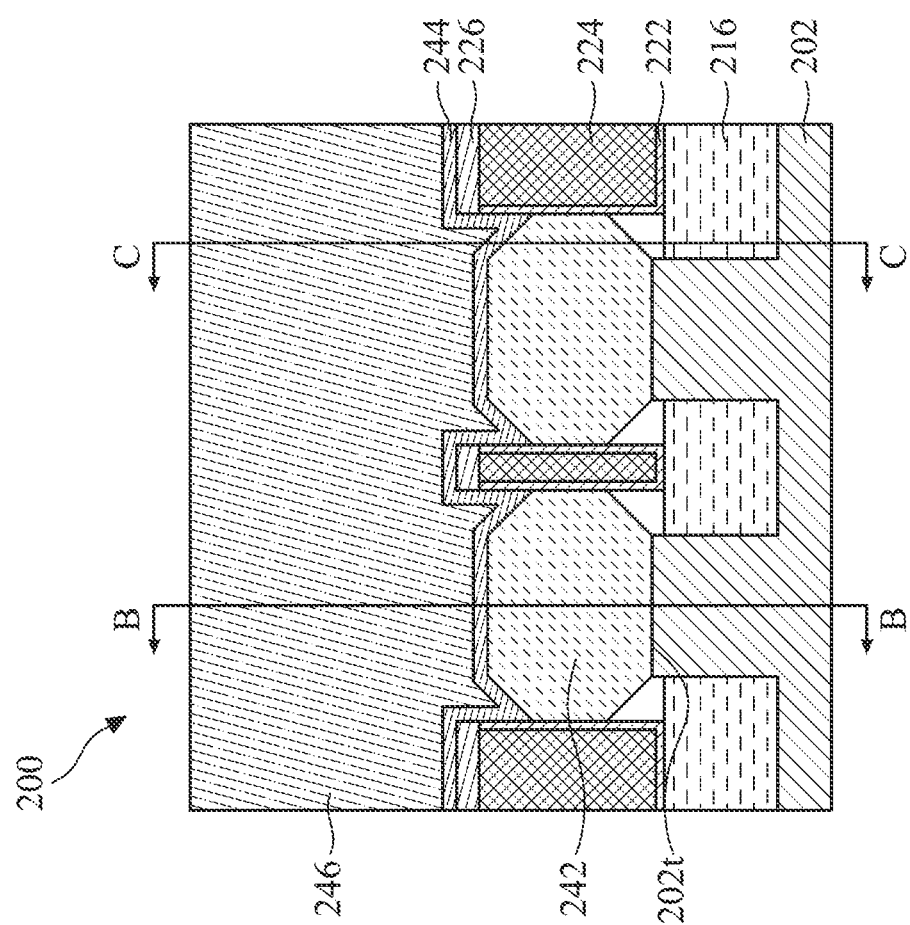
Figure 18D:
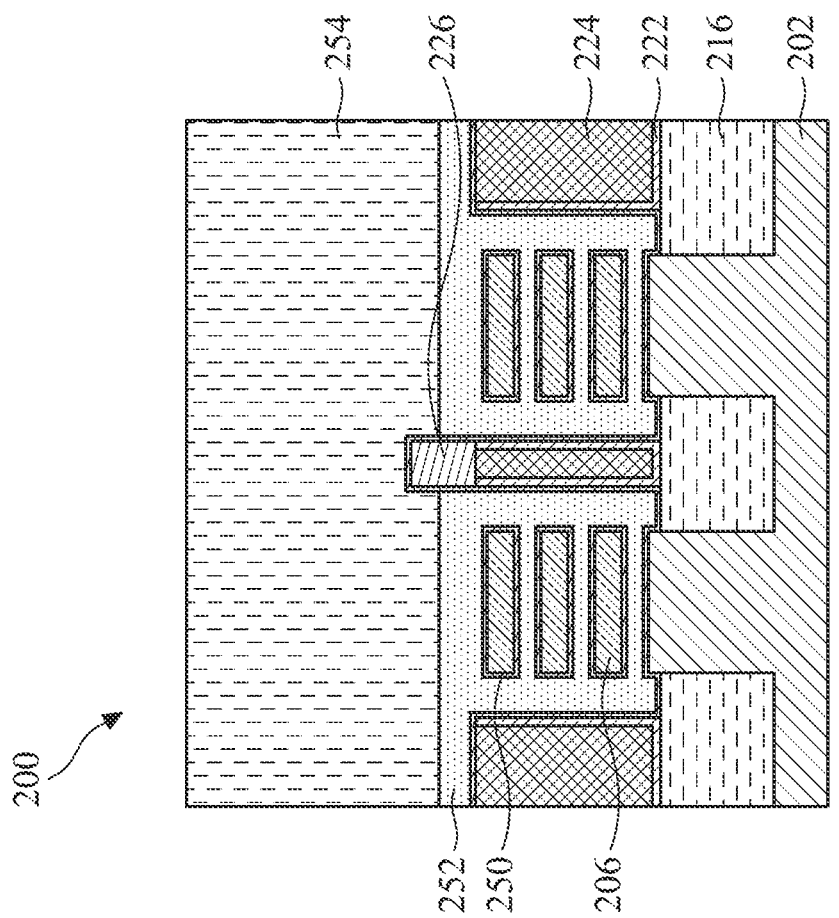
Figure 18E:
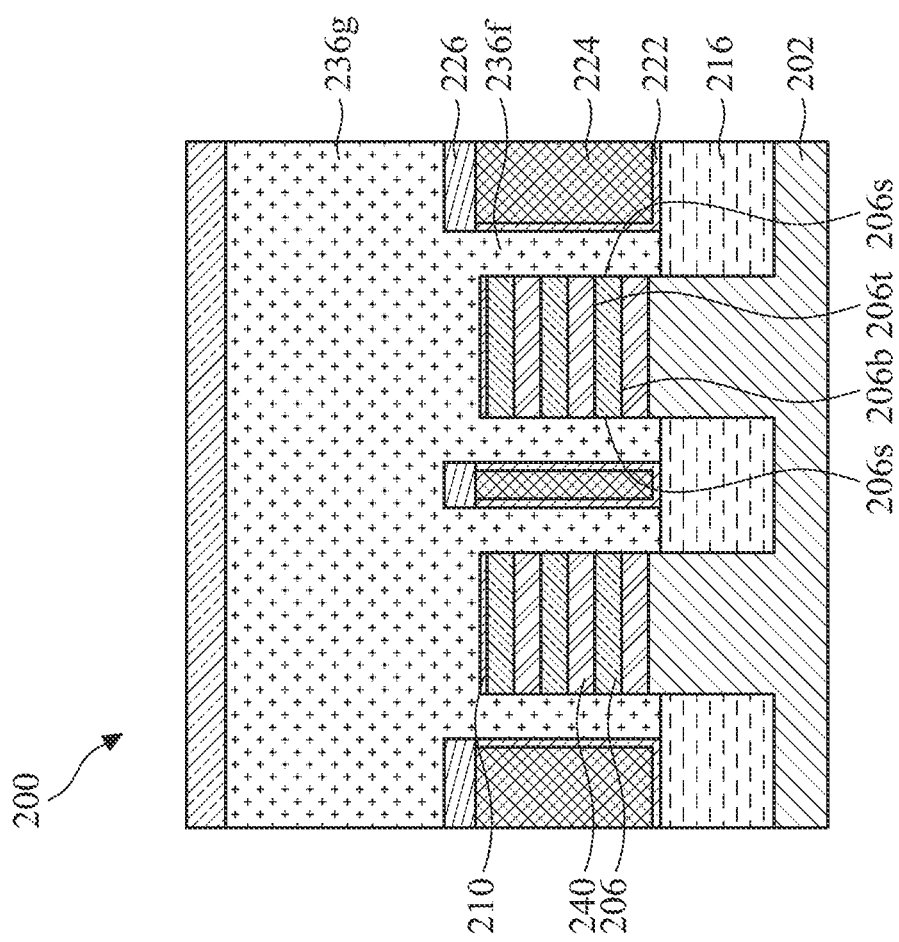

In operation 136, replacement gate structures are formed around the semiconductor channel layers 206, as shown in FIGS. 18A-E. FIG. 18A is a schematic sectional view of the semiconductor device 200 along the A-A line in FIG. 18B. FIG. 18B is a schematic sectional view of the semiconductor device 200 along the line B-B on FIG. 18A. FIG. 18C is a schematic sectional view of the semiconductor device 200 along the line C-C on FIG. 18A. FIG. 18D is a schematic sectional view of the semiconductor device 200 along the line D-D on FIG. 18B. FIG. 18E is a schematic sectional view of the semiconductor device 200 along the line E-E on FIG. 18B.

In some embodiments, the replacement gate structure includes a gate dielectric layer 250, a gate electrode layer 252, and a self-aligned contact (SAC) layer 254. The gate dielectric layer 250 may be conformally deposited on exposed surfaces in the gate cavities. As shown in FIGS. 18B and 18C, the gate dielectric layer 250 are formed on the gate sidewall spacer portions 236g, the fin sidewall spacer portions 236f, the inner spacers 240, the exposed portion of the hard mask layer 210, and exposed surfaces of the semiconductor channel layers 206.

The gate dielectric layer 250 may have different composition and dimensions for N-type devices and P-type devices and are formed separately using patterned mask layers and different deposition recipes. The gate dielectric layer 250 may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 250 may be formed by CVD, ALD or any suitable method.

The gate electrode layer 252 is formed on the gate dielectric layer 250 to fill the gate cavities. The gate electrode layer 252 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, the gate electrode layer 252 may be formed by CVD, ALD, electro-plating, or other suitable method. After the formation of the gate electrode layer 252, a planarization process, such as a CMP process, is performed to remove excess deposition of the gate electrode material and expose the top surface of the ILD layer 246.

In some embodiments, a metal gate etching back (MGEB) process is performed to form the self-aligned contact (SAC) layer 254. One or more etching process is performed to remove portions of the gate dielectric layer 250 and the gate electrode layer 252 to form trenches in the region above the remaining gate electrode layer 252. The MGEB process may be a plasma etching process employing one or more etchants such as chlorine-containing gas, a bromine-containing gas, and/or a fluorine-containing gas. The etching process allows the gate dielectric layer 250 and the gate electrode layer 252 to be selectively etched from the ILD layer 246 and the CESL 244.

In the MGEB process, the gate dielectric layer 250 and gate electrode layer 252 are etched back to a level lower than a top surface of the high-k dielectric features 226. In some embodiments, the gate sidewall spacer portions 236g are also etched back to a level be lower than the CESL 244 and higher than the gate electrode layer 252. By etching the gate sidewall spacer portions 236g below the CESL 244, the gate sidewall spacer portions 236g can be covered and protected by the subsequently formed SAC layer 254 while forming source/drain metal contacts.

In some embodiments, a metal gate liner, not shown, may be first deposited on exposed surfaces in the trenches above the gate electrode layer 252 prior to depositing the sacrificial SAC layer 254. The metal gate liner and the SAC layer 254 may be formed by a suitable deposition process, such as CVD, PVD, or ALD. The metal gate liner may function as a diffusion barrier for the gate electrode layer 252. The metal gate liner may be a dielectric layer including but not limited to SiO, SiN, SiC, SiCN, SiOC, SiON, SiOCN, ZrO, ZrN, or a combination thereof. The SAC layer 254 may be any dielectric layer that can be used as an etch stop layer during subsequent trench and via patterning for metal contacts. In some embodiments, the SAC layer 254 may a high-k dielectric layer. The SAC layer 254 may a dielectric layer including but not limited to SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN, or any combinations thereof.

After filling the trenches with the SAC layer 254, a planarization process, such as a CMP process, is performed to remove excess deposition of the SAC layer 254 and metal gate liner to expose the top surface of the ILD layer 246.

Figure 19A:
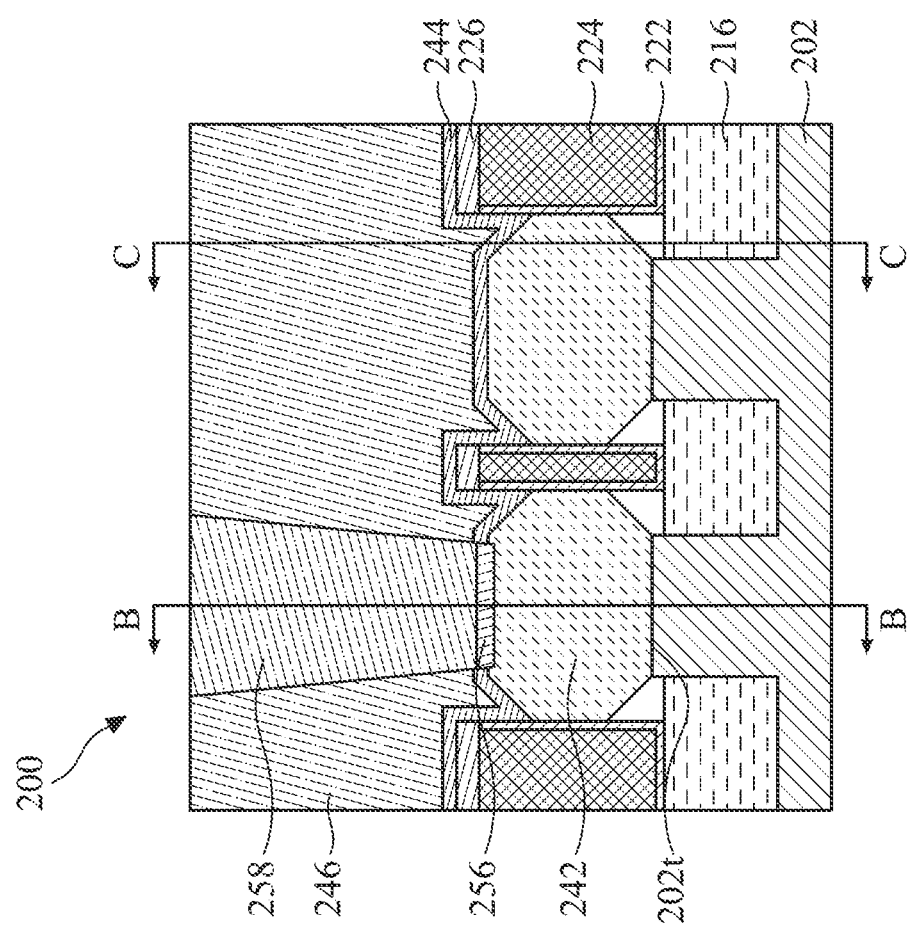
Figures 19B, 19C:
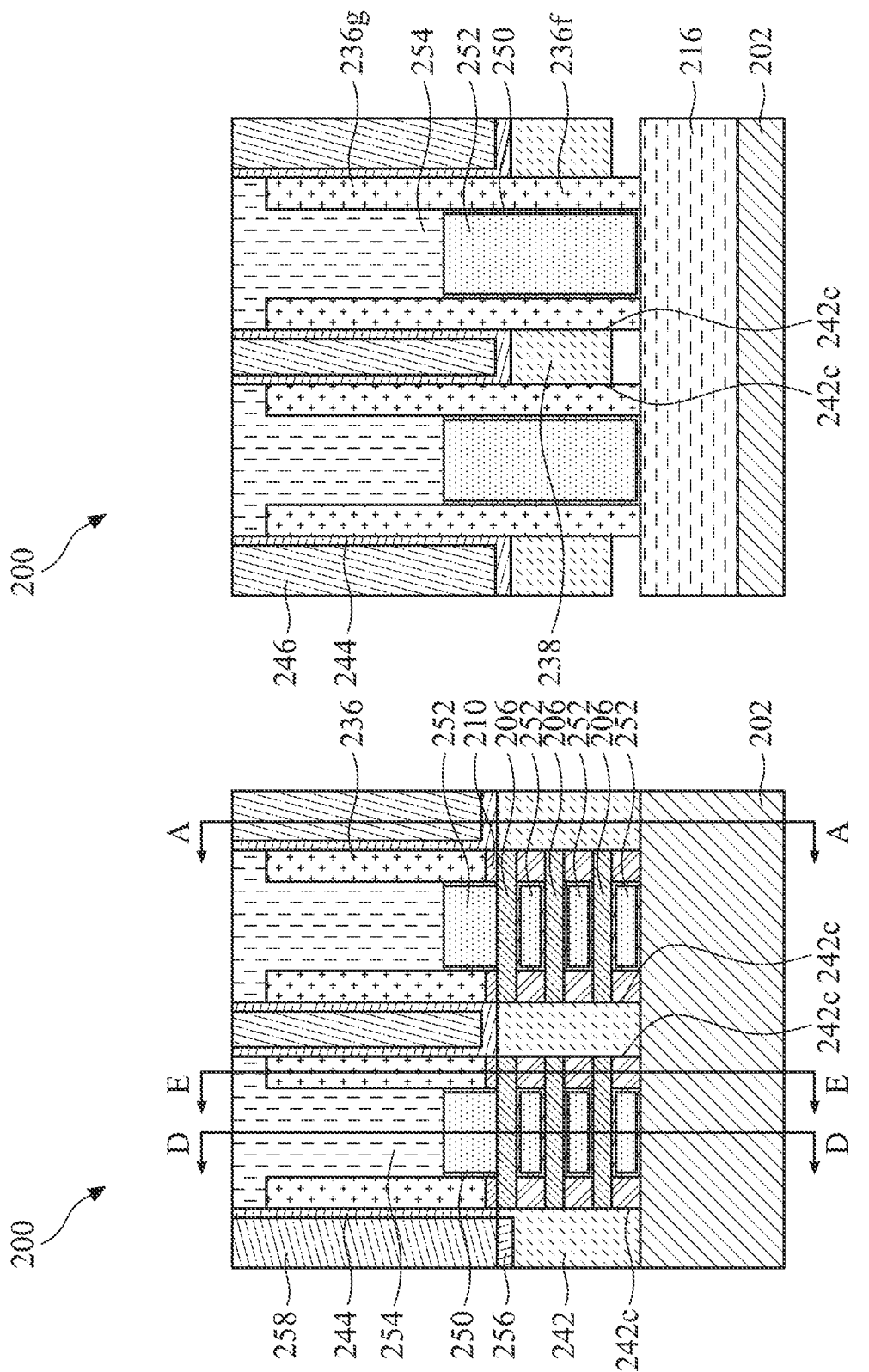
Figure 19D:
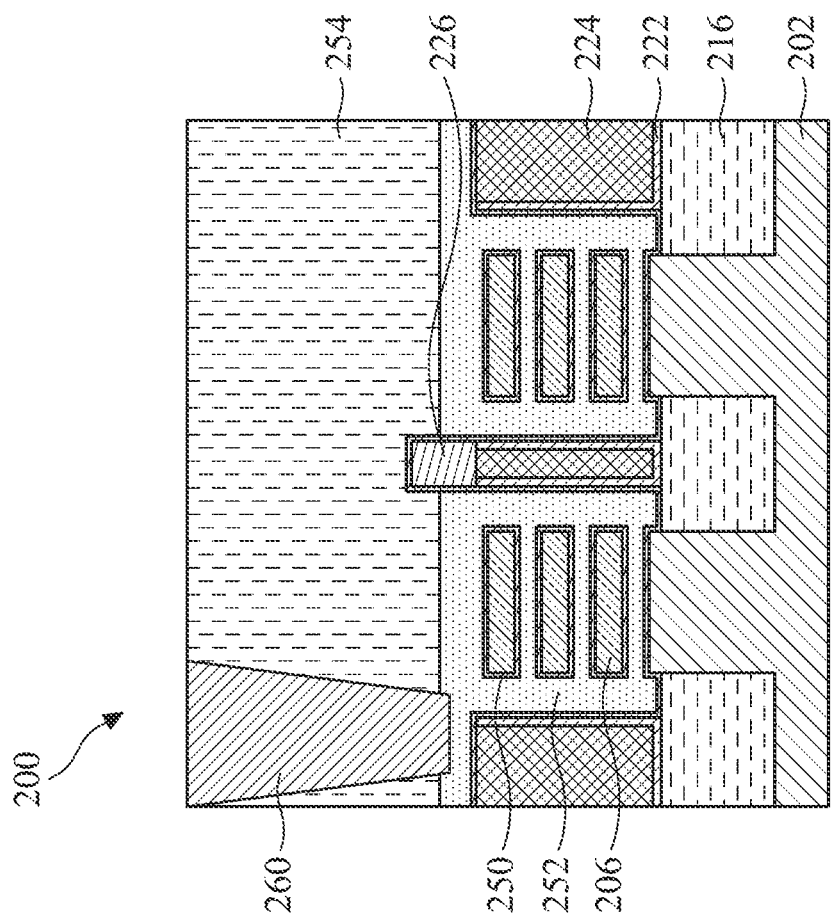
Figure 19E:
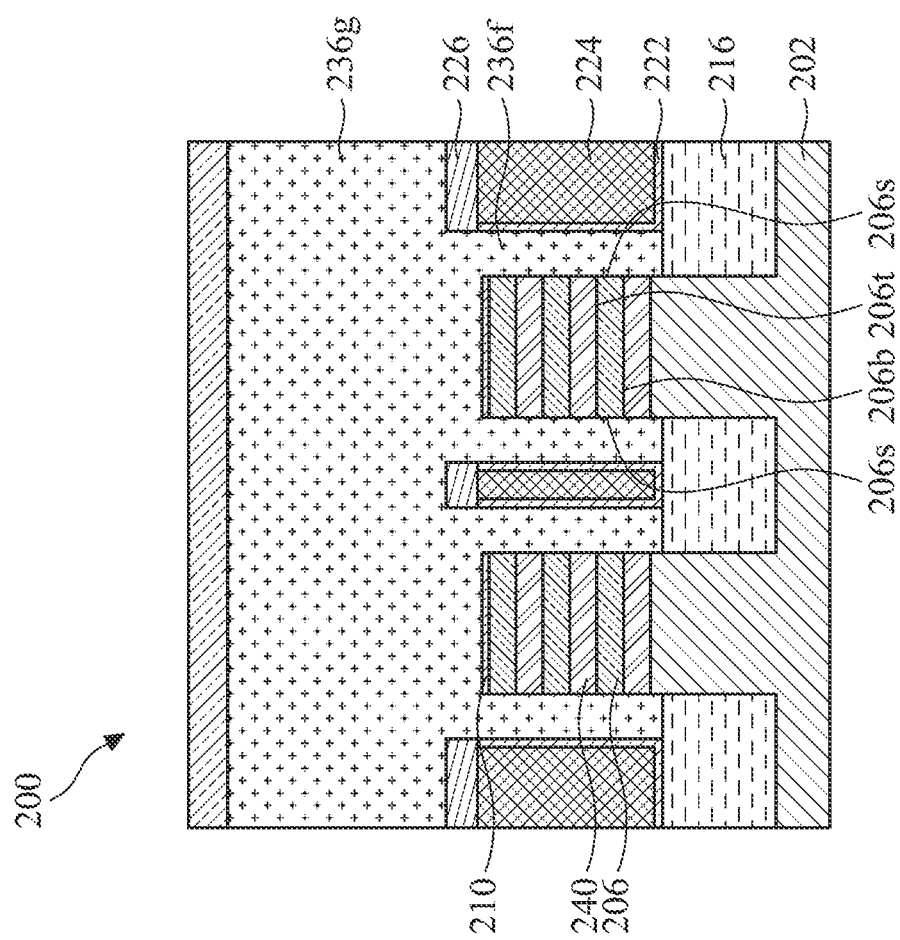

In operation 138, source/drain metal contact features 258 and gate contact features 260 are formed as shown in FIGS. 19A-19F. FIG. 19A is a schematic sectional view of the semiconductor device 200 along the A-A line in FIG. 19B. FIG. 19B is a schematic sectional view of the semiconductor device 200 along the line B-B on FIG. 19A. FIG. 19C is a schematic sectional view of the semiconductor device 200 along the line C-C on FIG. 19A. FIG. 19D is a schematic sectional view of the semiconductor device 200 along the line D-D on FIG. 19B. FIG. 19E is a schematic sectional view of the semiconductor device 200 along the line E-E on FIG. 19B.

Contact holes for source/drain contact features 258 may be formed through the ILD layer 246 and the CESL 244 to expose the epitaxial source/drain features 242. A silicide layer 256 is selectively formed over an exposed surface of the source/drain features 242 exposed by the contact holes. In some embodiments, the silicide layer 256 includes one or more of WSi, CoSi, NiSi, TiSi, MoSi, and TaSi. Contact holes for gate contact features 260 may be formed through the SAC layer 254 to the gate electrode layer 252.

The source/drain contact features 258 and gate contact features 260 are then formed by filling a conductive material in the contact holes. In some embodiments, the conductive material layer for the gate contact may be formed by CVD, PVD, plating, ALD, or other suitable technique. In some embodiments, the conductive material for the source/drain contact features 258 and the gate contact features 260 includes TiN, TaN, Ta, Ti, Hf, Zr, Ni, W, Co, Cu, Ag, Al, Zn, Ca, Au, Mg, Mo, Cr, or the like. Subsequently, a CMP process is performed to remove a portion of the conductive material layer above a top surface of the ILD layer 246.

Figure 19F:
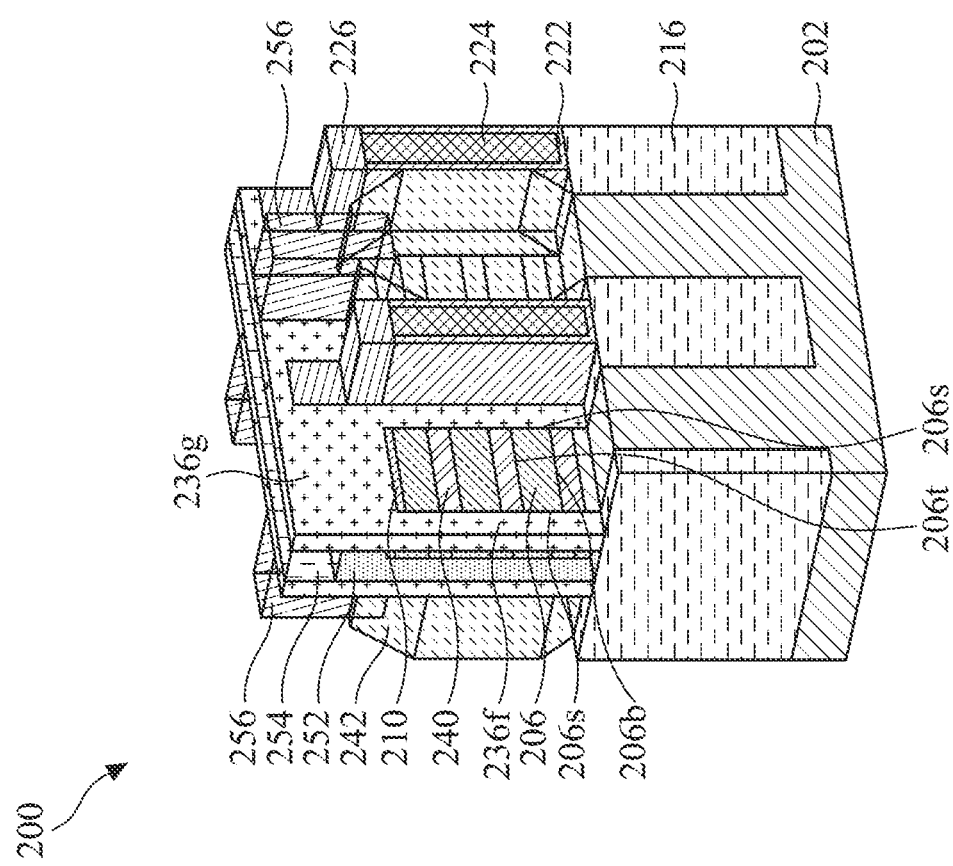

FIG. 19F is a partial schematic view of the semiconductor device 200 with some layers removed. As shown in FIG. 19F, at end portions, each semiconductor channel layer 206 is surrounded by fin sidewall spacer portions 236f and the inner spacers 240. The hard mask layer 210 remains on the topmost semiconductor channel layer 206 and the gate sidewall spacer portion 236g is formed over the hard mask layer 210.

FIGS. 20A-20C, 21A-21C, 22A-22E, 23A-23E, and 24A-24E schematically illustrate various stage of manufacturing a semiconductor device 200a according to another embodiment of the present disclosure. The semiconductor device 200a is manufactured by the method 100 discussed above. The semiconductor device 200a is substantially similar to the semiconductor device 200a except that the sidewall spacer layer 236, formed in operation 118, includes air gaps 262 as shown in FIGS. 20A, 21B, and 20C.

Figure 20A:
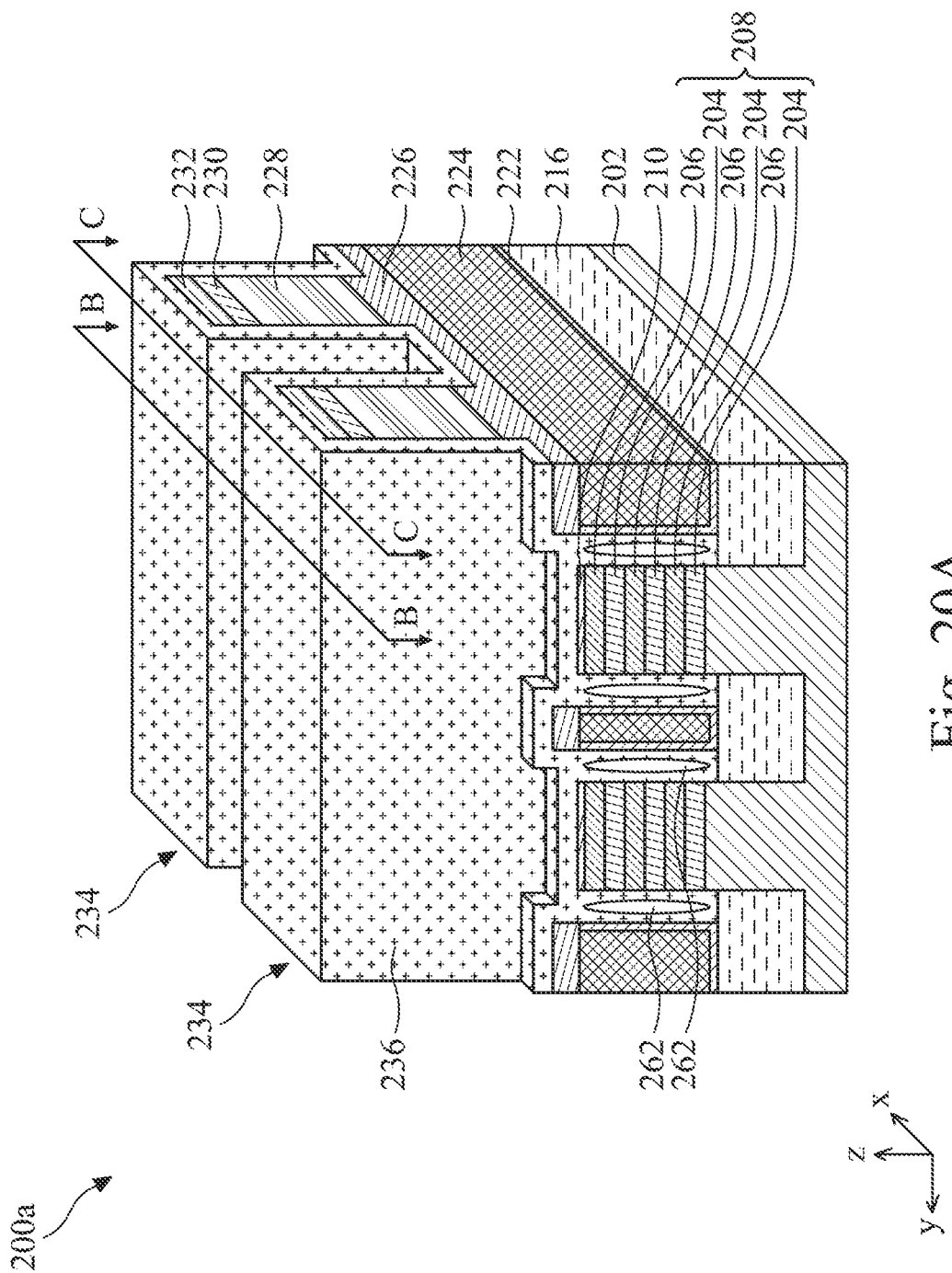
Figure 20C:
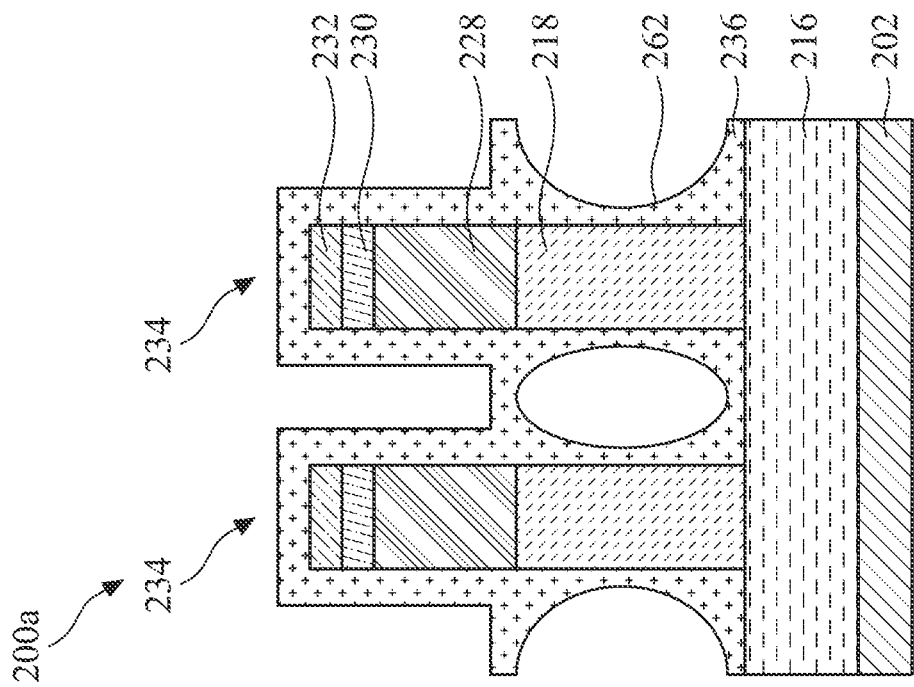
Figure 20B:
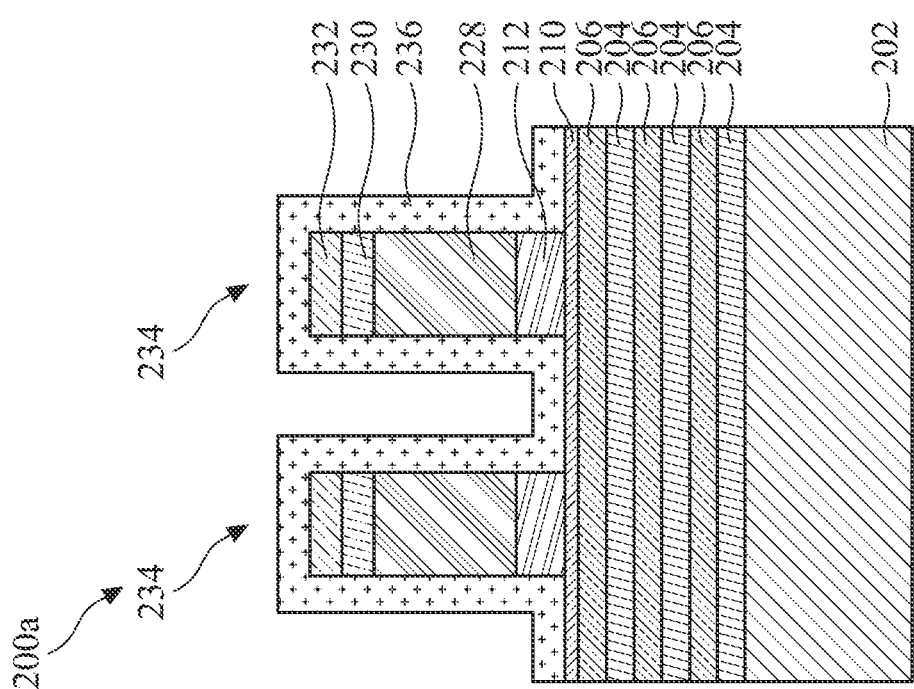
Figure 21A:
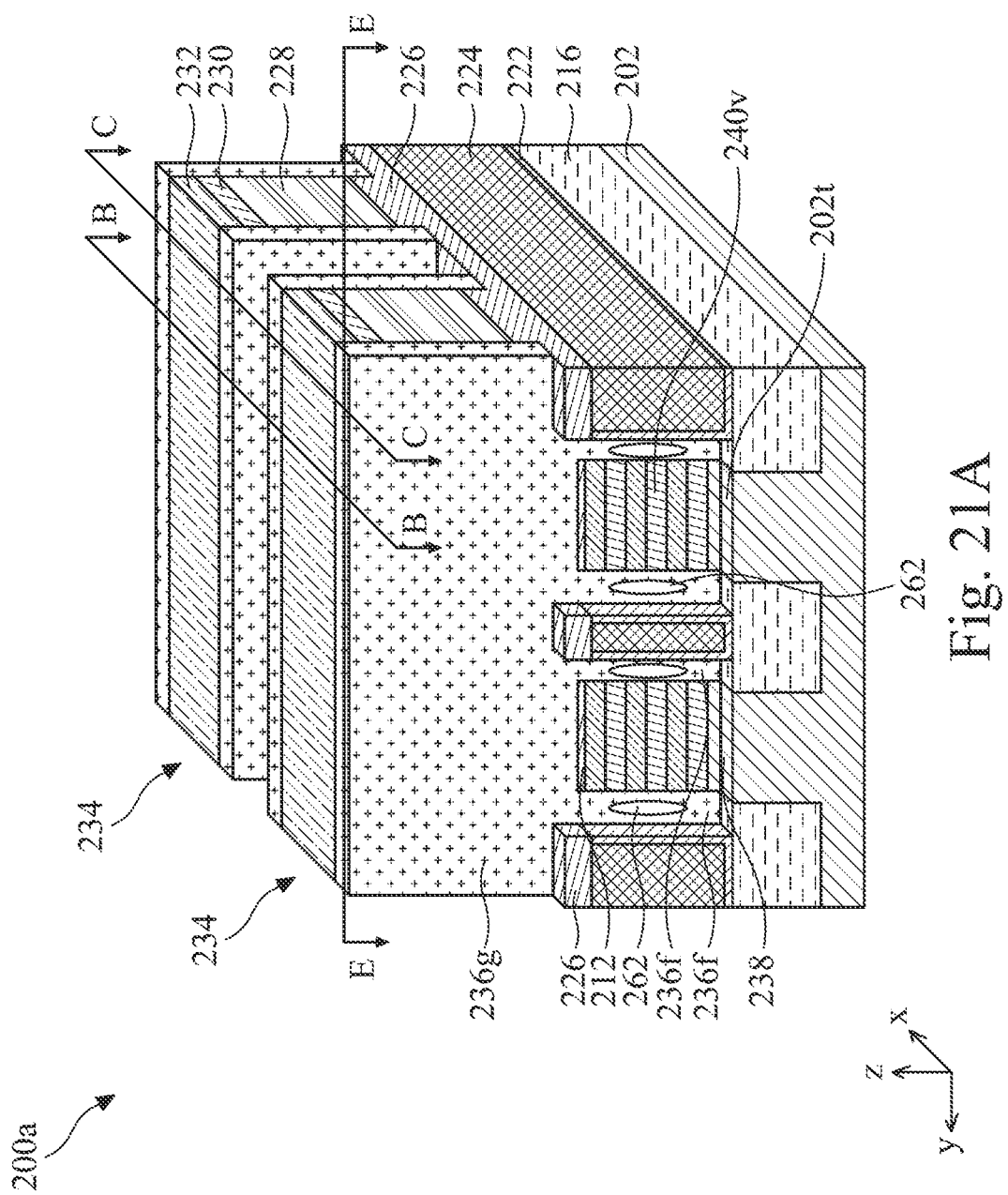
Figure 22A:
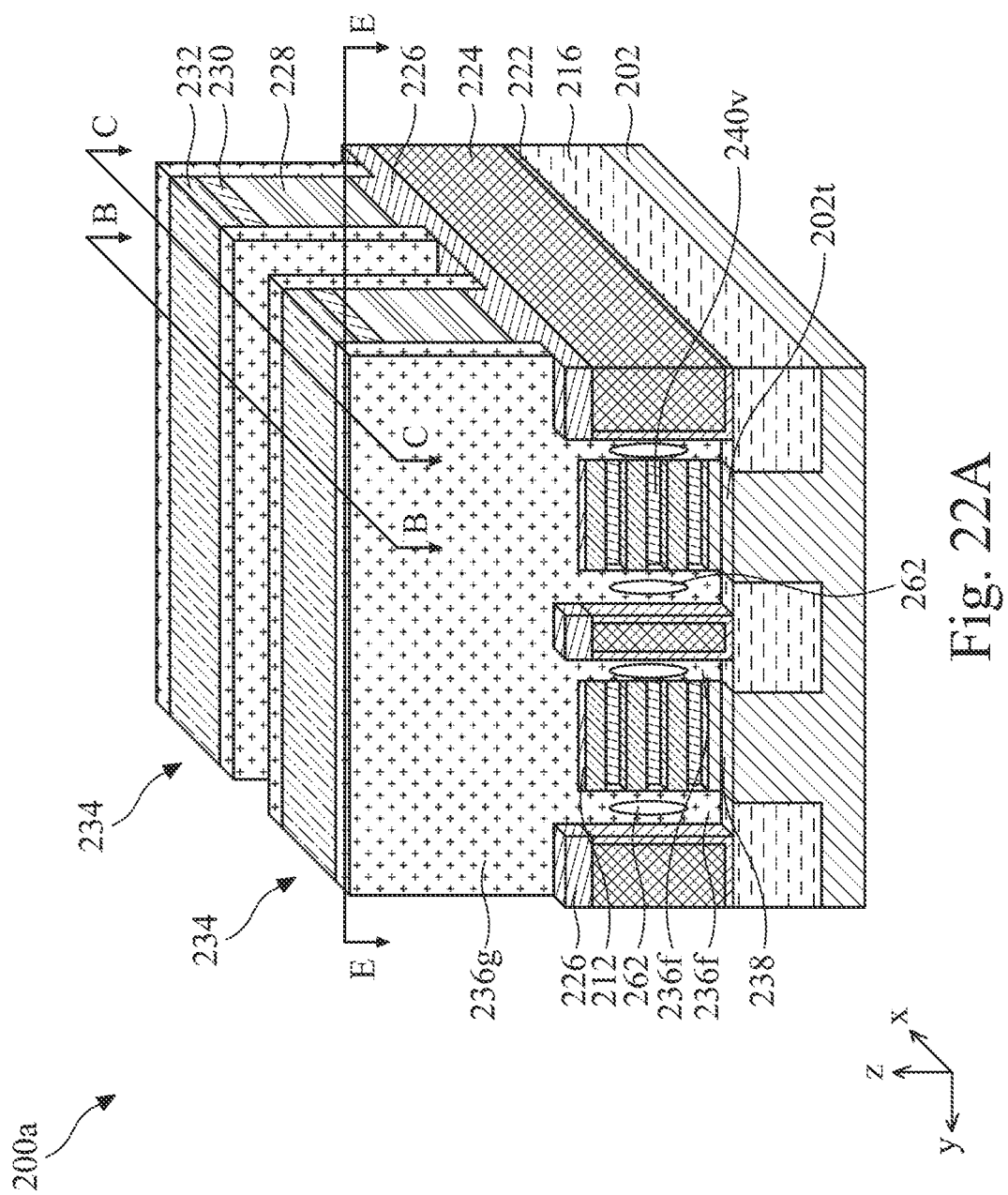
Figures 22B, 22C:
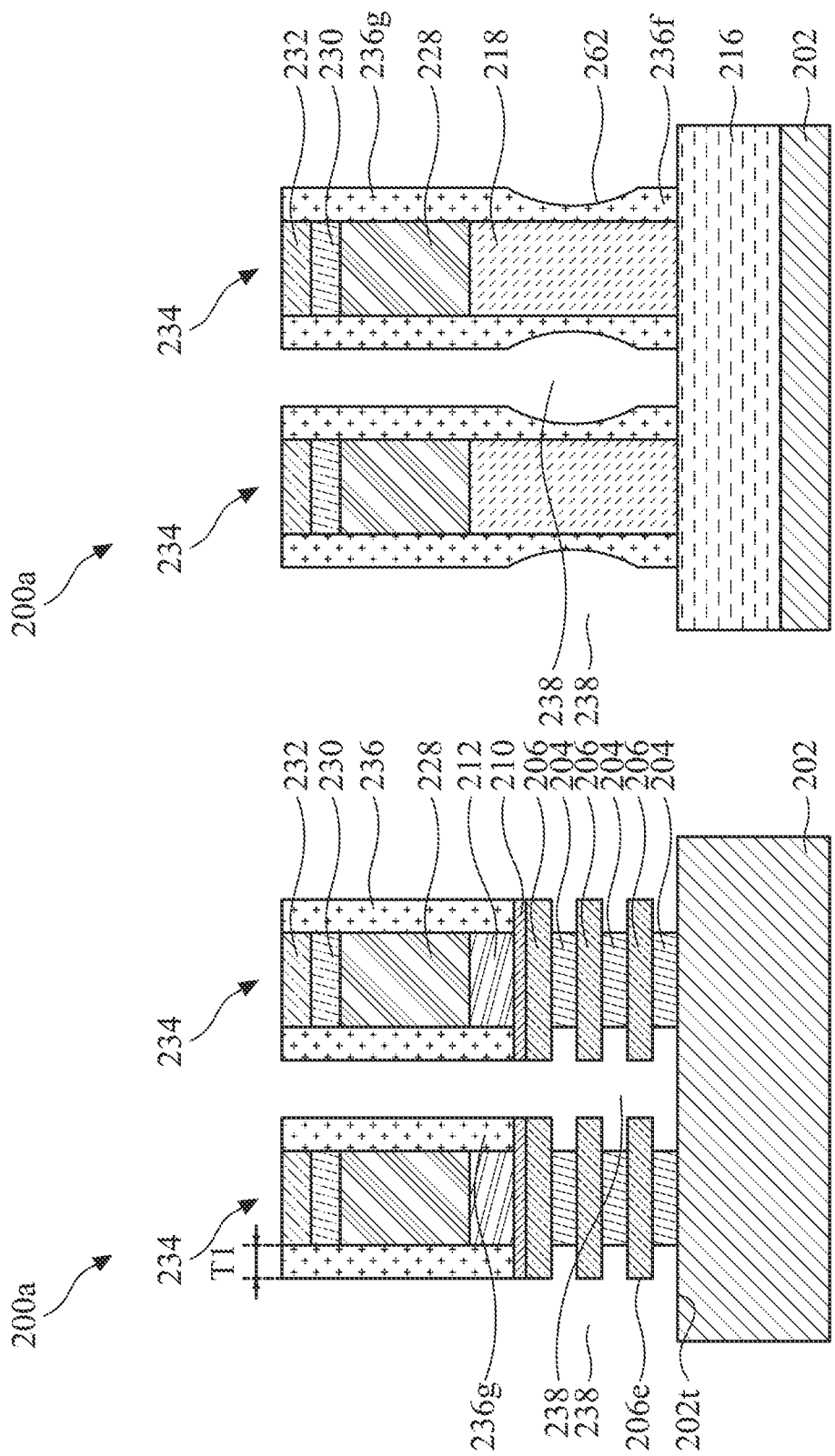
Figure 22D:
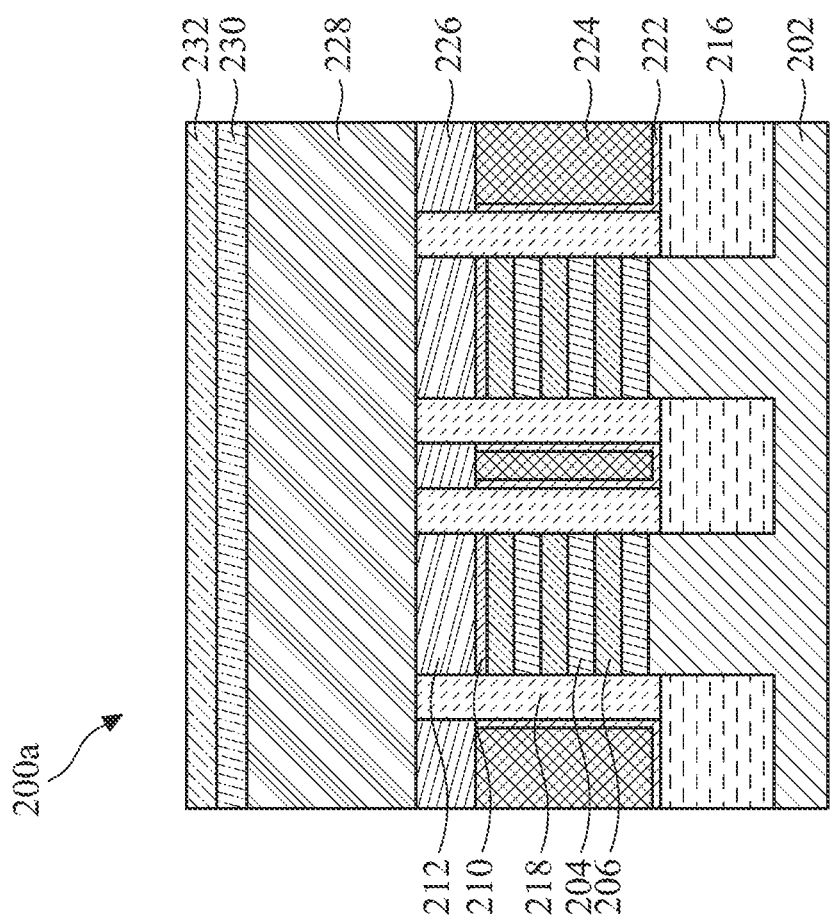
Figure 22E:
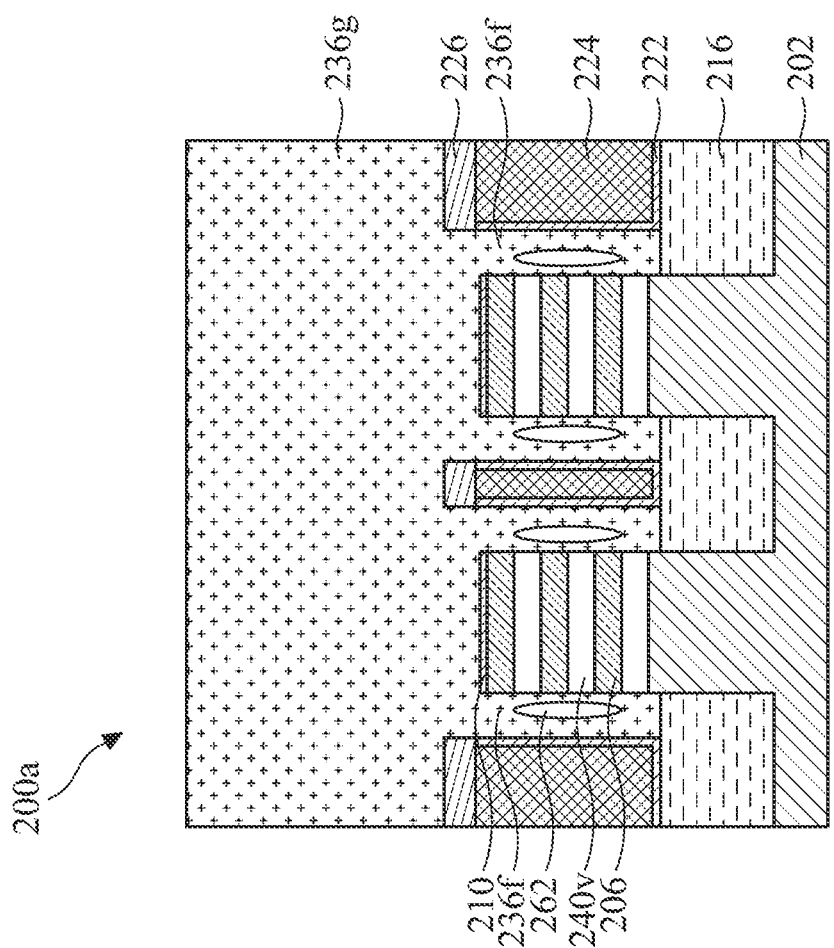
Figure 23A:
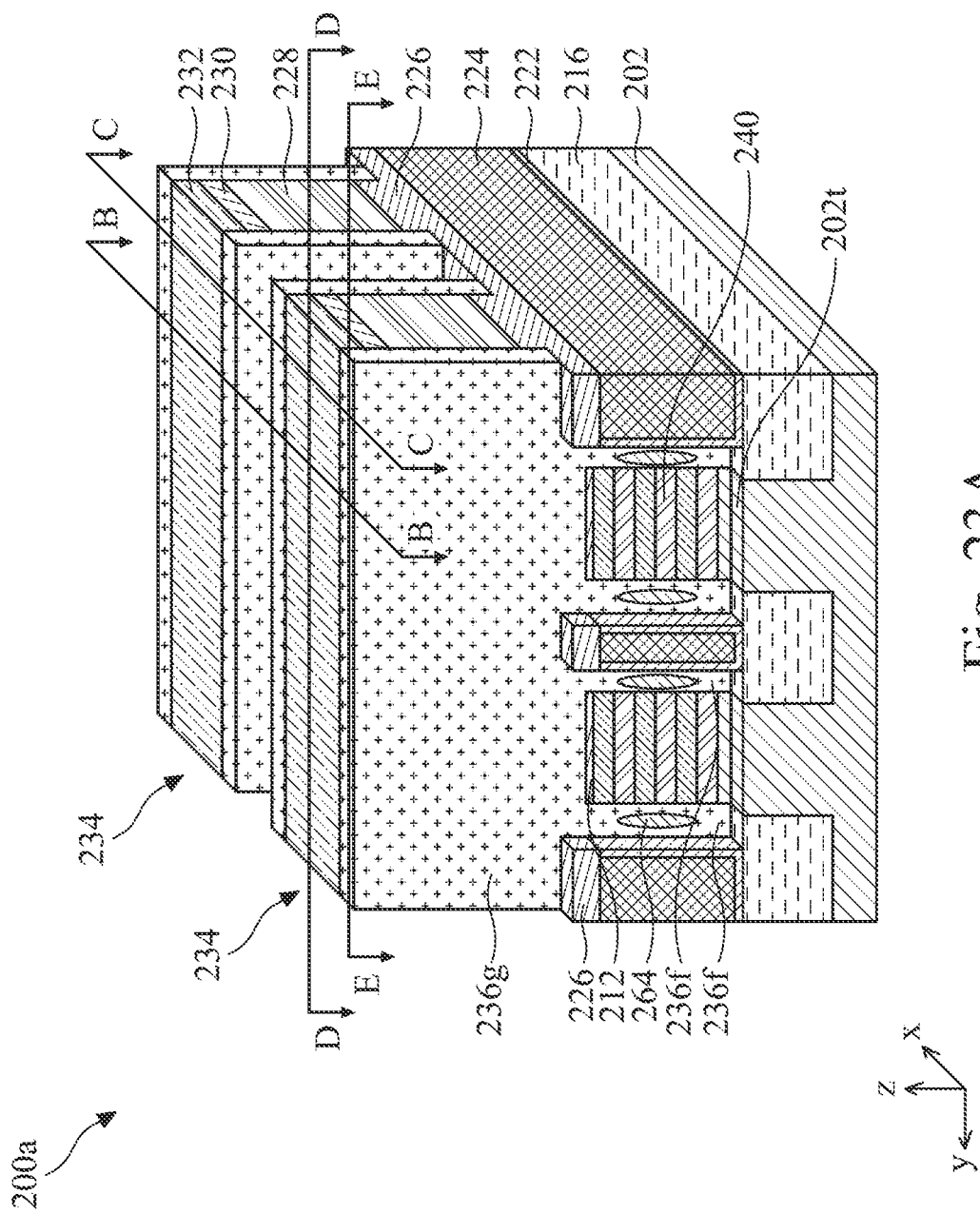
Figures 23B, 23C:
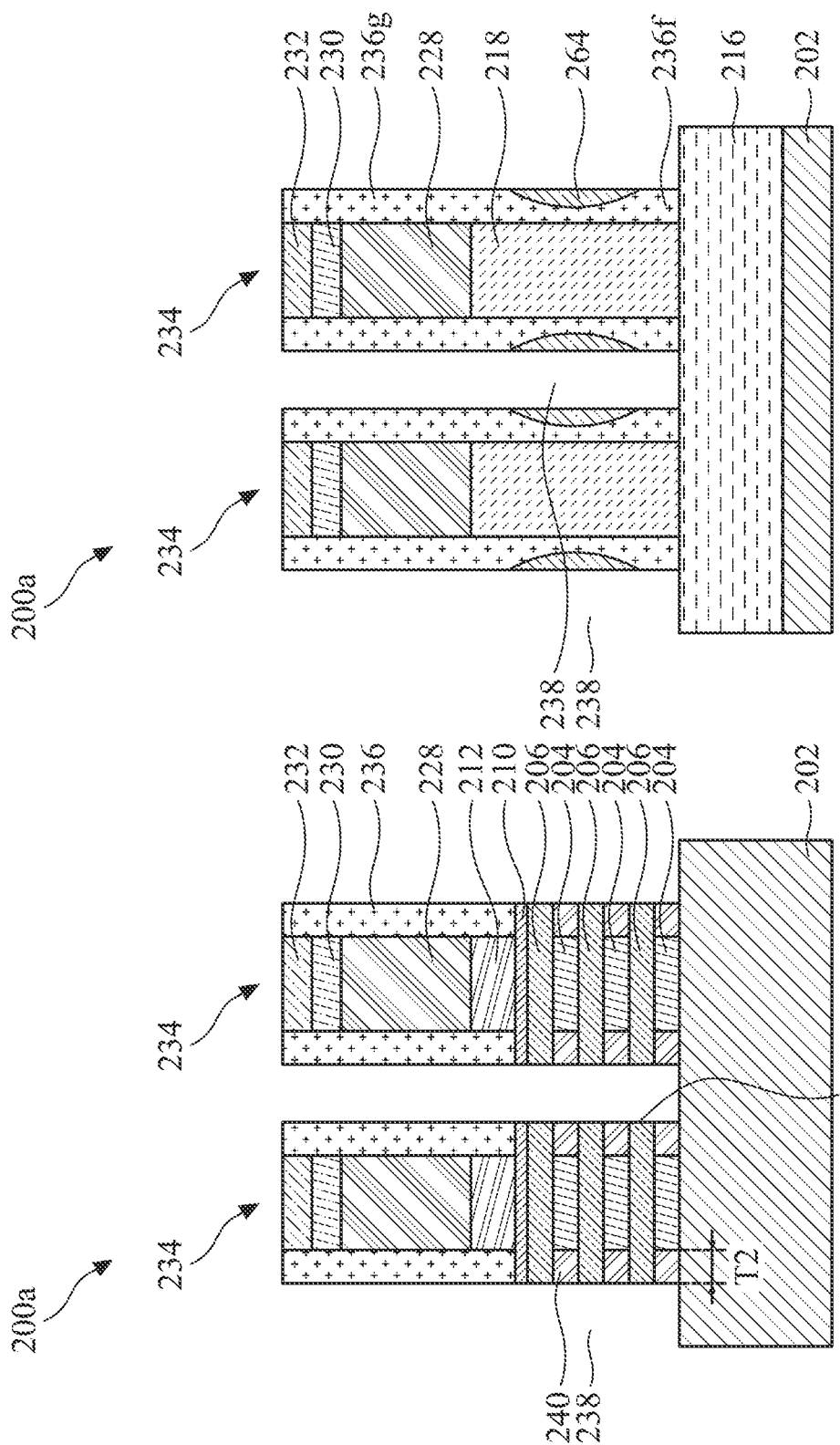
Figure 23D:
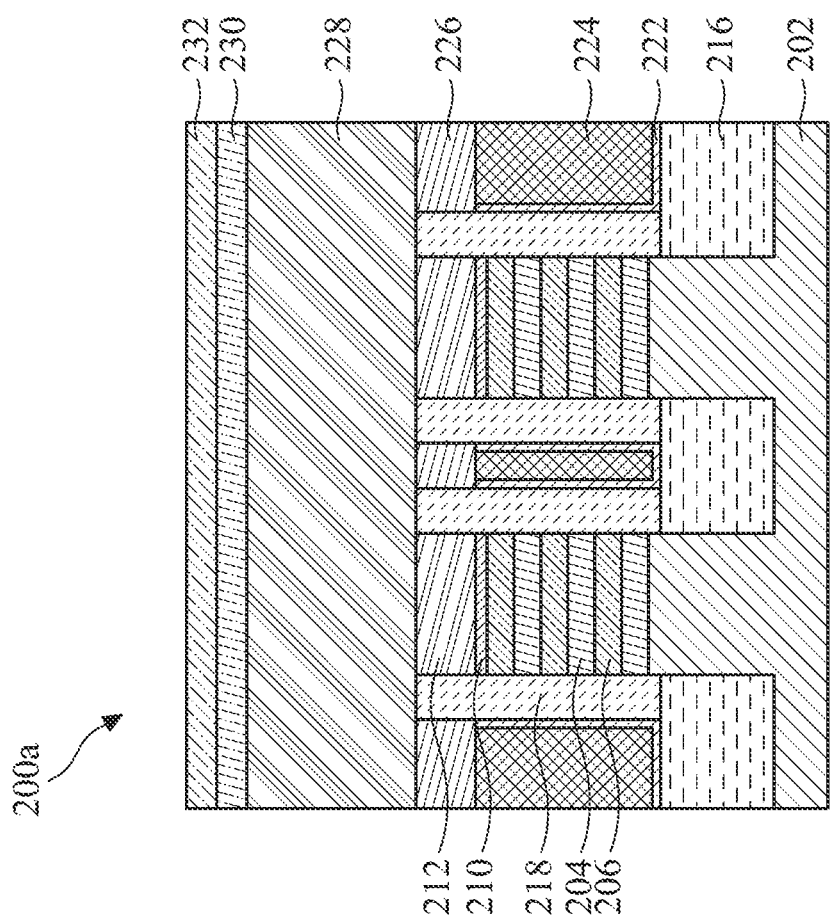
Figure 23E:
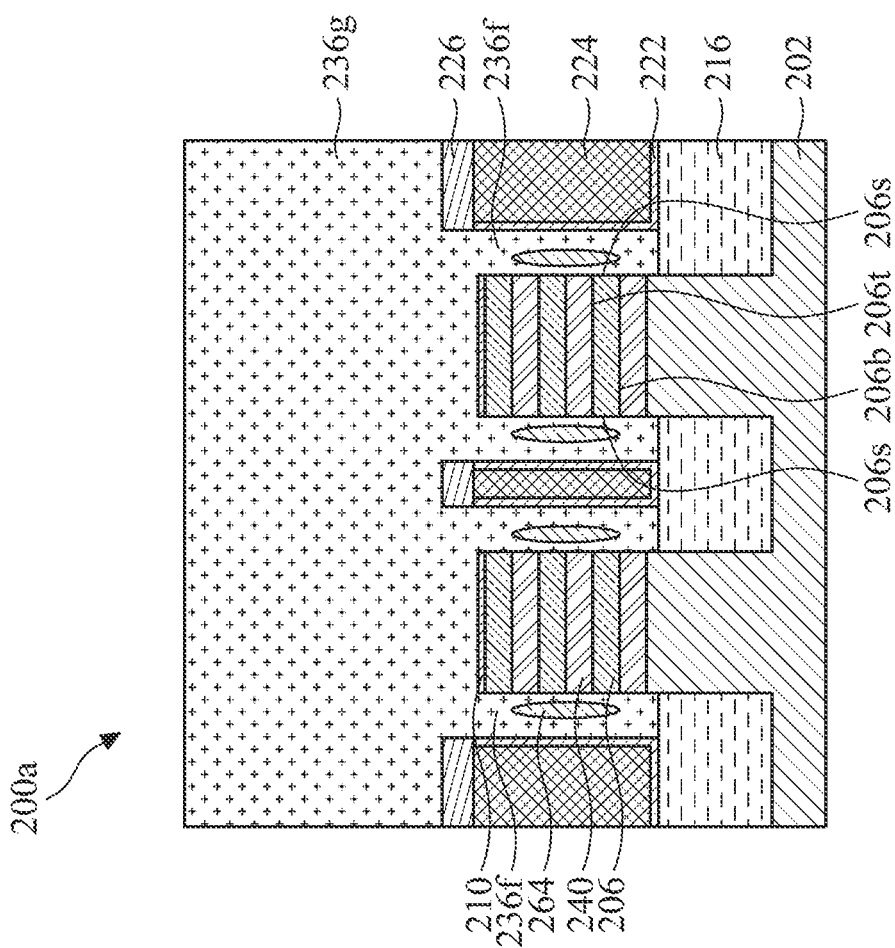
Figure 24A:
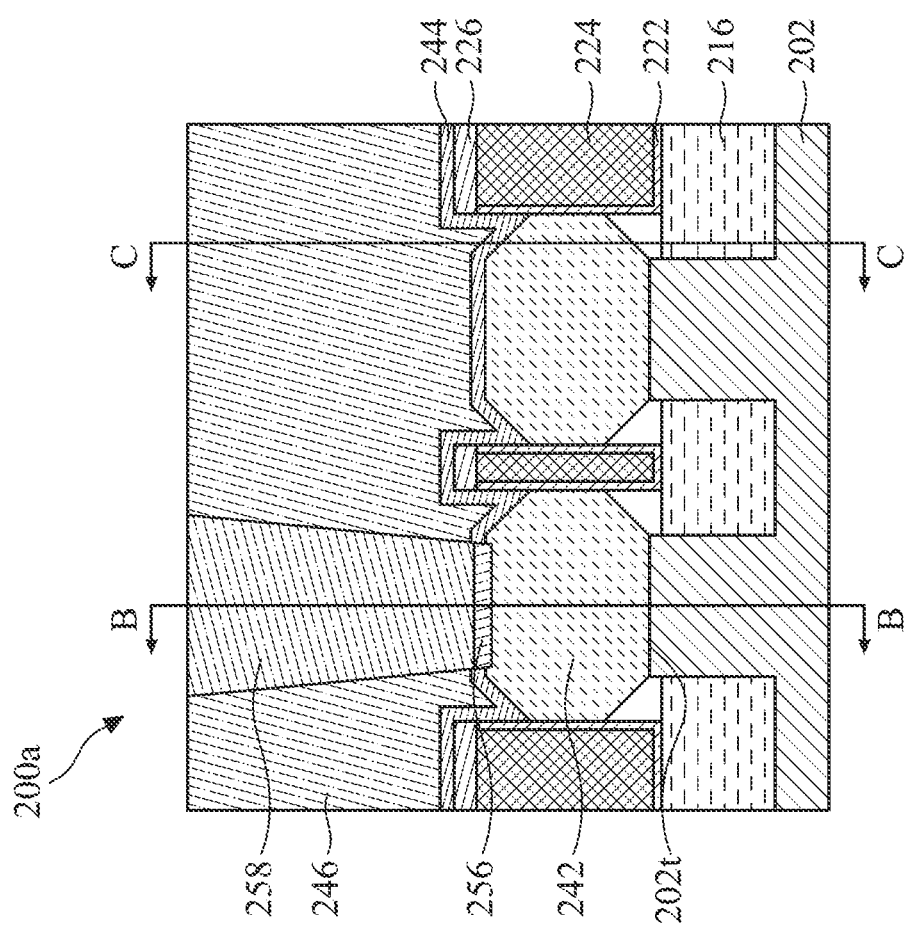
Figure 24D:
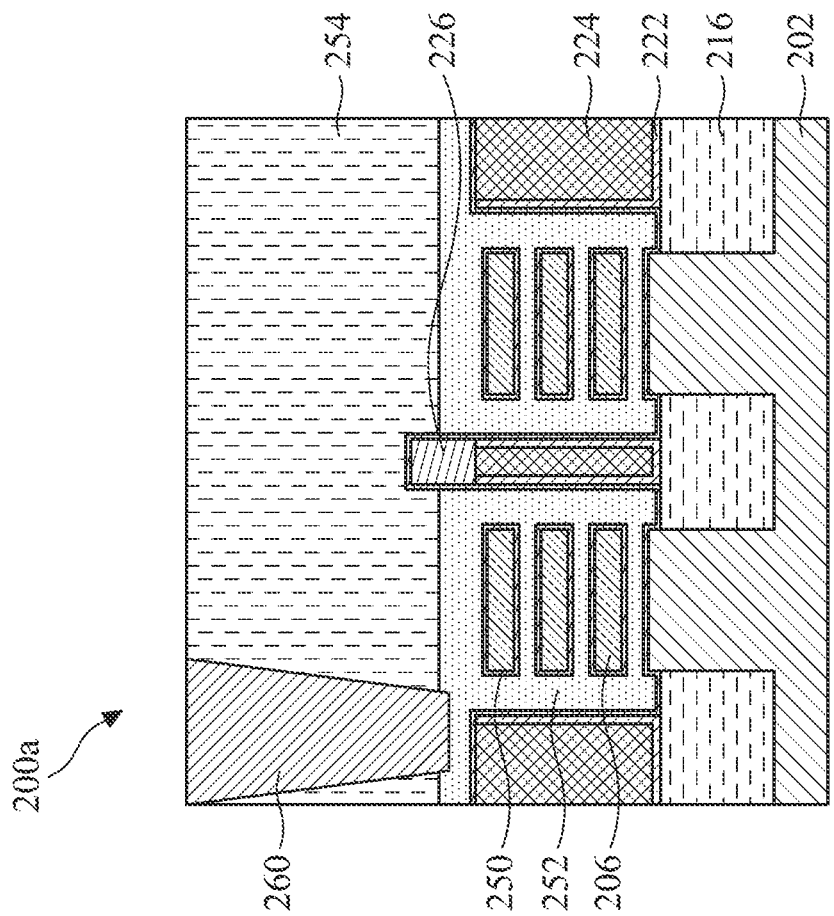
Figure 24E:
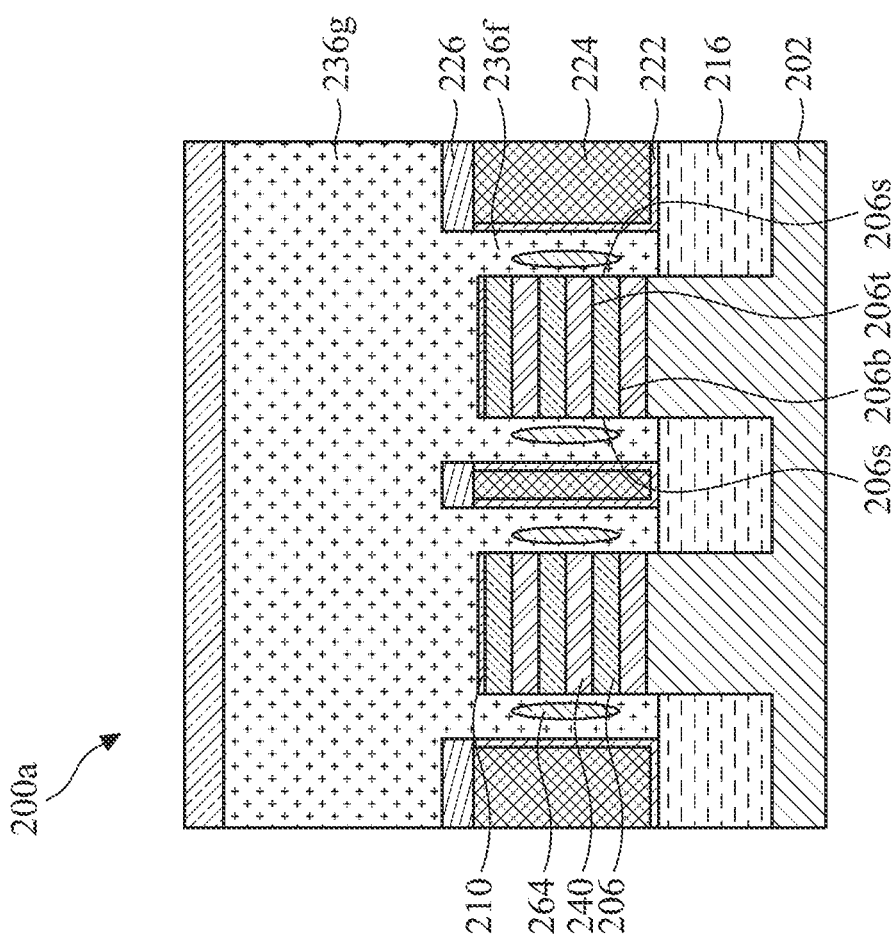

As shown in FIGS. 20A and 20C, the air gaps 262 are formed in the sidewall spacer layer 236 in the trenches between the hybrid fins 220 and the fin structures 214. One or more air gaps 262 may be a result of deposition condition and/or geometry of the trenches between the hybrid fins 220 and the fin structures 214. After operation 120, the air gaps 262 may be exposed to the source/drain cavity 238, as shown in FIGS. 20A, 21B, and 20C. After operation 122, the air gaps 262 remain after the recess etch of the spacing layers 204, as shown in FIGS. 22A, 22B, 22C, 22D, and 22E. During formation of the inner spacers 240 in operation 124, the exposed air gaps 262 are filled by the materials of the inner spacers 240 forming filler spacers 264 in the fin sidewall spacer portions 236f, as shown in FIGS. 23A, 23B, 23C, 23D, and 23E. FIGS. 24A, 24B, 24C, 24D, and 24E schematically illustrate the semiconductor device 200a after formation the gate contact features 260 and the source/drain contact features 258. As shown in FIG. 24C, the channel surfaces 242c of the epitaxial source/drain features 242 are in contact with the semiconductor channel layers 206 at the end surface 206e. The channel surface 242c also contacts the inner spacers 240, the fin sidewall spacer portions 236f, and the filler spacers 264.

Various embodiments or examples described herein offer multiple advantages over the state-of-art technology. By extending the sidewall spacer along sidewall of the semiconductor fin structure, the sidewall spacer according to the present disclosure has a substantially uniform profile along the stack of semiconductor channels, thus enables a substantially uniform protection and eliminates any gaps and leaks between inner spacers and sidewall spacers.

Some embodiments of the present disclosure provide a semiconductor device. The semiconductor device includes a source/drain feature, first and second channel layers in contact with the source/drain feature, and a sidewall spacer in contact with the source/drain feature, wherein the sidewall spacer includes a first fin sidewall spacer portion, a second fin sidewall spacer portion, and a gate sidewall spacer portion connecting the first and second fin sidewall spacer portions, the first fin sidewall spacer portion contacts first sidewalls of the first and second channel layers, and the second sidewall fin portion contacts second sidewalls of the first and second channel layers.

Some embodiments of the present disclosure provide a semiconductor device. The semiconductor includes first and second semiconductor channel layers, an inner spacer formed between the first and second semiconductor channel layers at end portions of the first and second semiconductor channel layers, a gate dielectric layer formed on the first and second semiconductor channel layers and the inner spacer, a gate electrode layer formed on the gate dielectric layer, and a sidewall spacer in contact with the first and second semiconductor channel layers and the gate dielectric layer.

Some embodiments of the present disclosure provide a method for forming a semiconductor device. The method includes forming a fin structure including two or more channel layers and two or more spacing layers formed between the two or more channel layers, forming cladding layers on sidewalls of the fin structure, forming hybrid fins adjacent the cladding layers, depositing a sacrificial gate electrode layer over the fin structure, the cladding layers and the hybrid fins, patterning the sacrificial gate electrode layer to form a sacrificial gate structure, forming trenches between the sidewalls of the fin structure and the hybrid fins by removing the cladding layer exposed by the sacrificial gate structure, forming a sidewall spacer in contact with the sidewalls of the fin structure, recess etching the fin structure, recess etching the two or more spacing layers, forming inner spacers in place of the recessed spacing layers, and forming source/drain features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device, comprising:
a source/drain feature;
first and second channel layers in contact with the source/drain feature; and
a sidewall spacer in contact with the source/drain feature, wherein the sidewall spacer includes a first fin sidewall spacer portion, a second fin sidewall spacer portion, and a gate sidewall spacer portion connecting the first and second fin sidewall spacer portions, the first fin sidewall spacer portion contacts first sidewalls of the first and second channel layers, and the second sidewall fin portion contacts second sidewalls of the first and second channel layers.

2. The semiconductor device of claim 1, further comprising:
an inner spacer in contact with the sidewall spacer.

3. The semiconductor device of claim 2, wherein the inner spacer includes a top surface, a bottom surface opposing the top surface, and first and second sidewalls connecting the top surface and the bottom surface, the top surface is in contact with the first channel layer, the bottom surface is in contact with the second channel layer, the first sidewall is in contact with the first fin sidewall spacer portion, and the second sidewall is in contact with the second fin sidewall spacer portion.

4. The semiconductor device of claim 2, wherein the inner spacer and the sidewall spacer include the same material.

5. The semiconductor device of claim 2, wherein the inner spacer and the sidewall spacer include different materials.

6. The semiconductor device of claim 2, further comprising:
a filler spacer formed in the first fin sidewall spacer portion.

7. The semiconductor device of claim 6, wherein the filler spacer and the inner spacer are formed from the same material.

8. The semiconductor device of claim 1, further comprising:
a hard mask layer formed between the first channel layer and the sidewall spacer.

9. The semiconductor device of claim 8, wherein the hard mask layer is in contact with the gate sidewall spacer portion and connecting the first and second fin sidewall spacer portions.

10. A semiconductor device, comprising:
first and second semiconductor channel layers;
an inner spacer formed between the first and second semiconductor channel layers at end portions of the first and second semiconductor channel layers;
a gate dielectric layer formed on the first and second semiconductor channel layers and the inner spacer;
a gate electrode layer formed on the gate dielectric layer; and
a sidewall spacer in contact with the first and second semiconductor channel layers and the gate dielectric layer.

11. The semiconductor device of claim 10, wherein the inner spacer and the sidewall spacer include different materials.

12. The semiconductor device of claim 10, wherein each of the first and second semiconductor channel layers includes a top surface, a bottom surface, and first and second sidewalls connecting the top surface and the bottom surface, and the sidewall spacer is in contact with the first and second sidewalls of the first and second semiconductor channel layers, and the inner spacer in contact with the top surface of the second semiconductor channel layer and the bottom surface of the first semiconductor channel layer.

13. The semiconductor device of claim 12, further comprising:
a hard mask layer formed on the top surface of the first semiconductor channel layer.

14. A method for forming a semiconductor device, comprising:
forming a fin structure including two or more channel layers and two or more spacing layers formed between the two or more channel layers;
forming cladding layers on sidewalls of the fin structure;
forming hybrid fins adjacent the cladding layers;
depositing a sacrificial gate electrode layer over the fin structure, the cladding layers and the hybrid fins;
patterning the sacrificial gate electrode layer to form a sacrificial gate structure;
forming trenches between the sidewalls of the fin structure and the hybrid fins by removing the cladding layer exposed by the sacrificial gate structure;
forming a sidewall spacer in contact with the sidewalls of the fin structure;
recess etching the fin structure;
recess etching the two or more spacing layers;
forming inner spacers in place of the recessed spacing layers; and
forming source/drain features.

15. The method of claim 14, wherein forming the sidewall spacer comprises:
depositing an insulating material on the sacrificial gate structure and in the trenches between the sidewalls of the fin structure and the hybrid fins.

16. The method of claim 15, wherein depositing the insulating material comprises forming air gaps in the trenches between the sidewalls of the fin structure and the hybrid fins.

17. The method of claim 16, wherein forming the sidewall spacer further comprises:
etching the insulating material to expose the air gaps.

18. The method of claim 15, further comprising:
depositing a hard mask layer on a topmost of the two or more channel layers; and
depositing a top spacing layer on the hard mask layer, wherein the cladding layers are formed on sidewalls of the hard mask layer and the top spacing layer.

19. The method of claim 18, further comprising:
removing the top spacing layer to expose the hard mask layer prior to depositing the insulating material.

20. The method of claim 18, further comprising:
forming high-k dielectric features on the hybrid fins between the cladding layers.

\* \* \* \* \*